United States Patent
Kanda

(10) Patent No.: US 11,450,369 B2
(45) Date of Patent: Sep. 20, 2022

(54) SEMICONDUCTOR CIRCUIT AND ELECTRONIC DEVICE FOR STORING INFORMATION

(71) Applicant: SONY SEMICONDUCTOR SOLUTIONS CORPORATION, Kanagawa (JP)

(72) Inventor: Yasuo Kanda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,649

(22) PCT Filed: Aug. 8, 2019

(86) PCT No.: PCT/JP2019/031403
§ 371 (c)(1),
(2) Date: Feb. 16, 2021

(87) PCT Pub. No.: WO2020/045034
PCT Pub. Date: Mar. 5, 2020

(65) Prior Publication Data
US 2021/0312966 A1    Oct. 7, 2021

(30) Foreign Application Priority Data

Aug. 27, 2018 (JP) .............................. JP2018-158366

(51) Int. Cl.
*G11C 14/00* (2006.01)
*G11C 11/16* (2006.01)
*G11C 11/18* (2006.01)

(52) U.S. Cl.
CPC .......... *G11C 11/1697* (2013.01); *G11C 11/18* (2013.01)

(58) Field of Classification Search
CPC .................................................. G11C 14/0081
(Continued)

(56) References Cited

U.S. PATENT DOCUMENTS 6,717,844 B1 * 4/2004 Ohtani .................... G11C 11/15
365/154
10,460,805 B2 * 10/2019 Kanda .................... G11C 11/41
(Continued)

FOREIGN PATENT DOCUMENTS

CN    107204201 A    9/2017
CN    108475521 A    8/2018
(Continued)

OTHER PUBLICATIONS

International Search Report and Written Opinion of PCT Application No. PCT/JP2019/031403, dated Oct. 21, 2019, 10 pages of ISRWO.

*Primary Examiner* — Hoai V Ho
(74) *Attorney, Agent, or Firm* — Chip Law Group

(57) ABSTRACT

A semiconductor circuit according to the present disclosure includes a first circuit that generates an inverted voltage of a voltage at a first node, and applies the inverted voltage to a second nodes, a second circuit that generates an inverted voltage of a voltage at the second node, and applies the inverted voltage to the first node, a first memory element that has a first terminal, a second terminal, and a third terminal, and stores information by setting a resistance state between the second terminal and the third terminal to a first resistance state or a second resistance state in accordance with a direction of a first current flowing between the first terminal and the second terminal, a first transistor that couples the first node to the third terminal of the first memory element and a second transistor that is coupled to a first coupling node.

21 Claims, 41 Drawing Sheets

(58) Field of Classification Search
USPC .................................................. 365/185.08
See application file for complete search history.

(56) References Cited

U.S. PATENT DOCUMENTS

| | | |
|---|---|---|
| 2004/0052106 A1 | 3/2004 | Ohtani |
| 2017/0270985 A1 | 9/2017 | Shimomura et al. |
| 2018/0375015 A1 | 12/2018 | Sasaki |
| 2019/0013076 A1 | 1/2019 | Kanda et al. |
| 2019/0051354 A1 | 2/2019 | Kanda et al. |
| 2019/0156891 A1 | 5/2019 | Kanda et al. |
| 2020/0098401 A1* | 3/2020 | Kanda ............... H01L 29/78391 |

FOREIGN PATENT DOCUMENTS

| | | |
|---|---|---|
| CN | 108701477 A | 10/2018 |
| CN | 109196587 A | 1/2019 |
| CN | 109906483 A | 6/2019 |
| JP | 2004-103174 A | 4/2004 |
| JP | 2017-168658 A | 9/2017 |
| JP | 2017-208146 A | 11/2017 |
| KR | 10-2018-0102558 A | 9/2018 |
| KR | 10-2018-0115268 A | 10/2018 |
| KR | 10-2019-0007421 A | 1/2019 |
| KR | 10-2019-0084038 A | 7/2019 |
| WO | 2009/028298 A1 | 3/2009 |
| WO | 2017/122497 A1 | 7/2017 |
| WO | 2017/150028 A1 | 9/2017 |
| WO | 2017/159432 A1 | 9/2017 |
| WO | 2017/199677 A1 | 11/2017 |
| WO | 2018/088297 A1 | 5/2018 |

* cited by examiner

[FIG. 1]
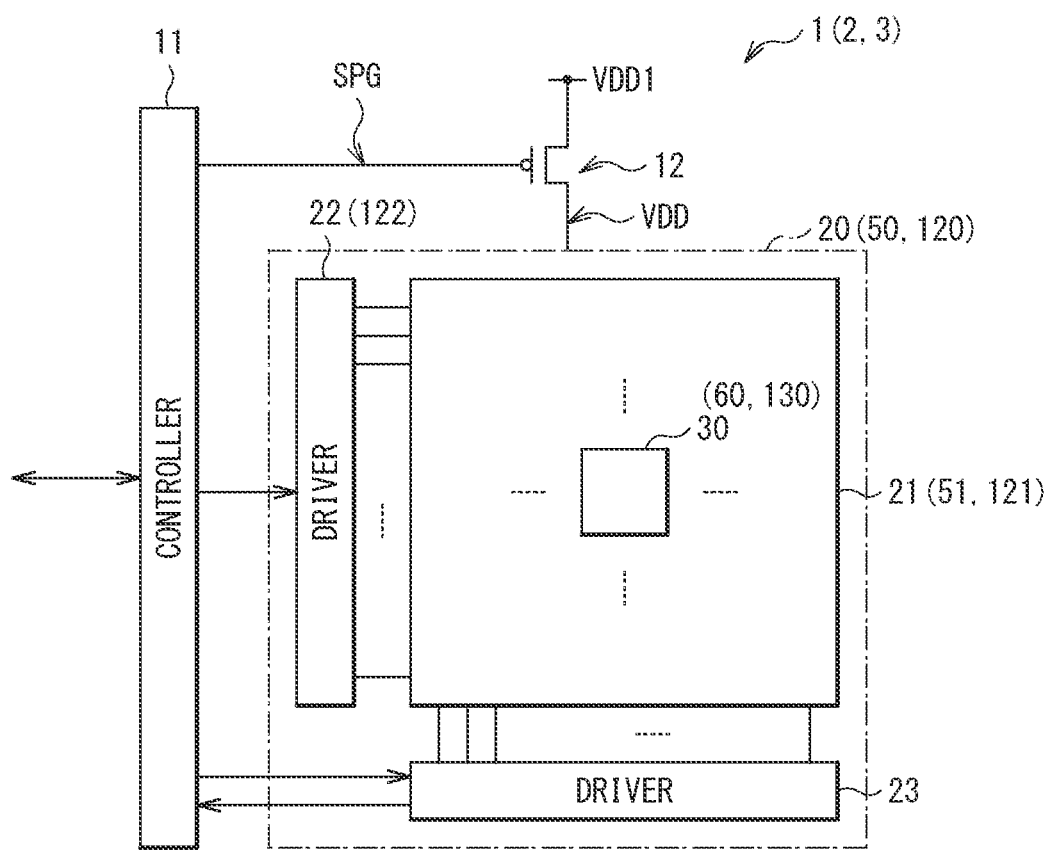

[FIG. 2]
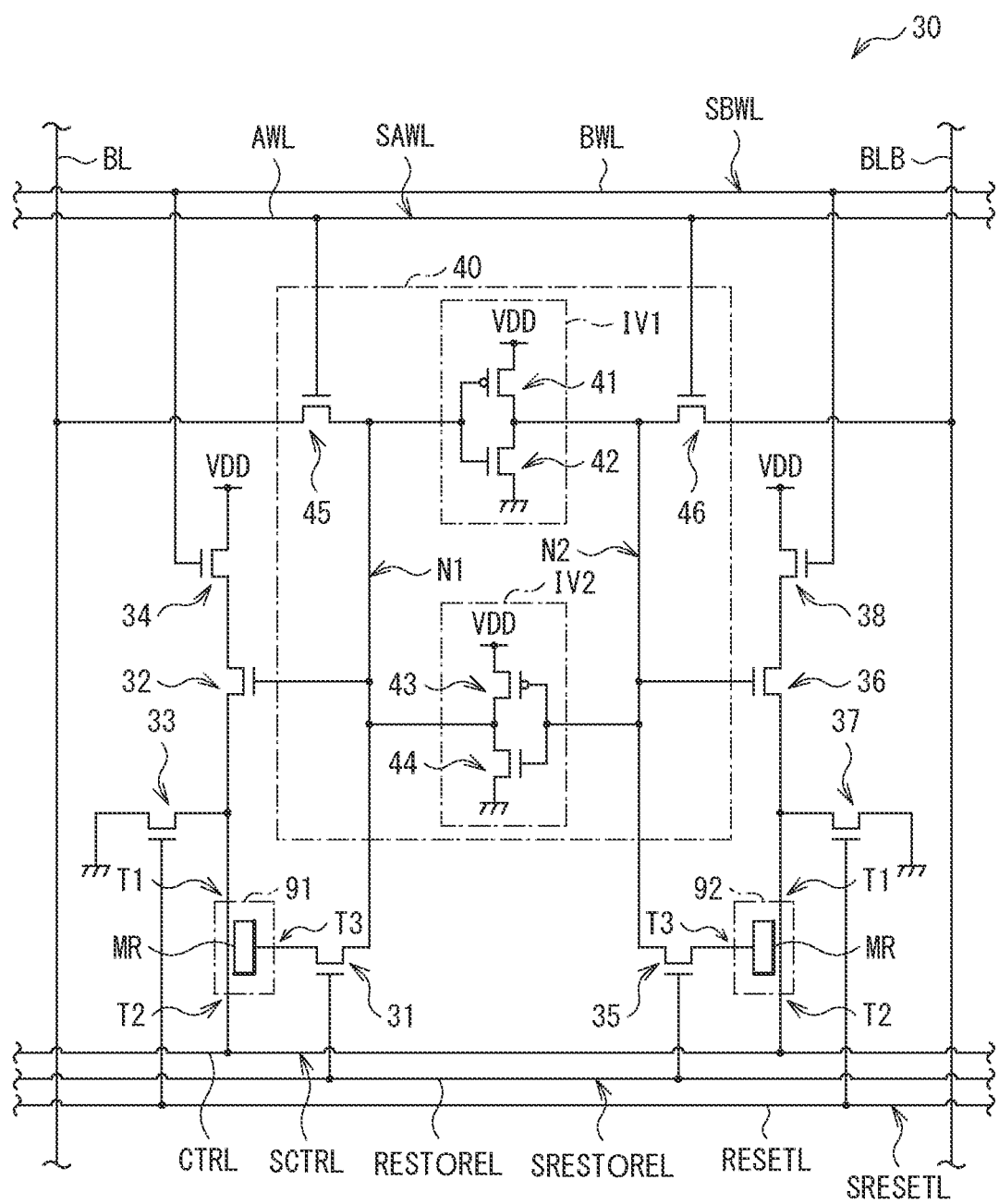

[FIG. 3]
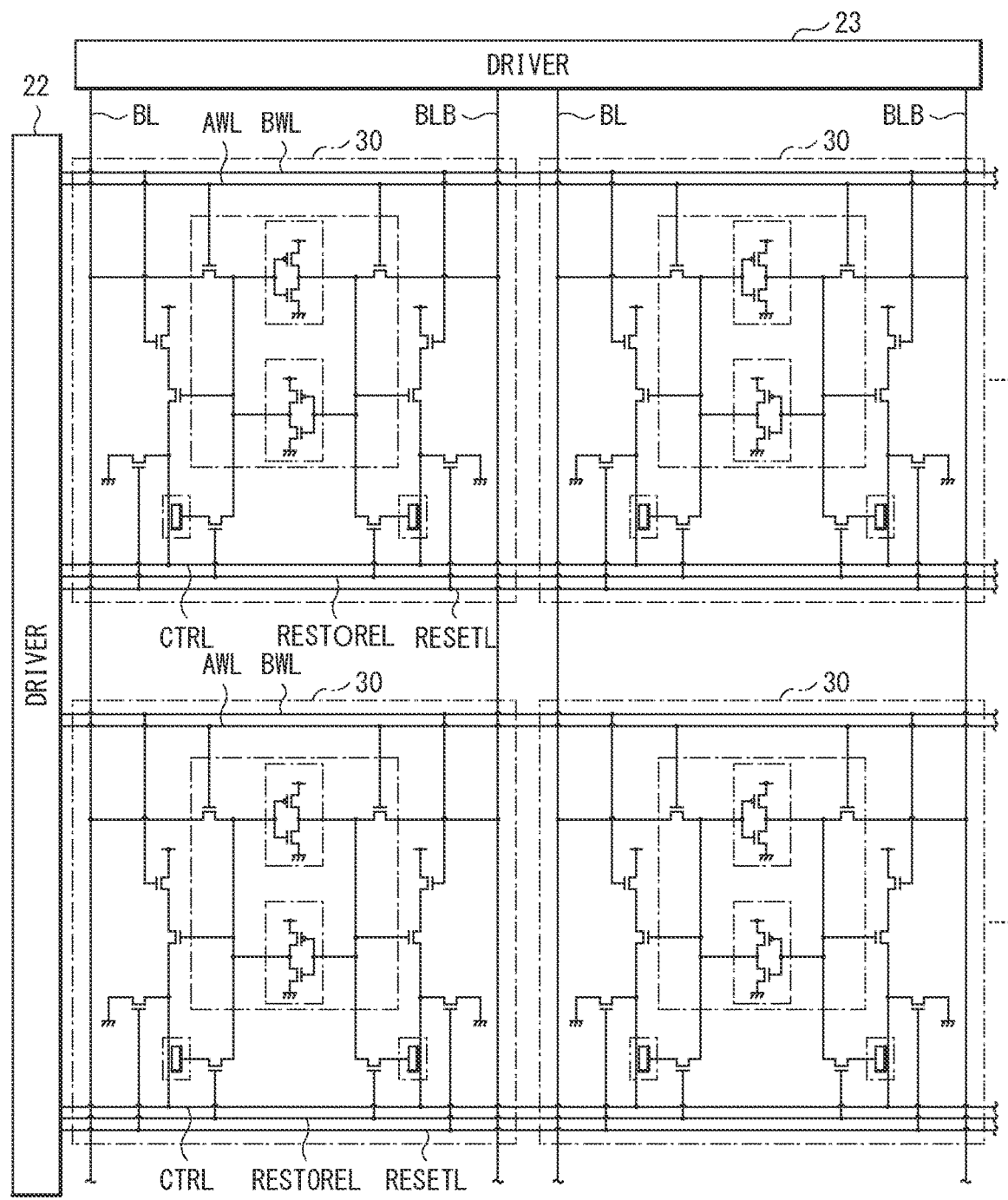

[FIG. 4]
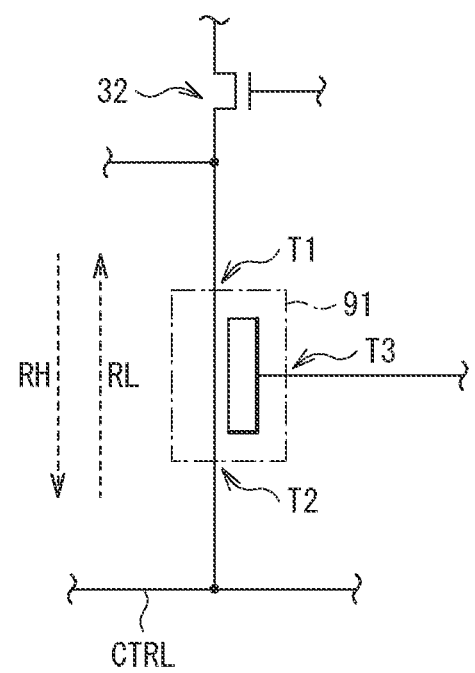

[FIG. 5]
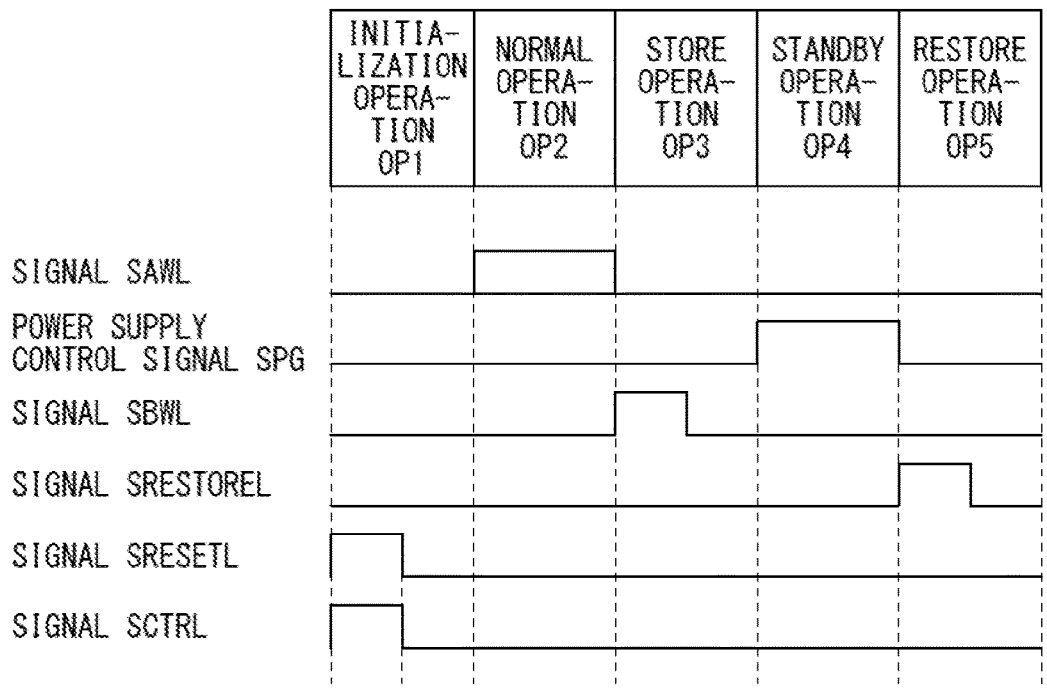
[FIG. 6A]
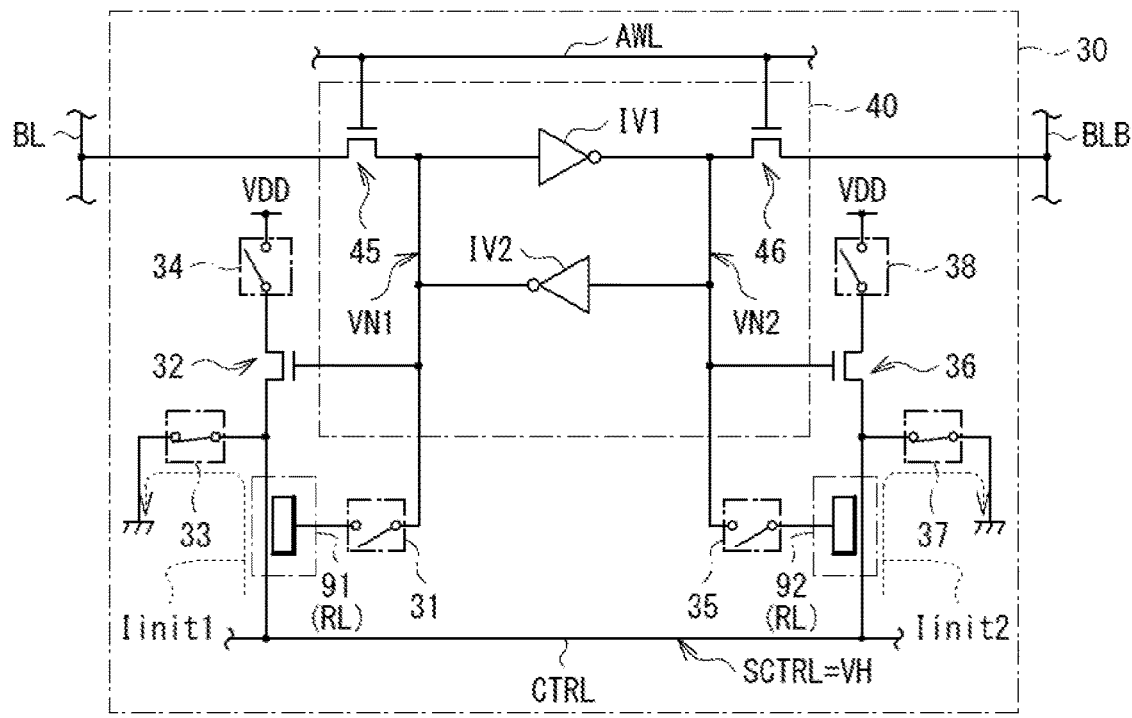

[FIG. 6B]
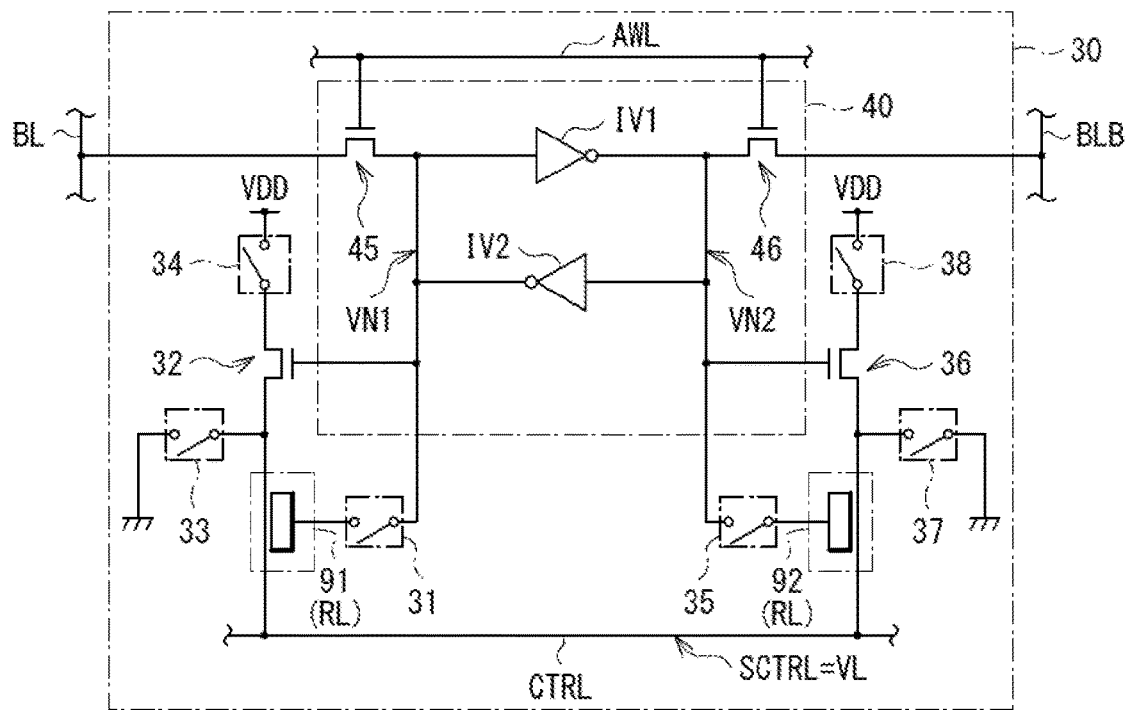
[FIG. 6C]
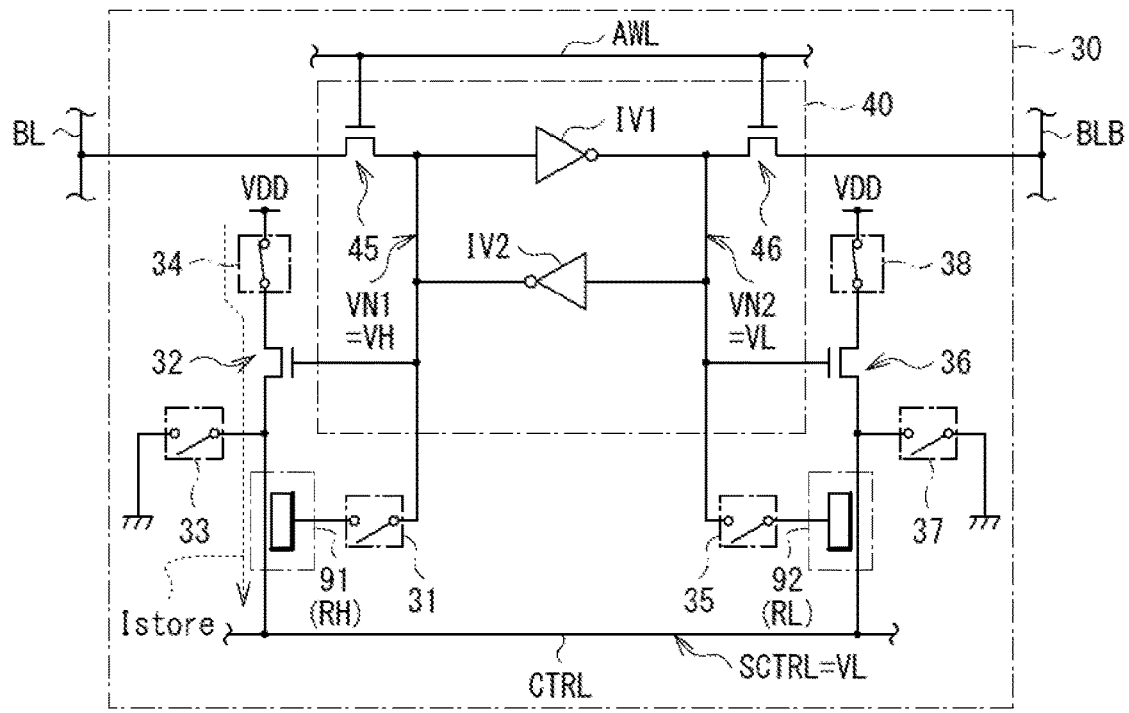

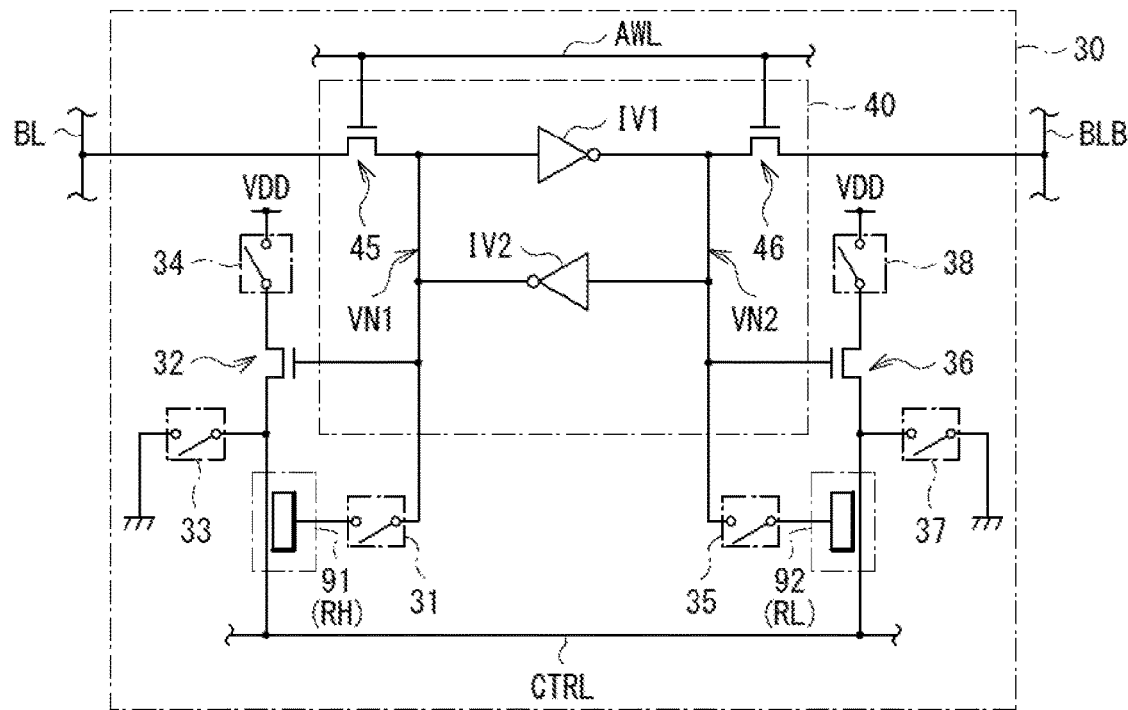
[FIG. 6D]
[FIG. 6E]

[FIG. 7]
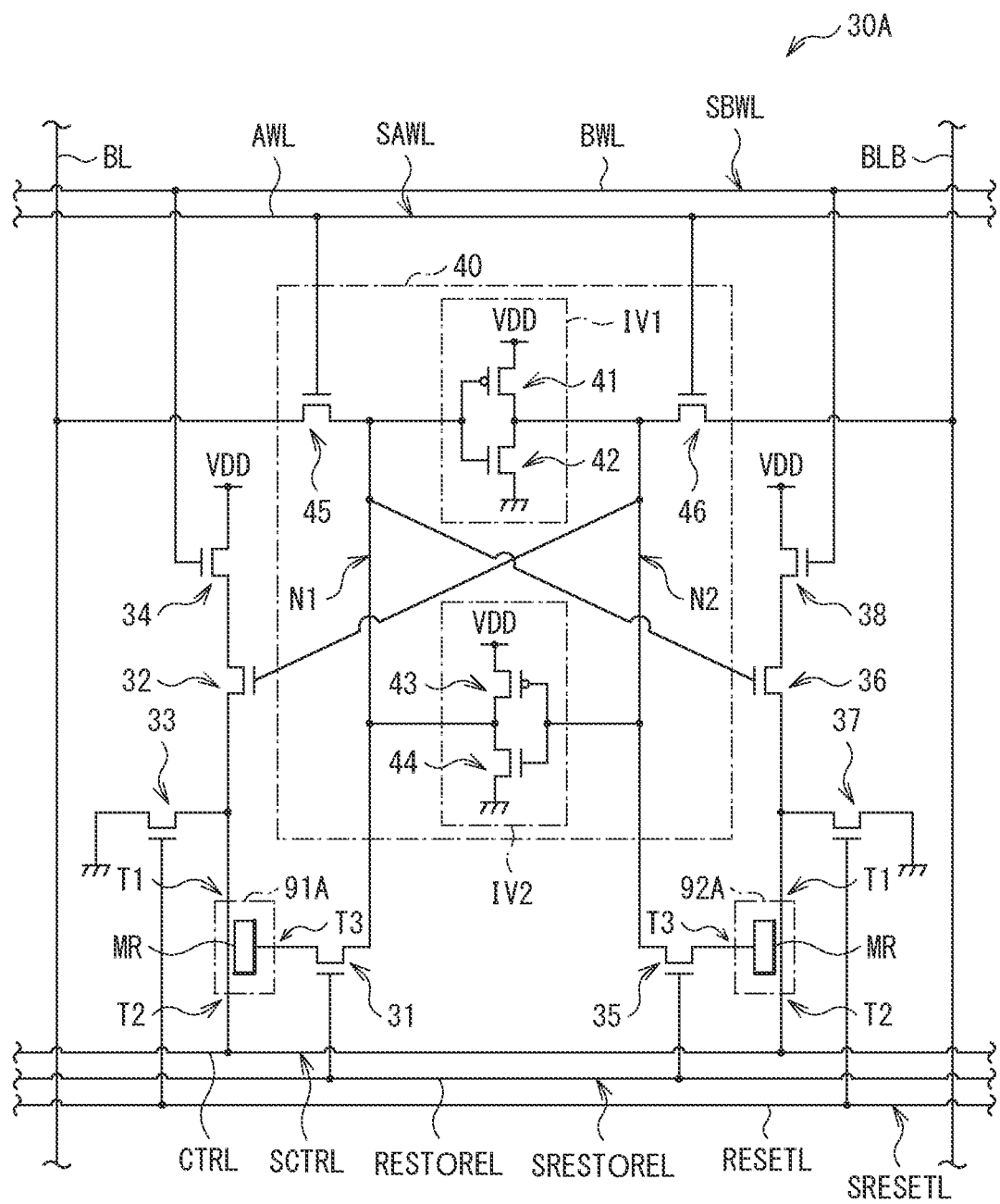

[FIG. 8]
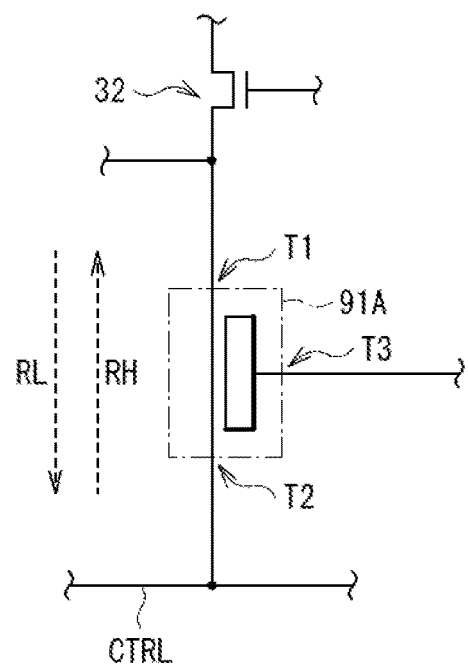
[FIG. 9A]
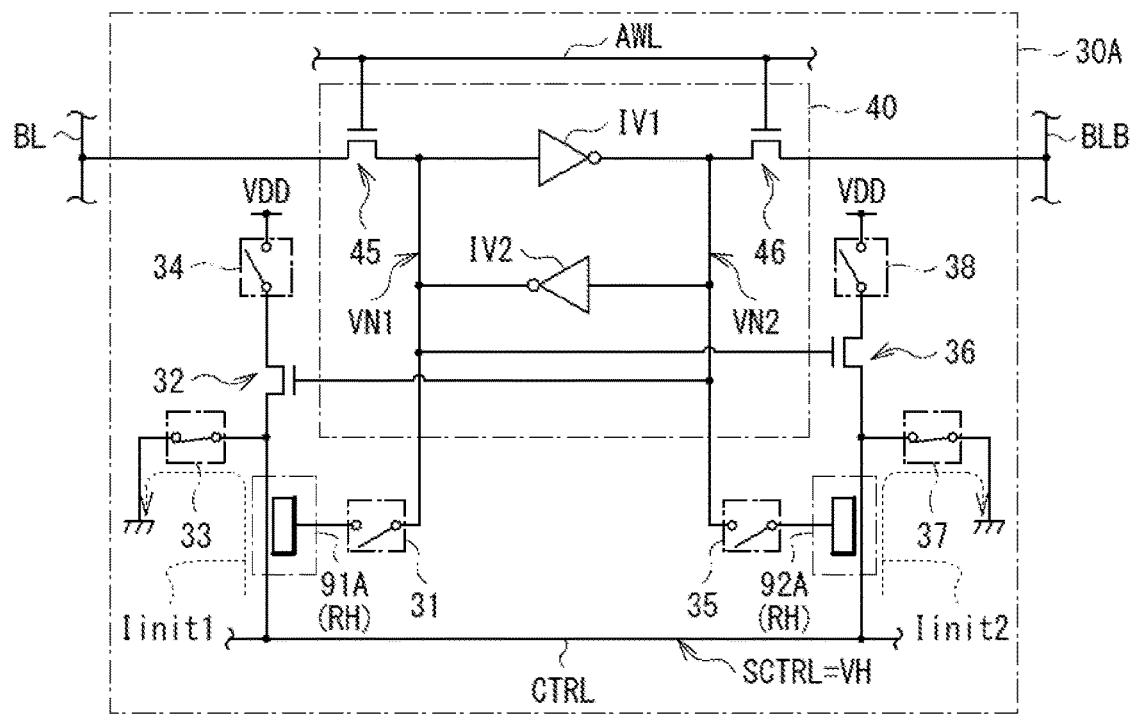

[FIG. 9B]
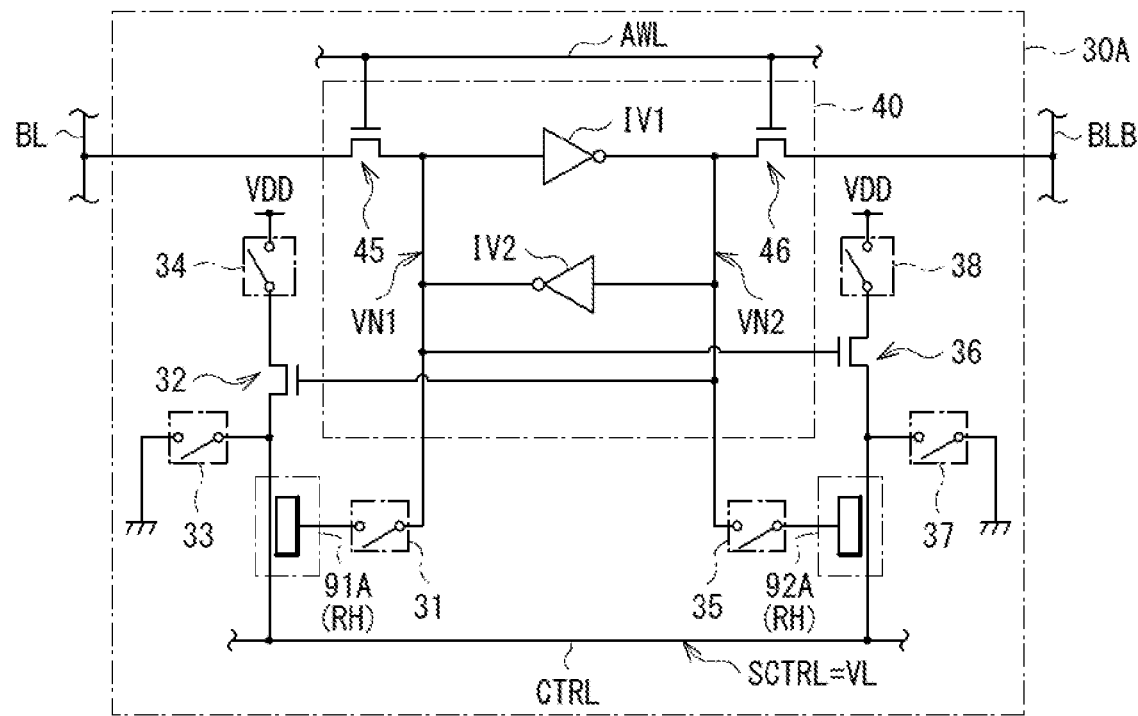
[FIG. 9C]
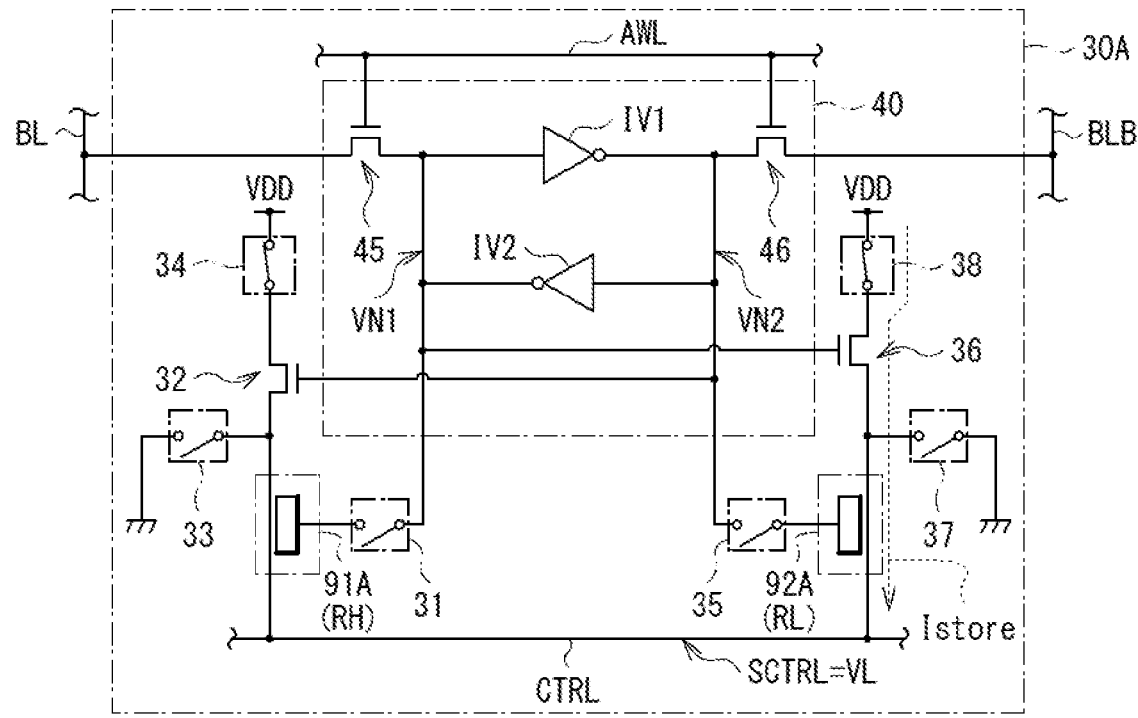

[FIG. 9D]
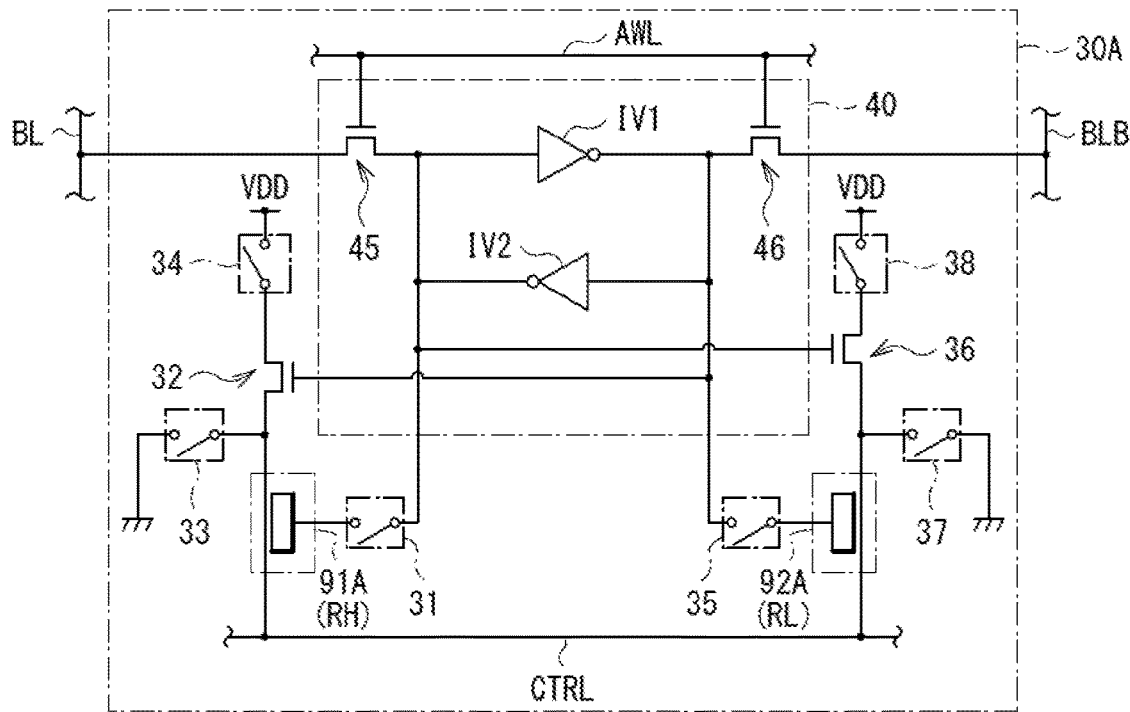
[FIG. 9E]
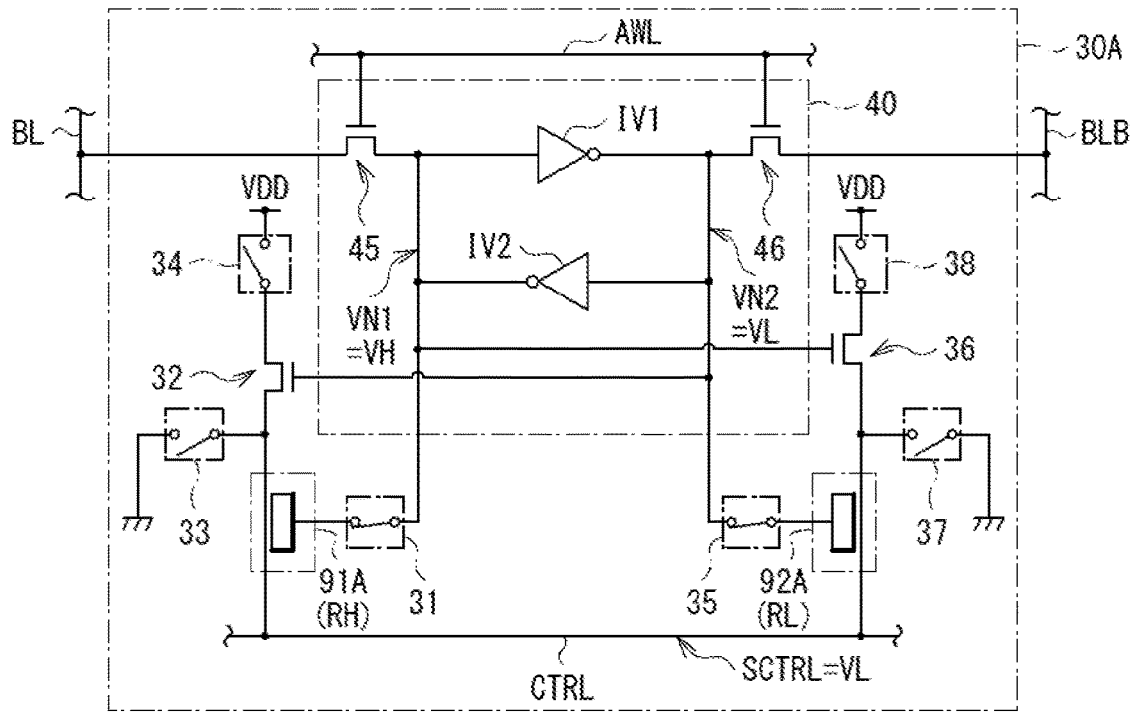

[FIG. 10]
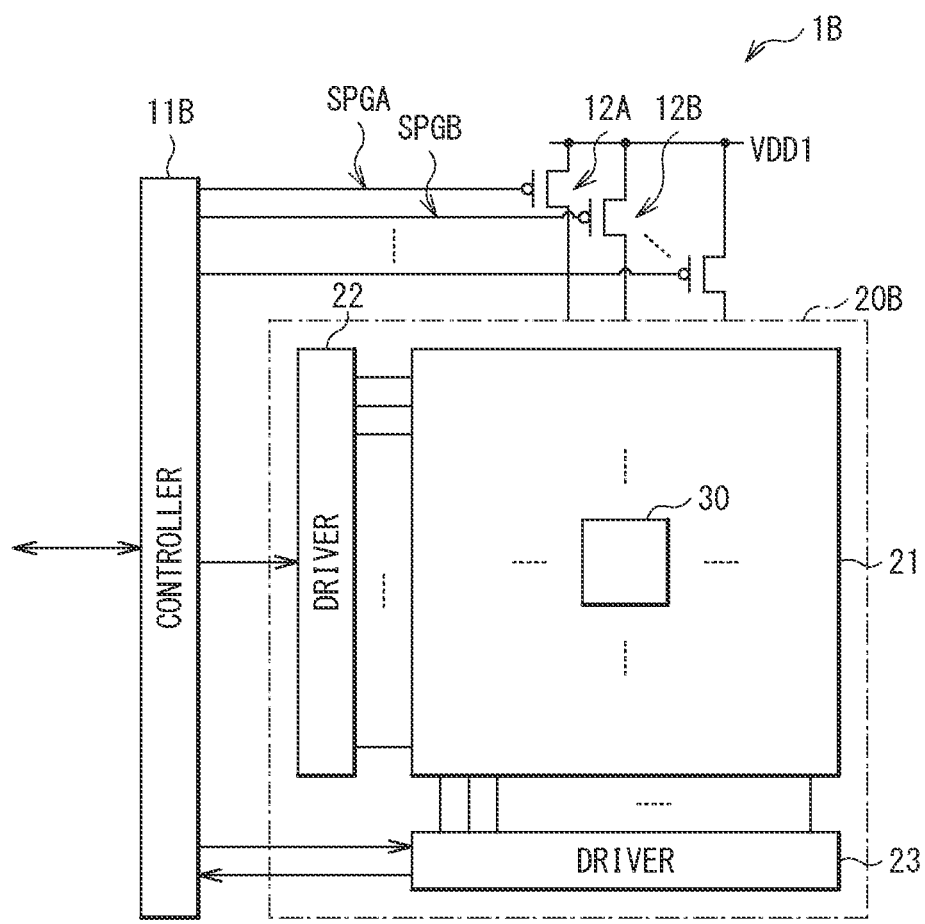

[FIG. 11]
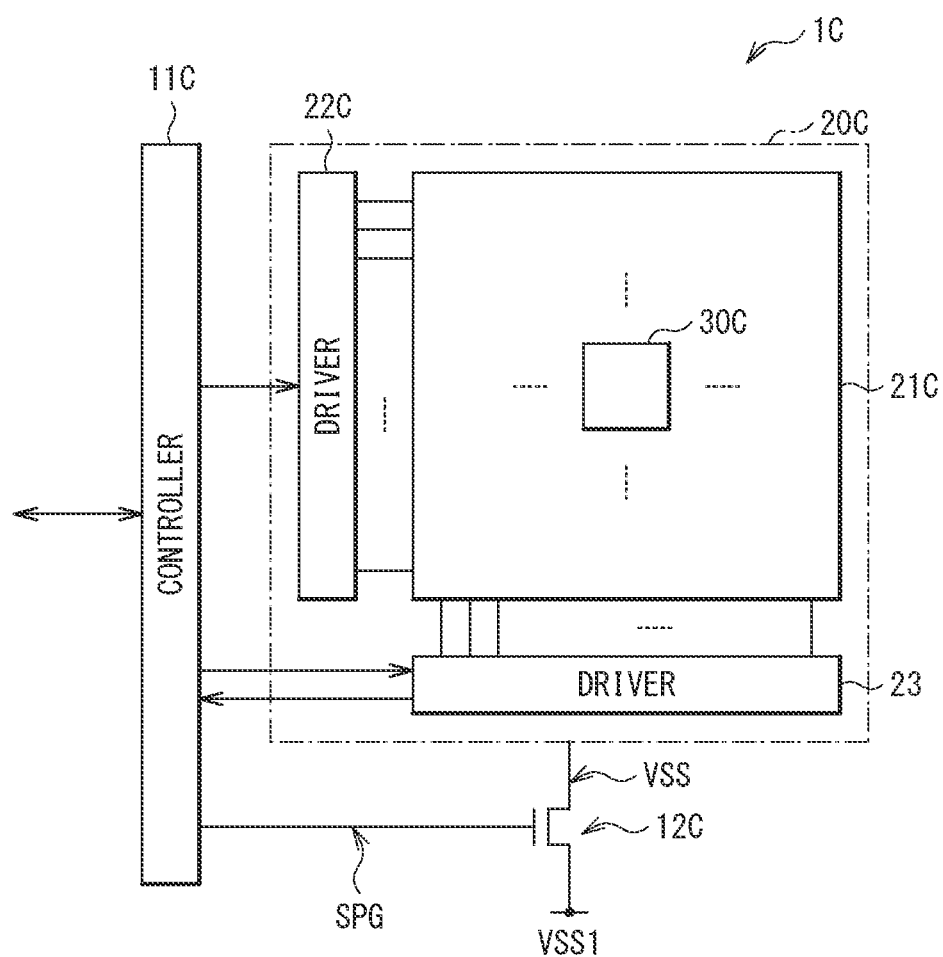

[FIG. 12]
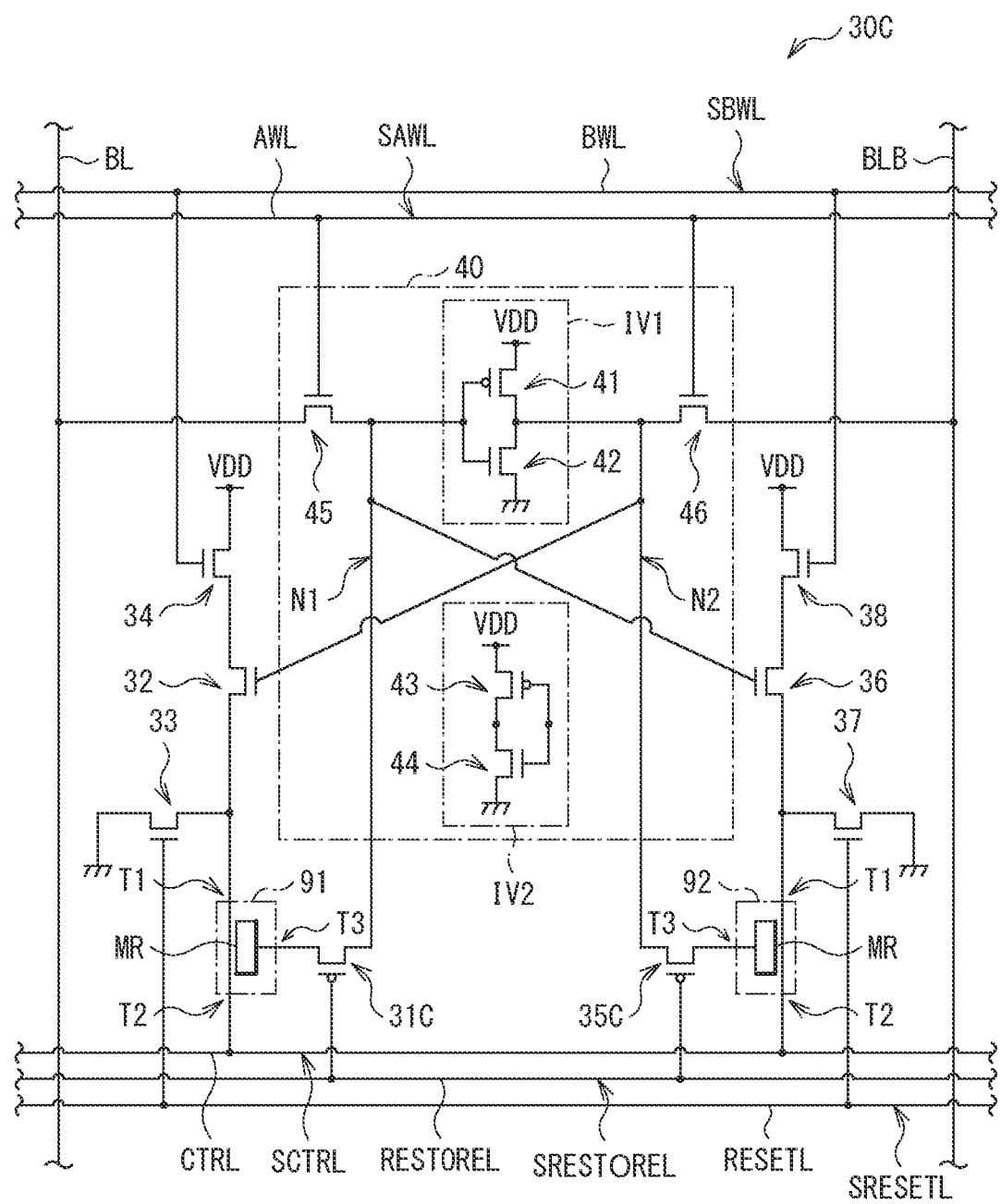

[FIG. 13]
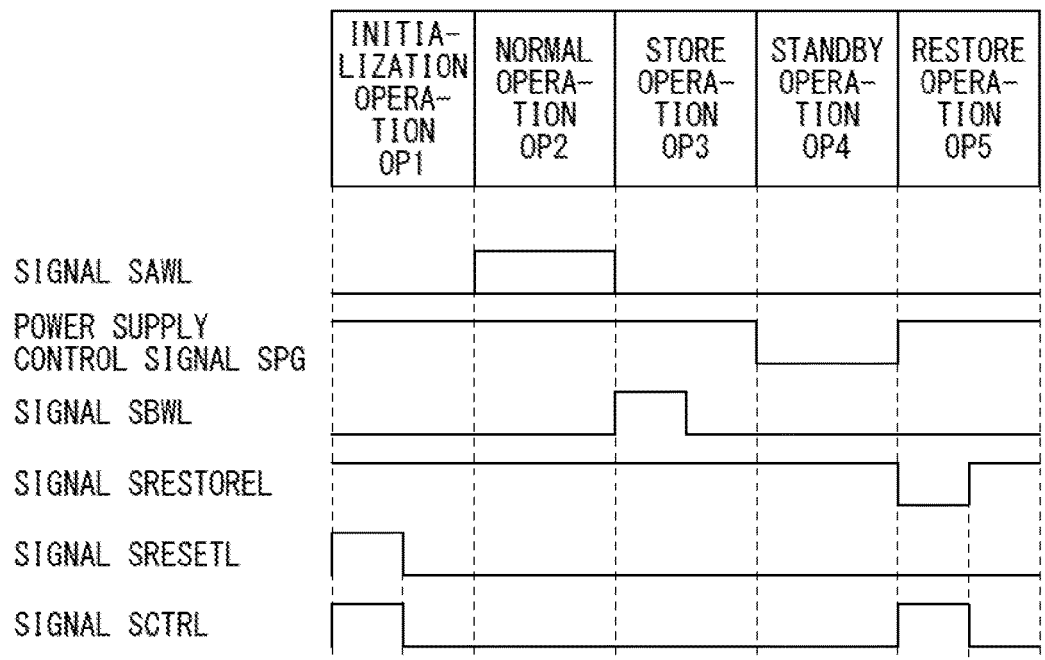
[FIG. 14A]
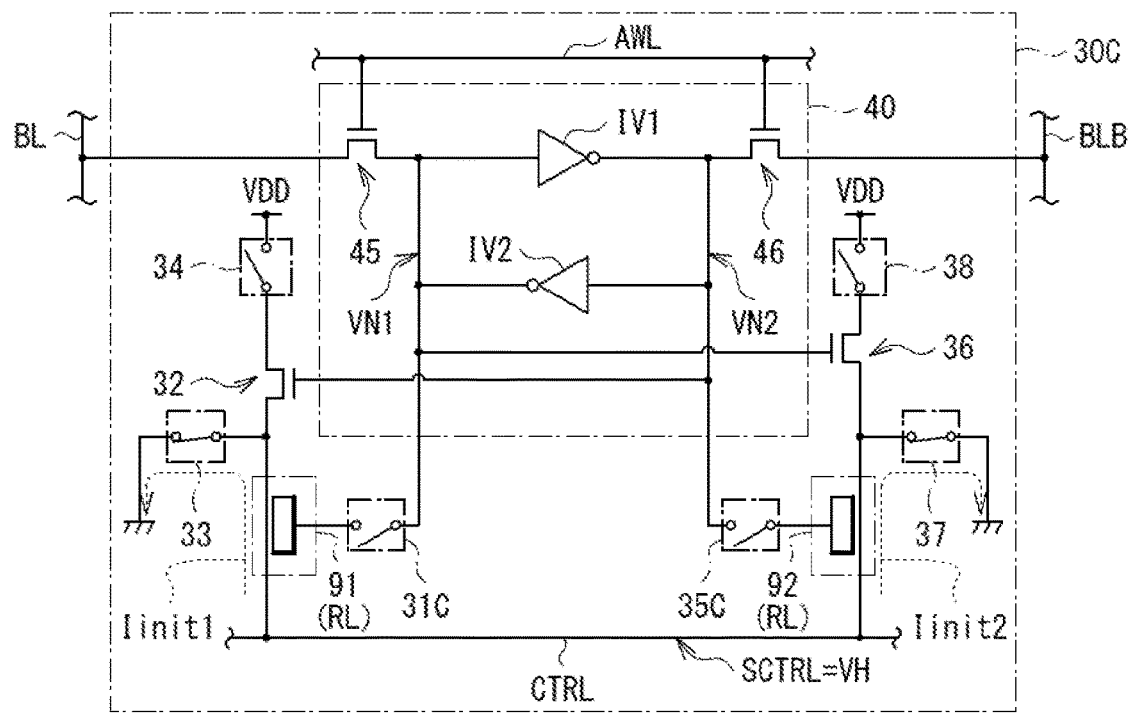

[FIG. 14B]
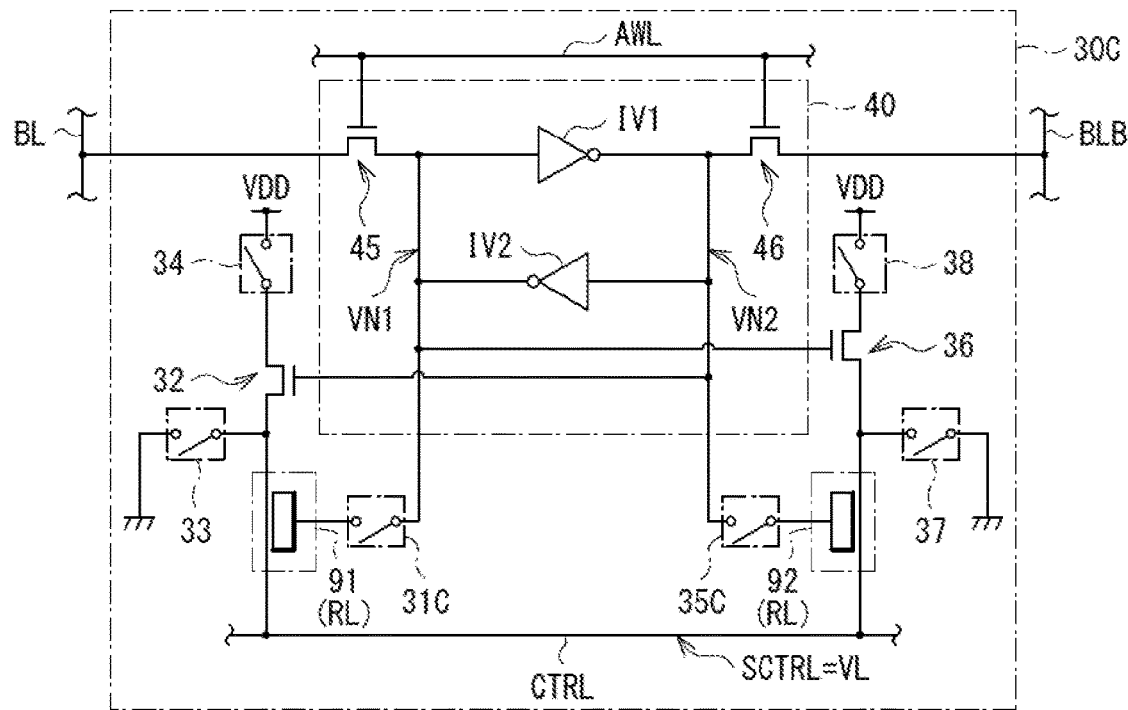
[FIG. 14C]
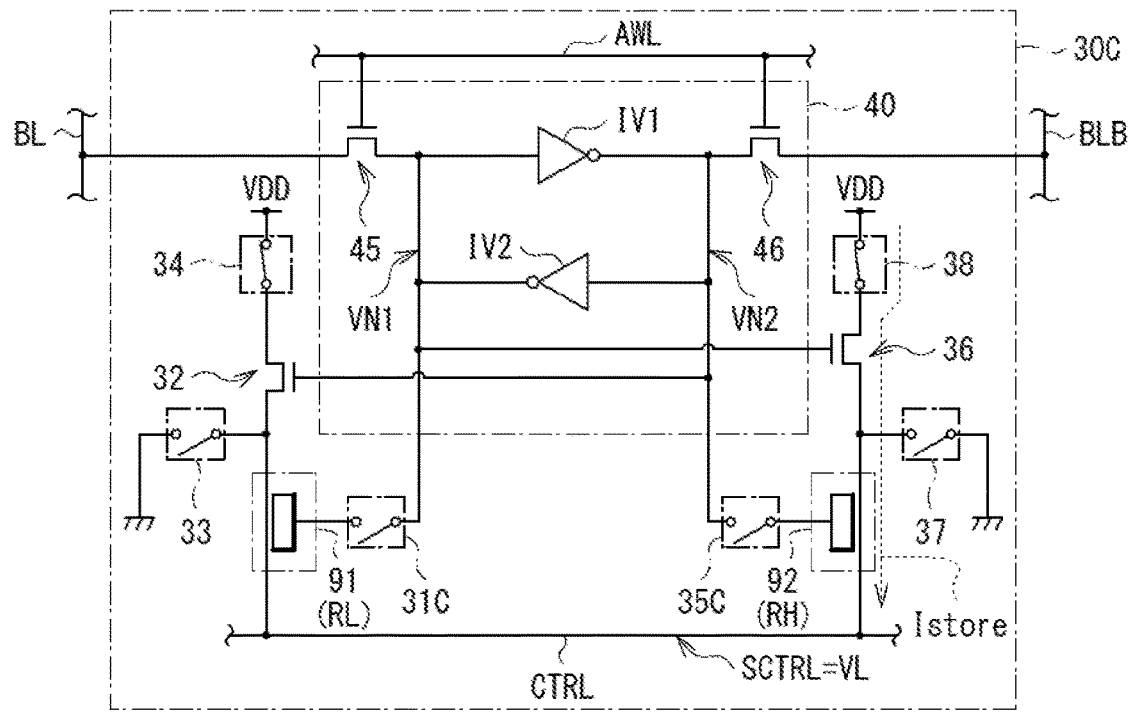

[FIG. 14D]
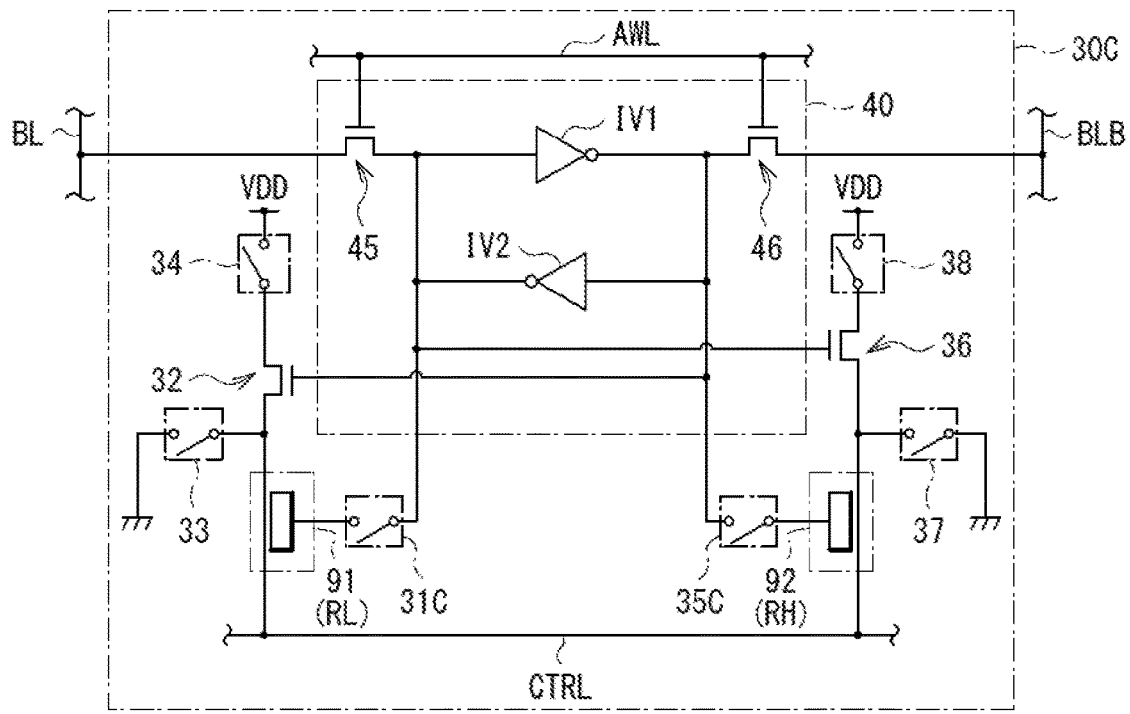
[FIG. 14E]
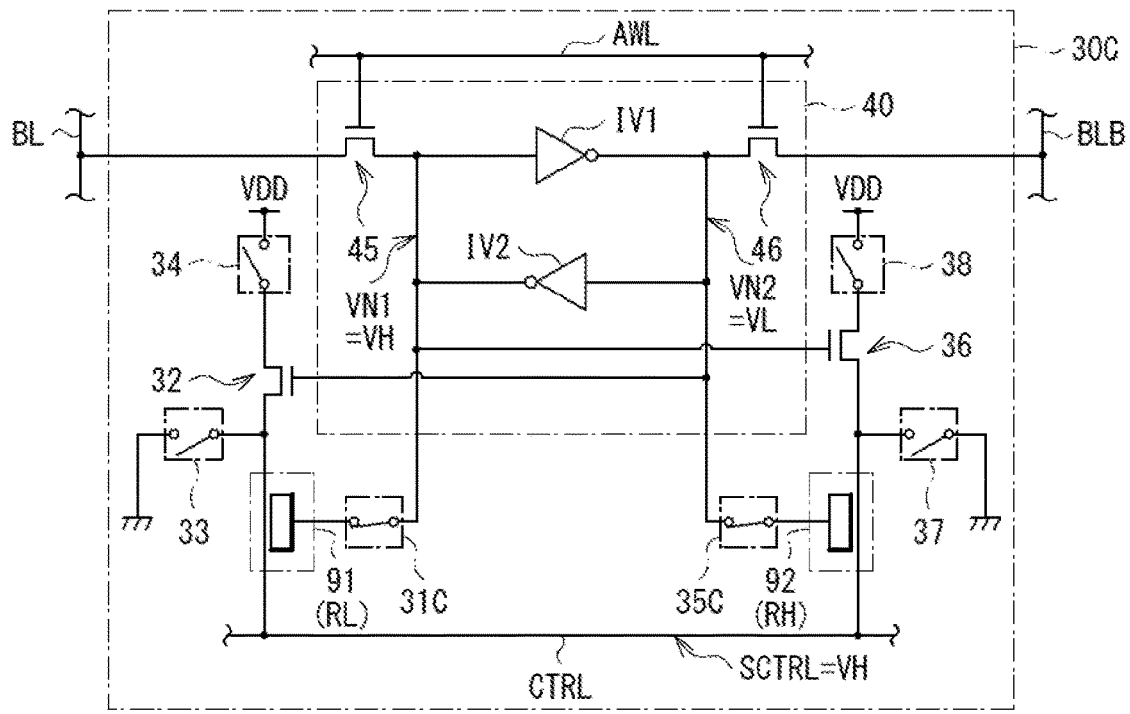

[FIG. 15]
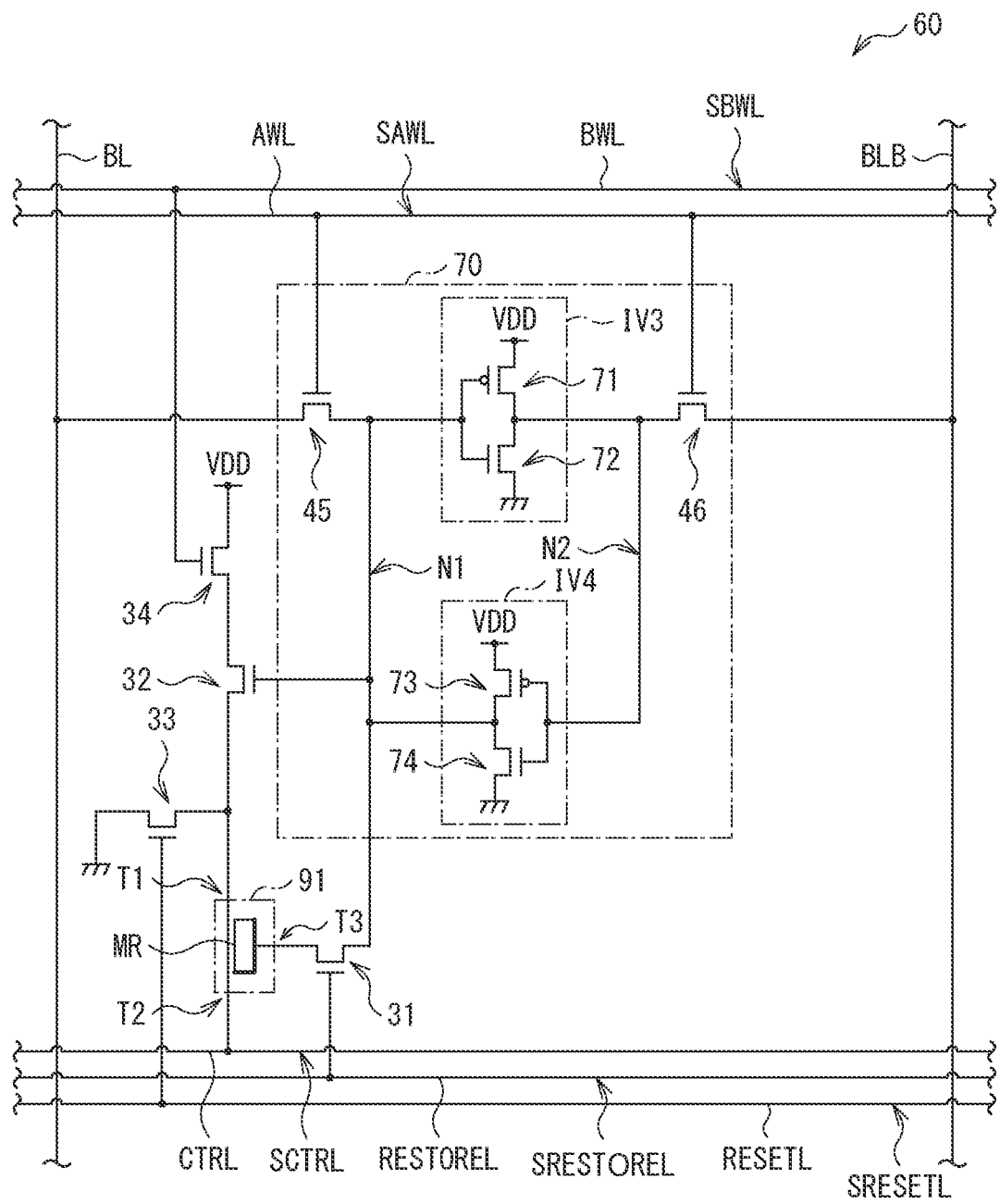

[FIG. 16]
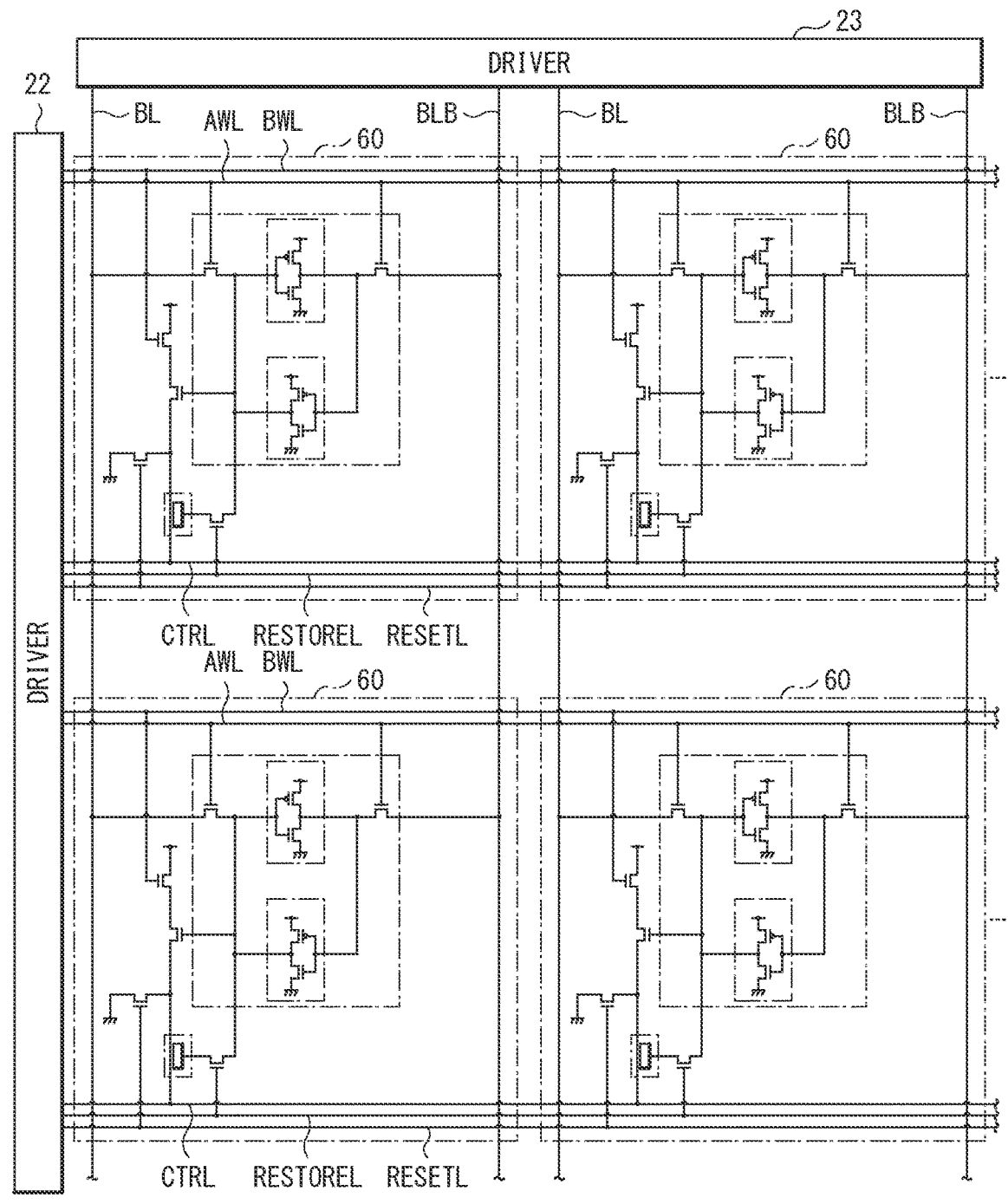

[FIG. 17A]
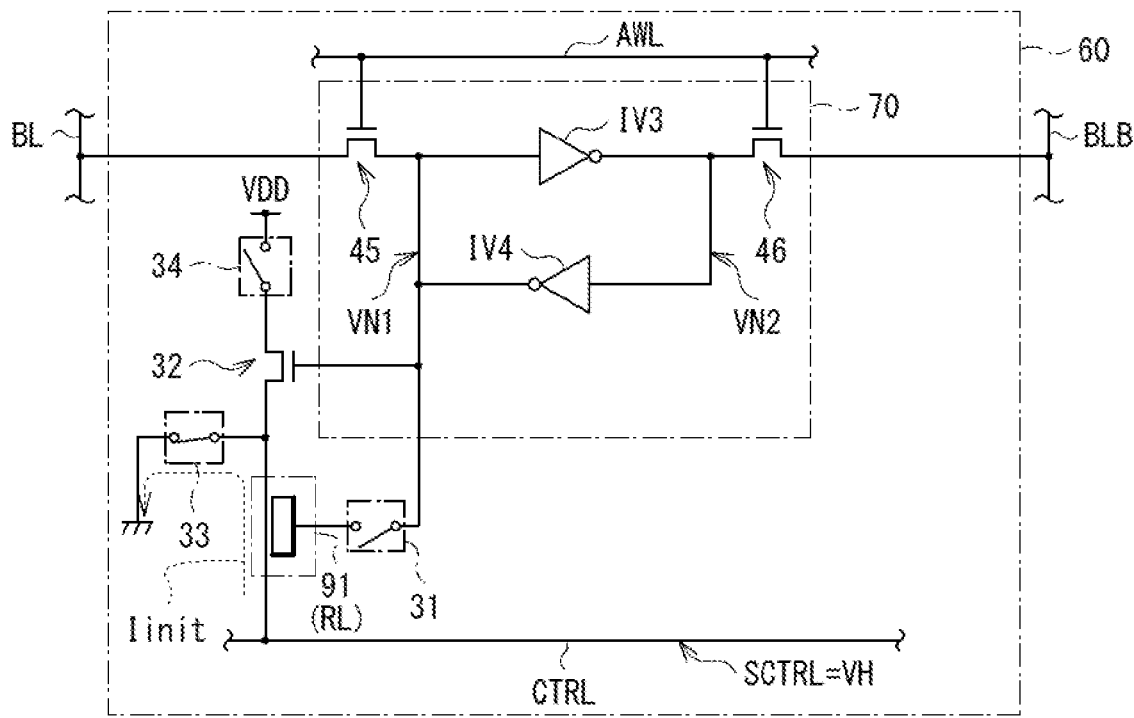
[FIG. 17B]
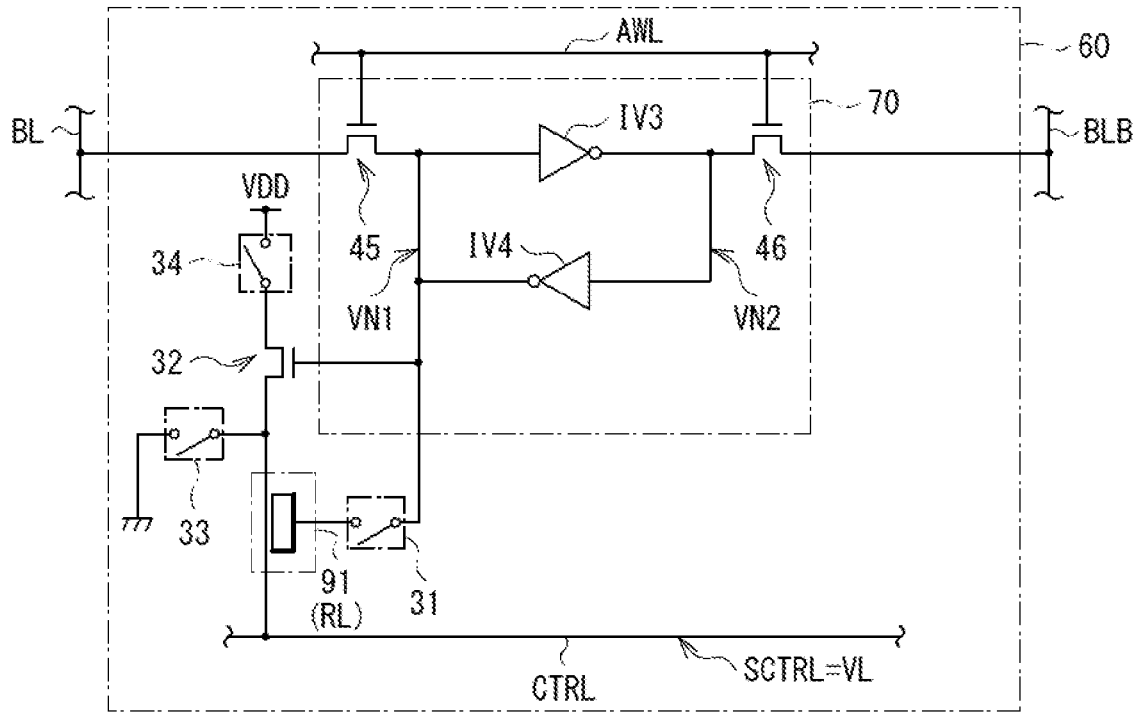

[FIG. 18A]
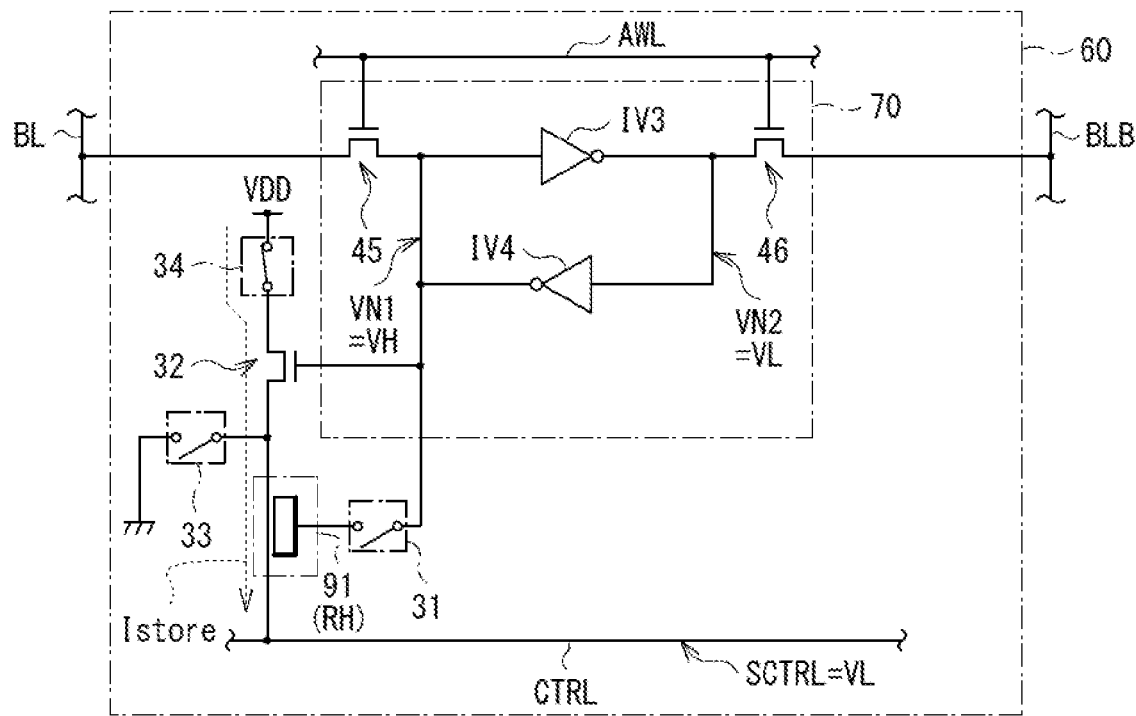
[FIG. 18B]
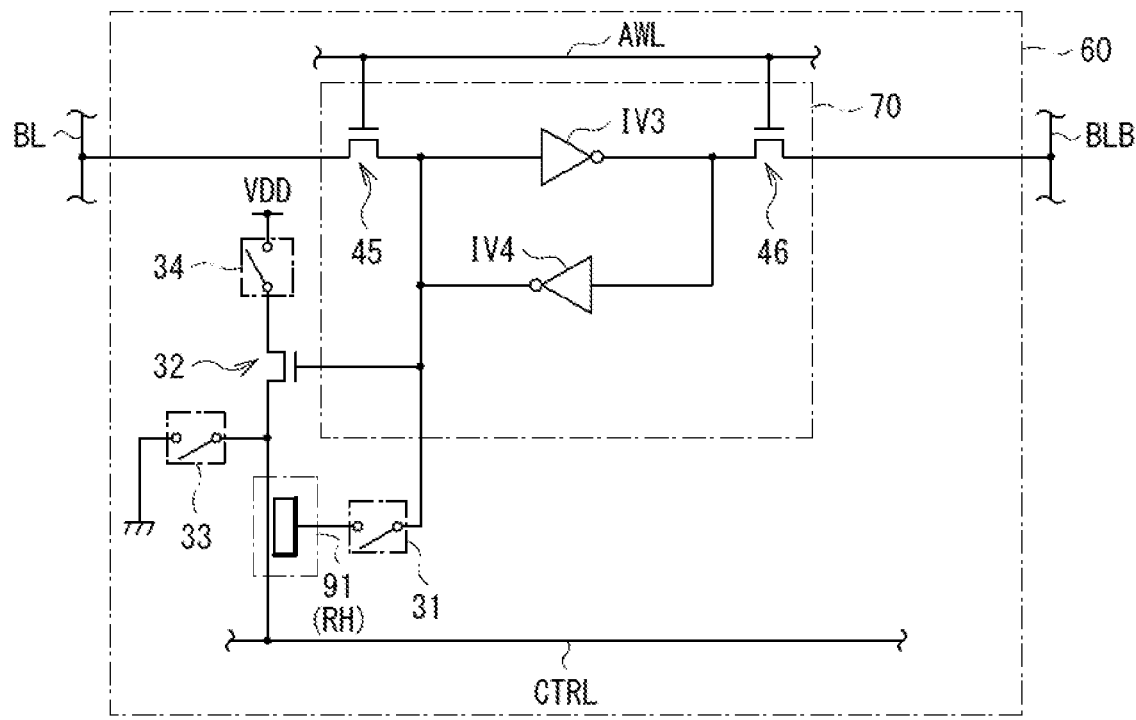

[FIG. 18C]
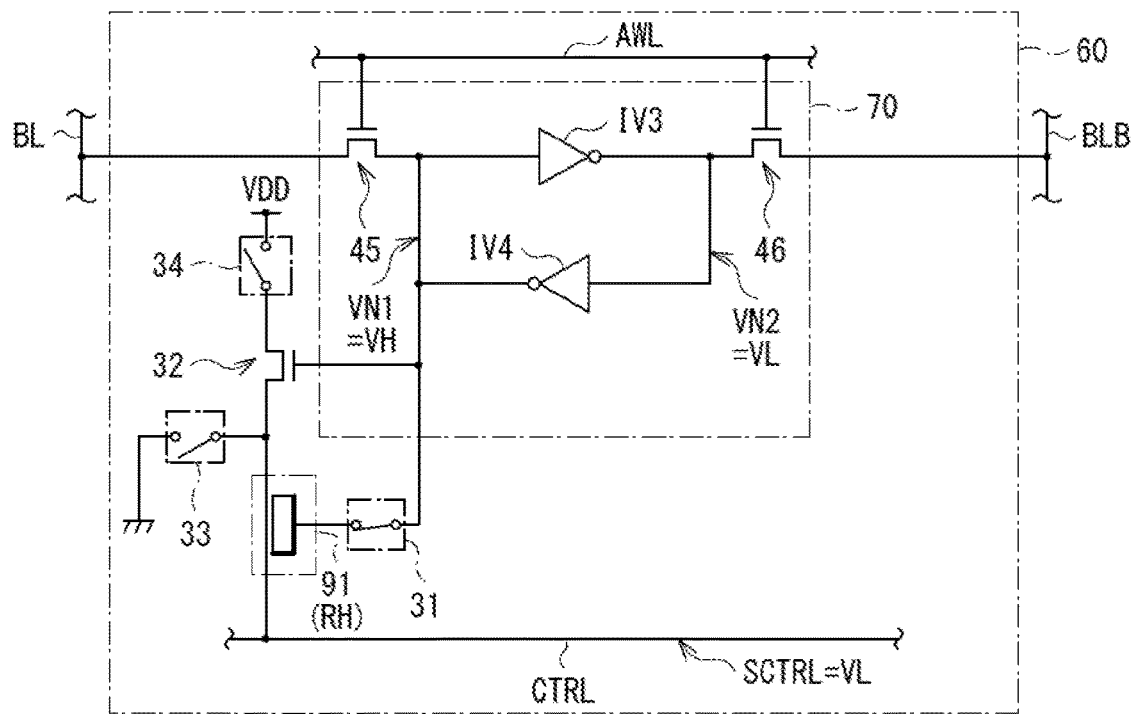
[FIG. 19A]
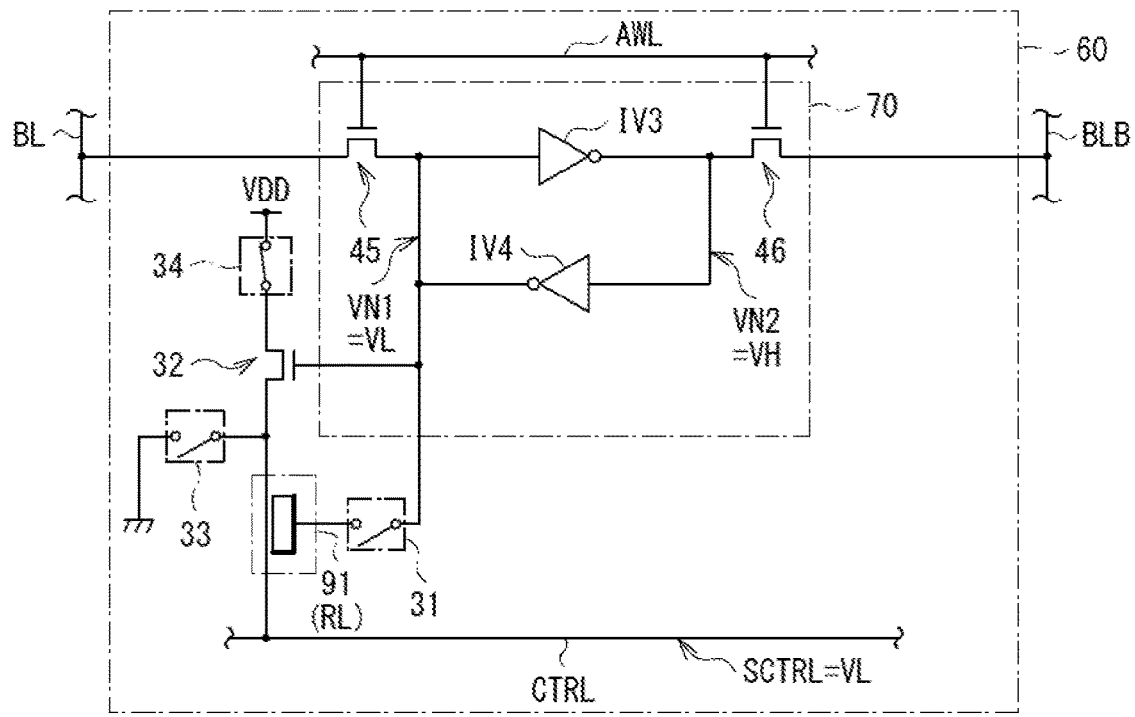

[FIG. 19B]
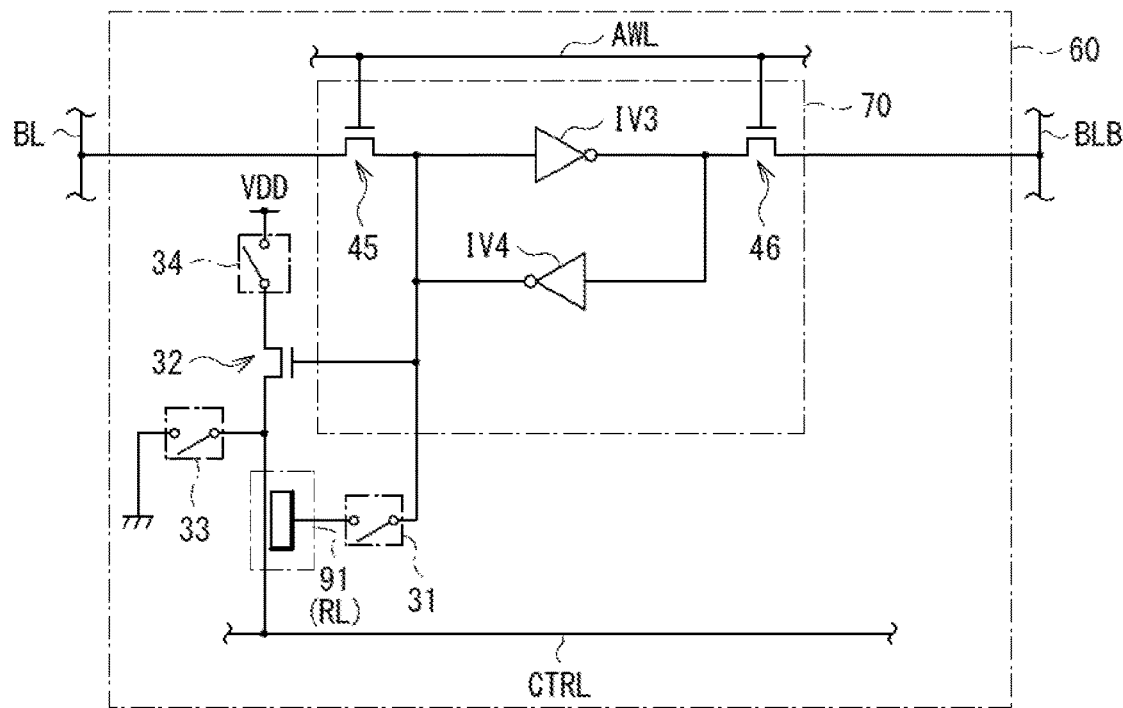
[FIG. 19C]
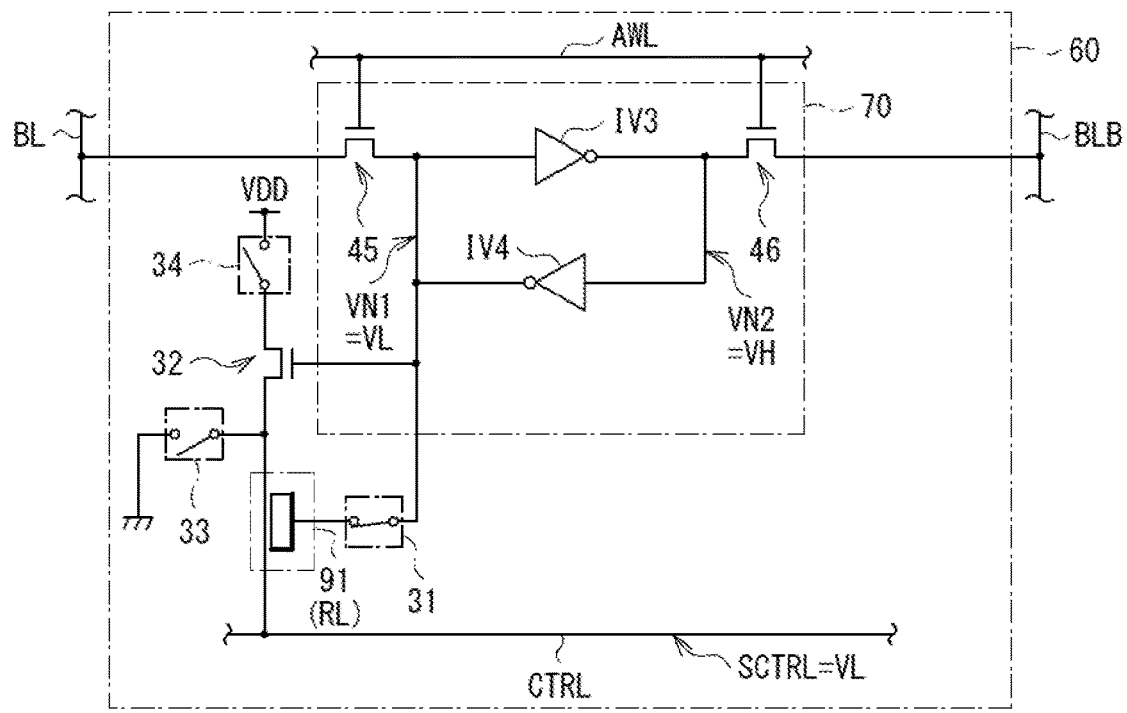

[FIG. 20]
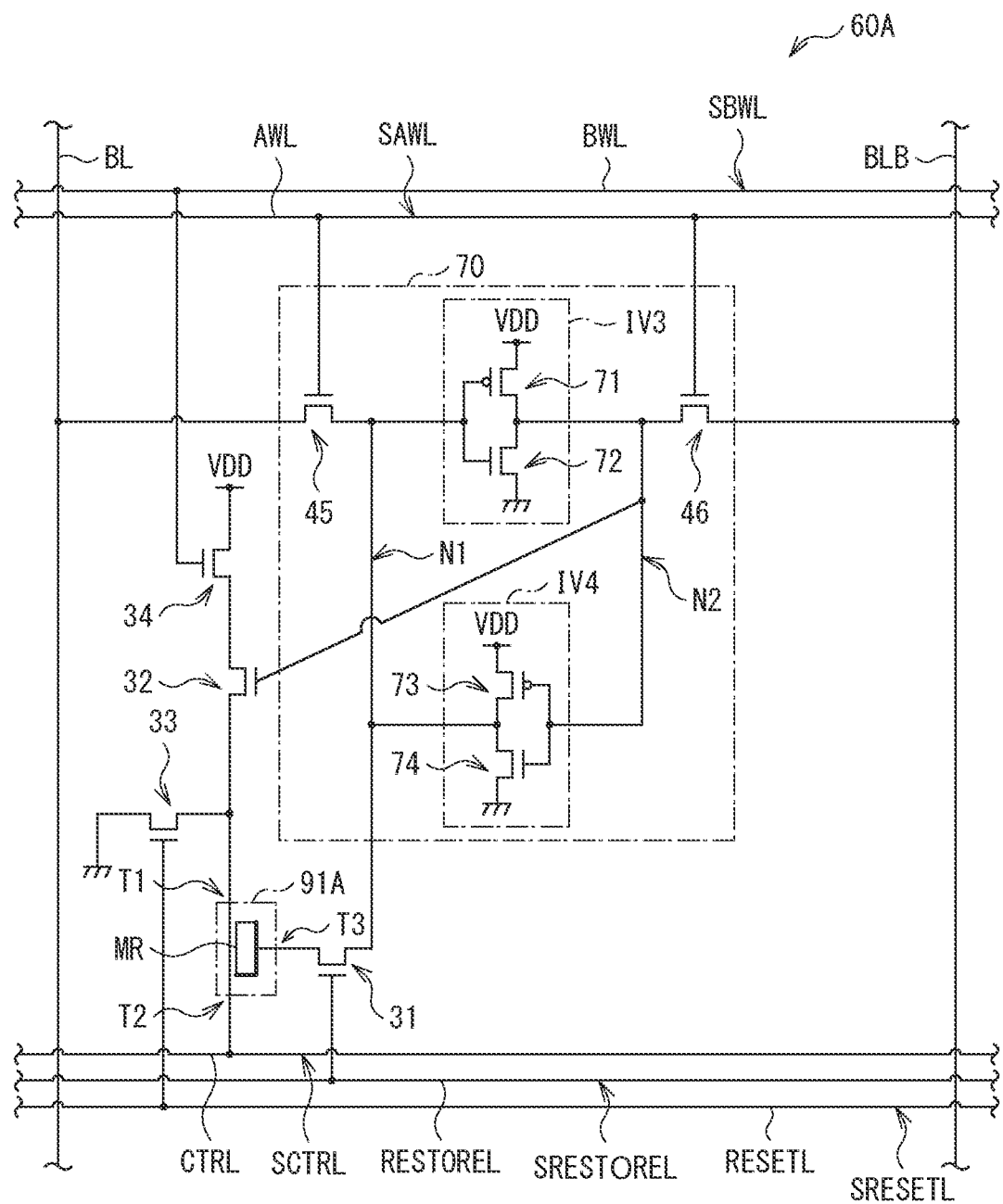

[FIG. 21A]
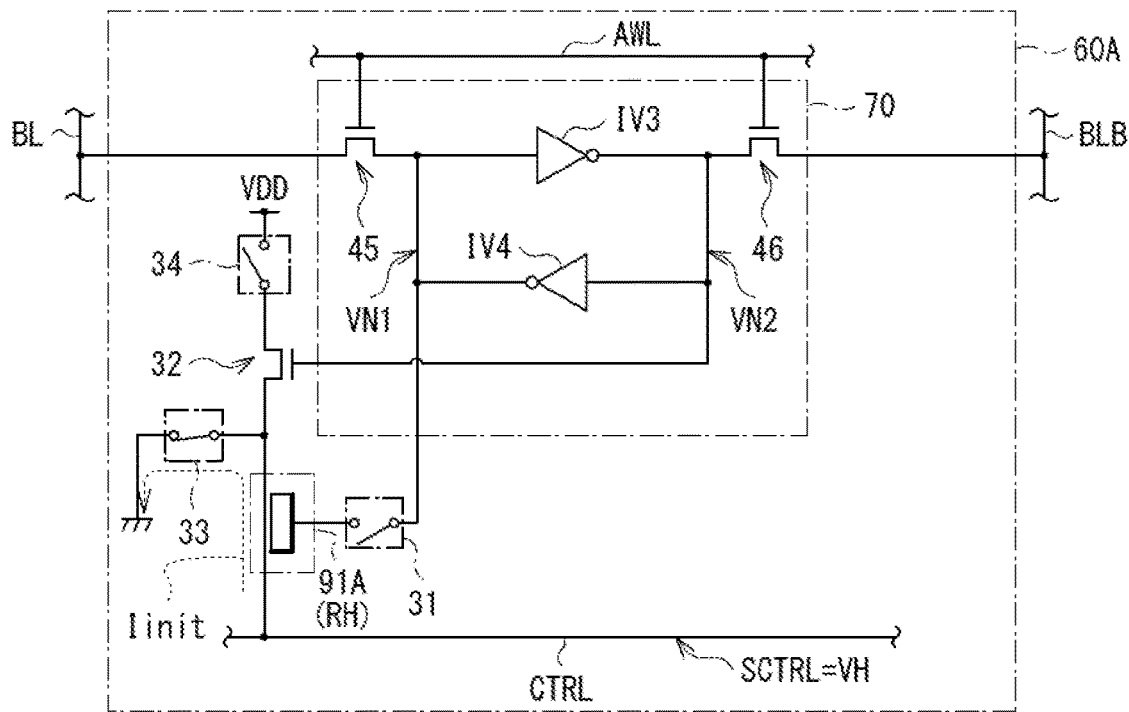
[FIG. 21B]
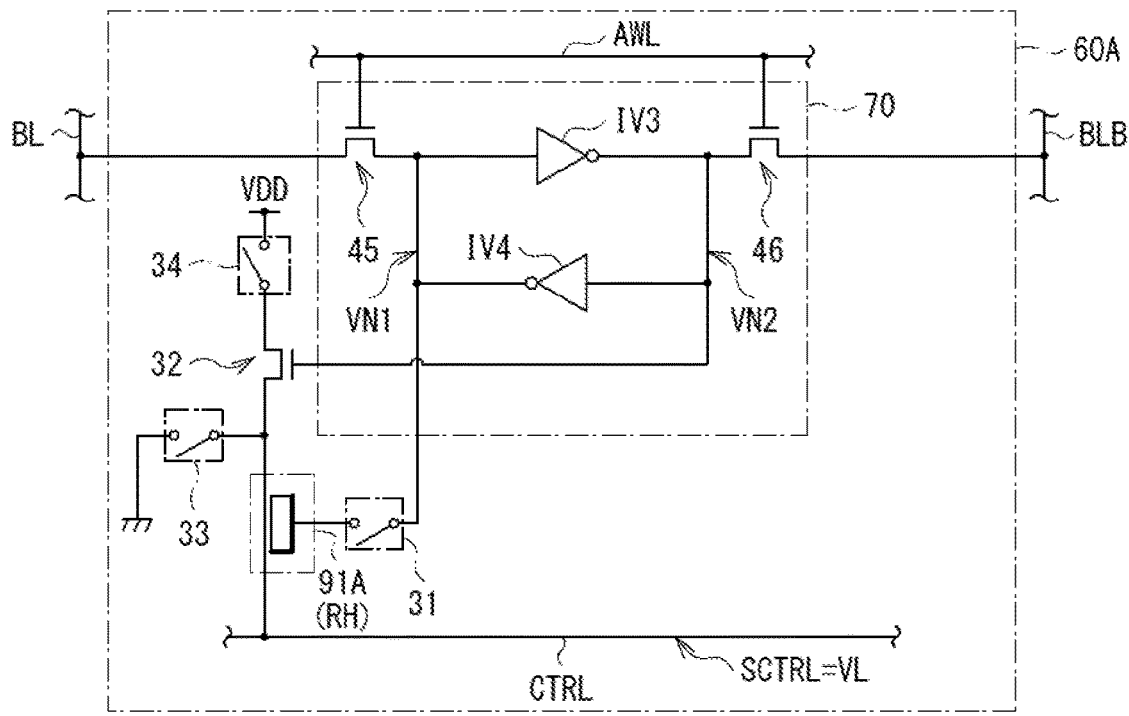

[FIG. 22A]
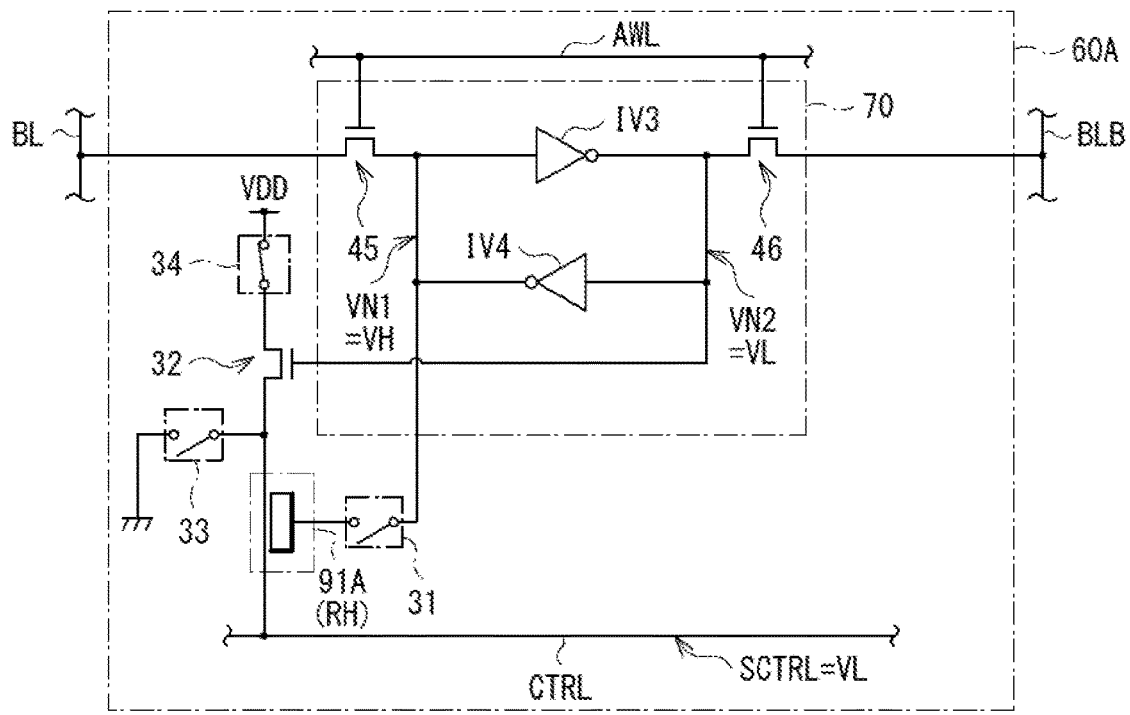
[FIG. 22B]
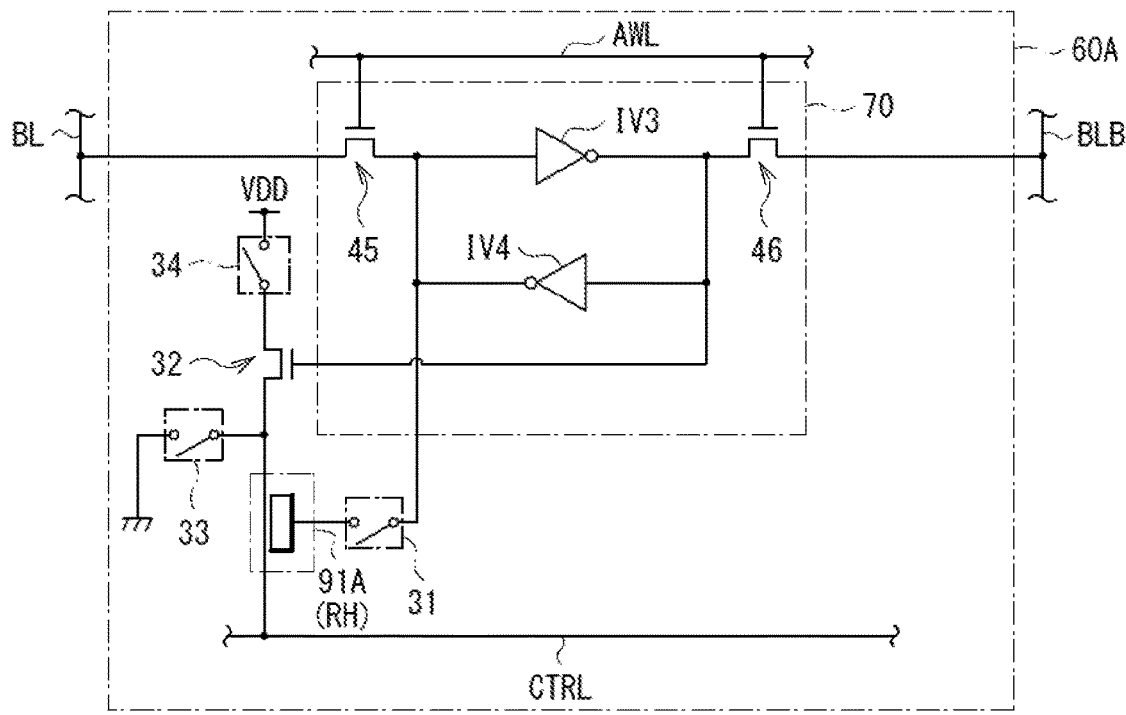

[FIG. 22C]
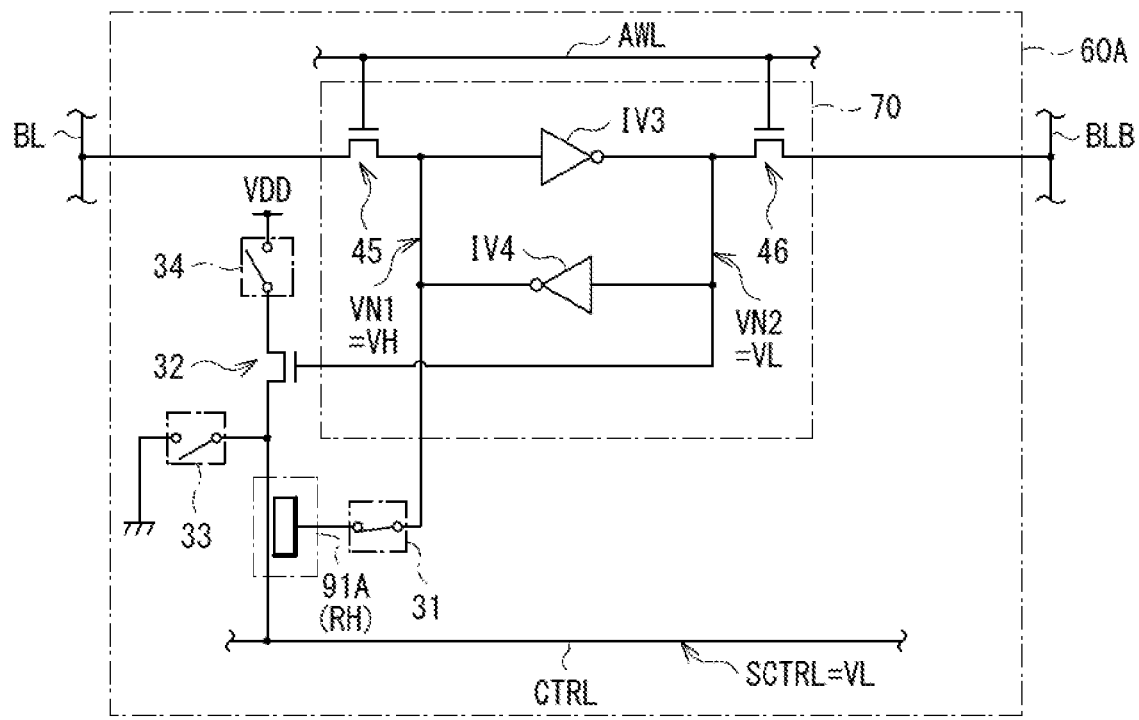
[FIG. 23A]
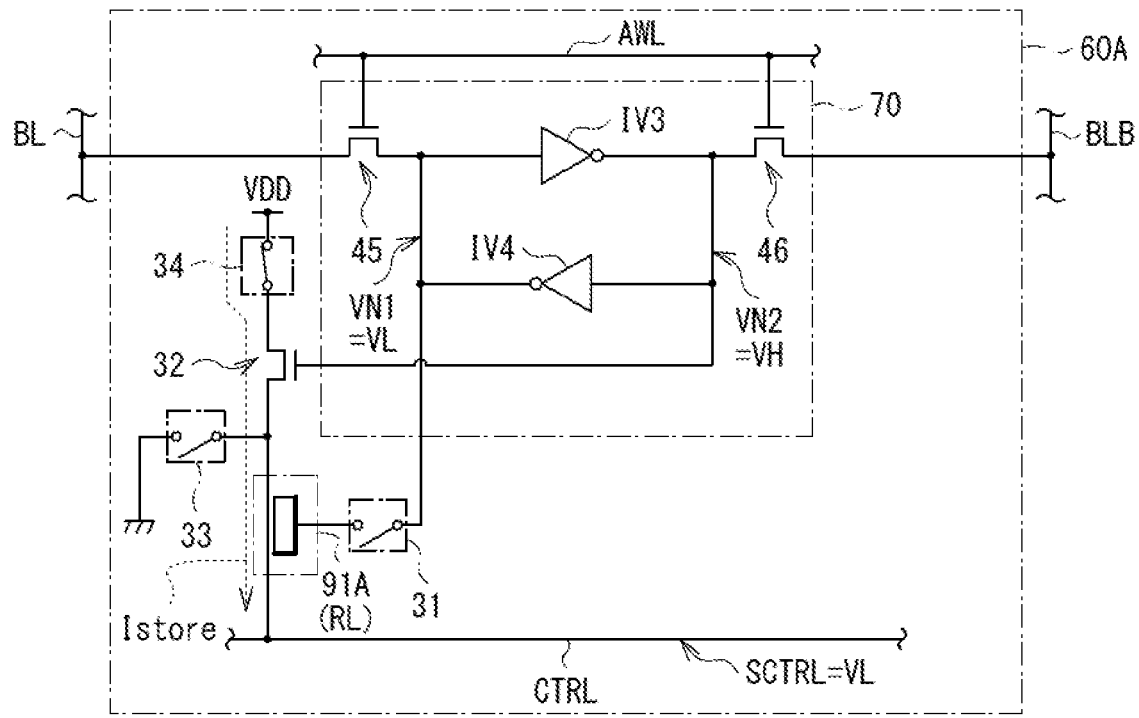

[FIG. 23B]
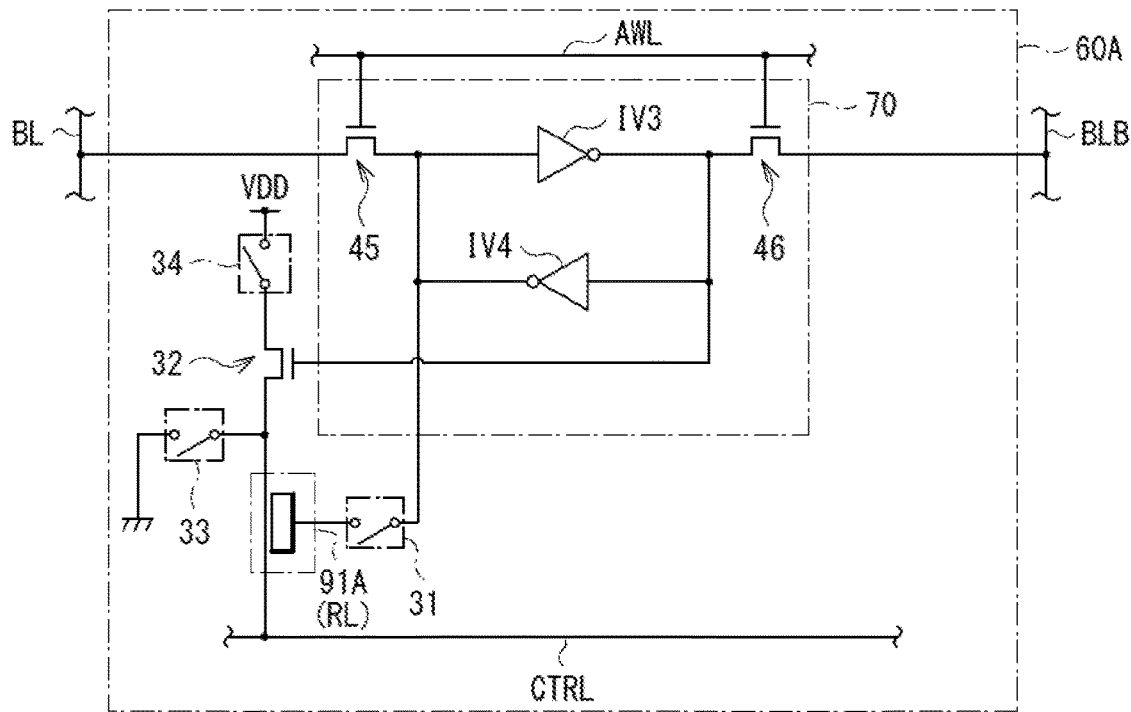
[FIG. 23C]
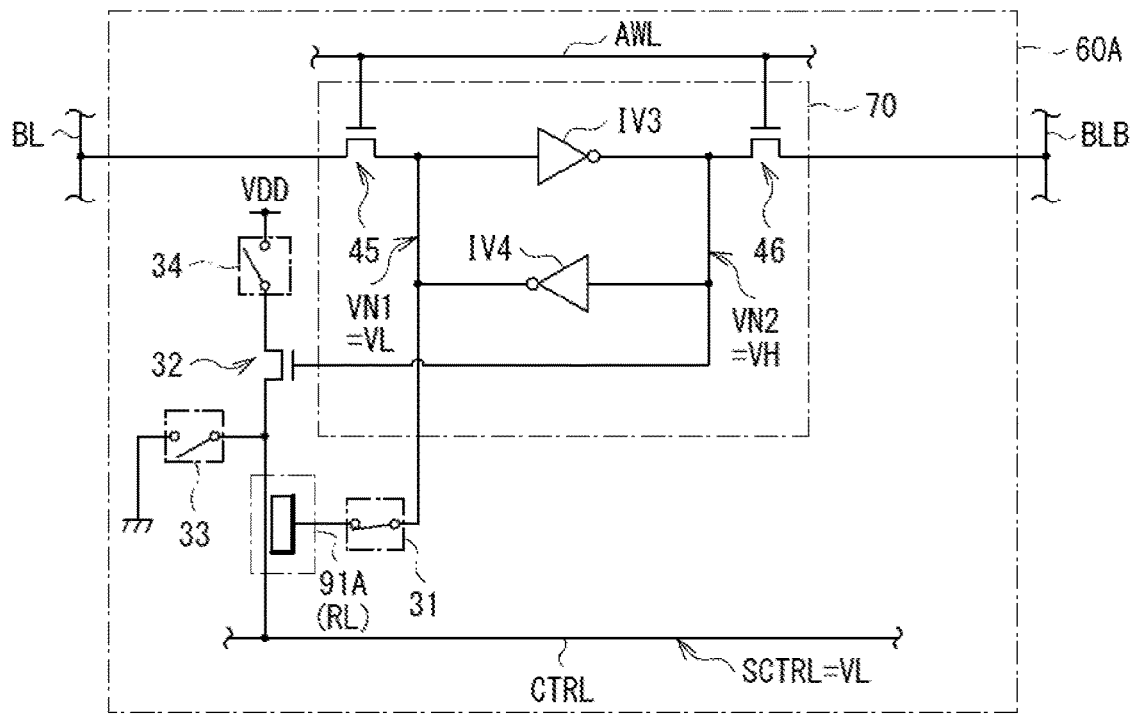

[FIG. 24]
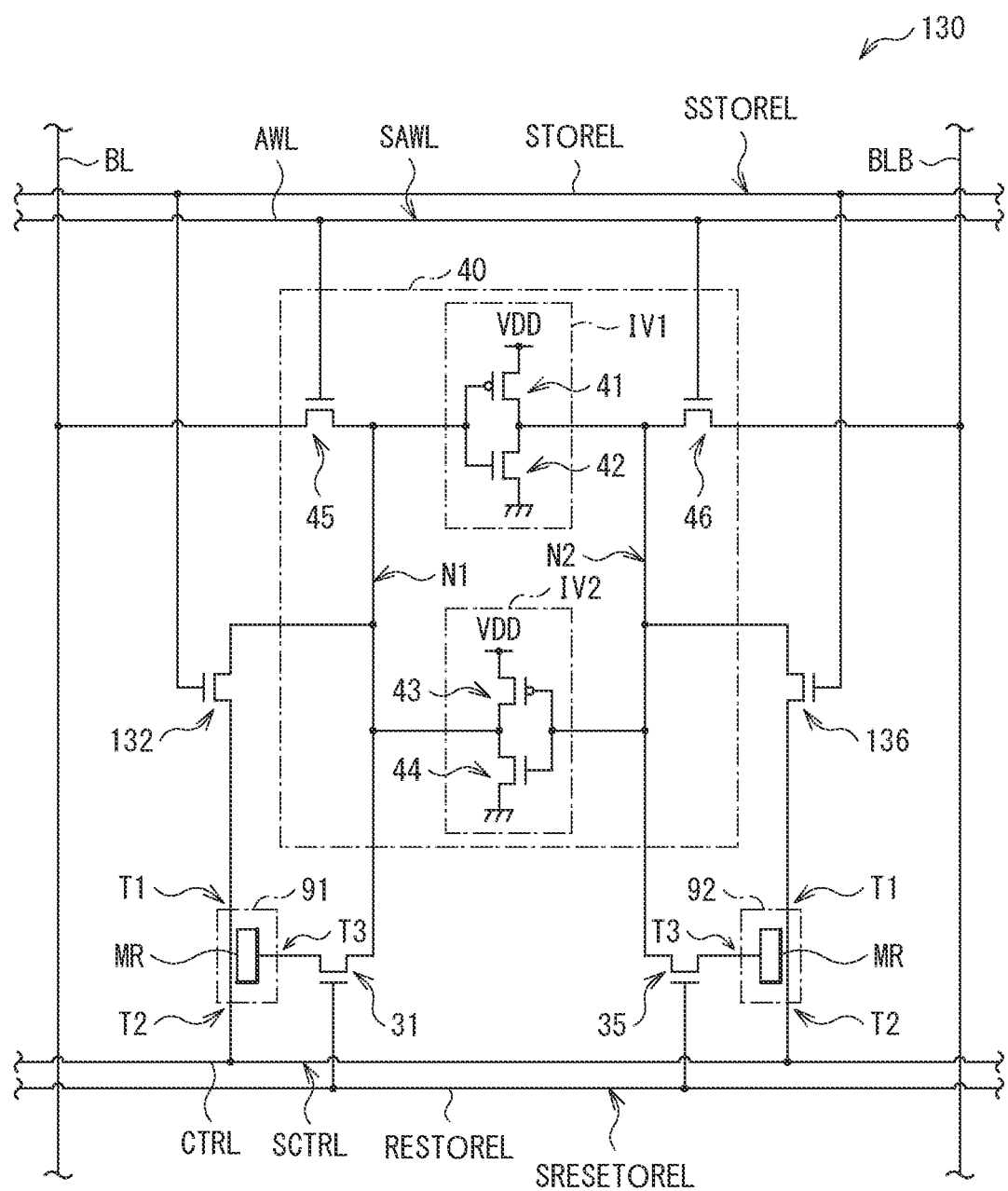

[FIG. 25]
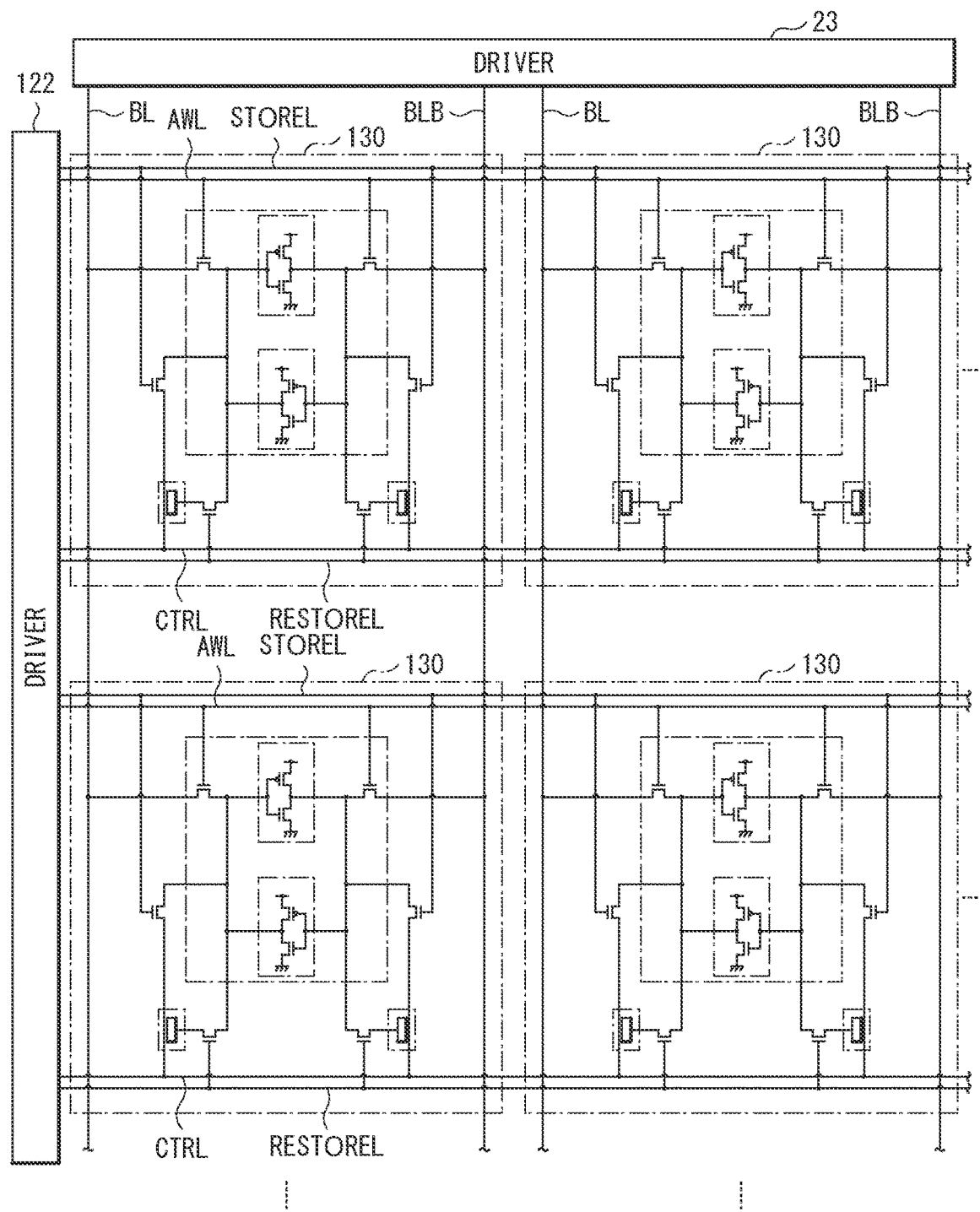

[FIG. 26]
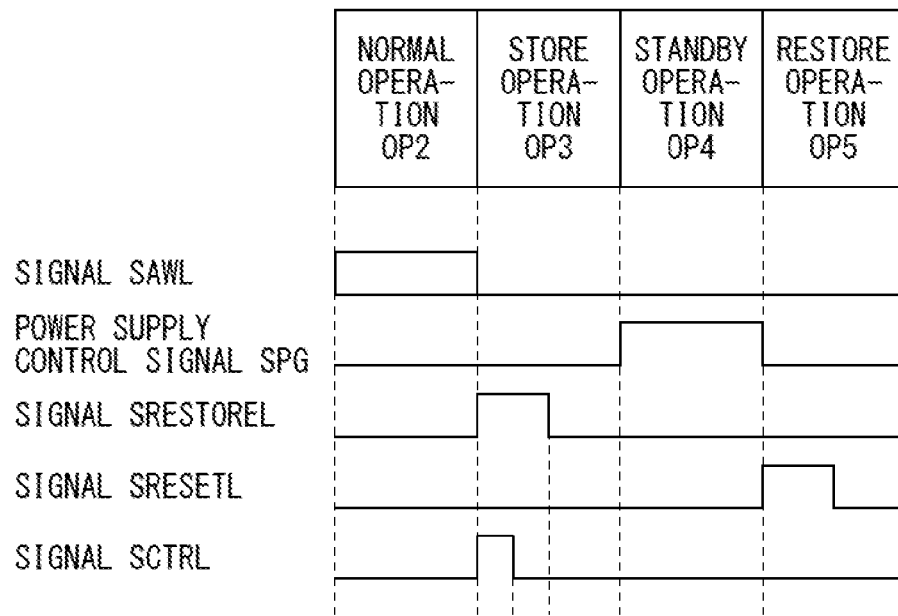
[FIG. 27A]
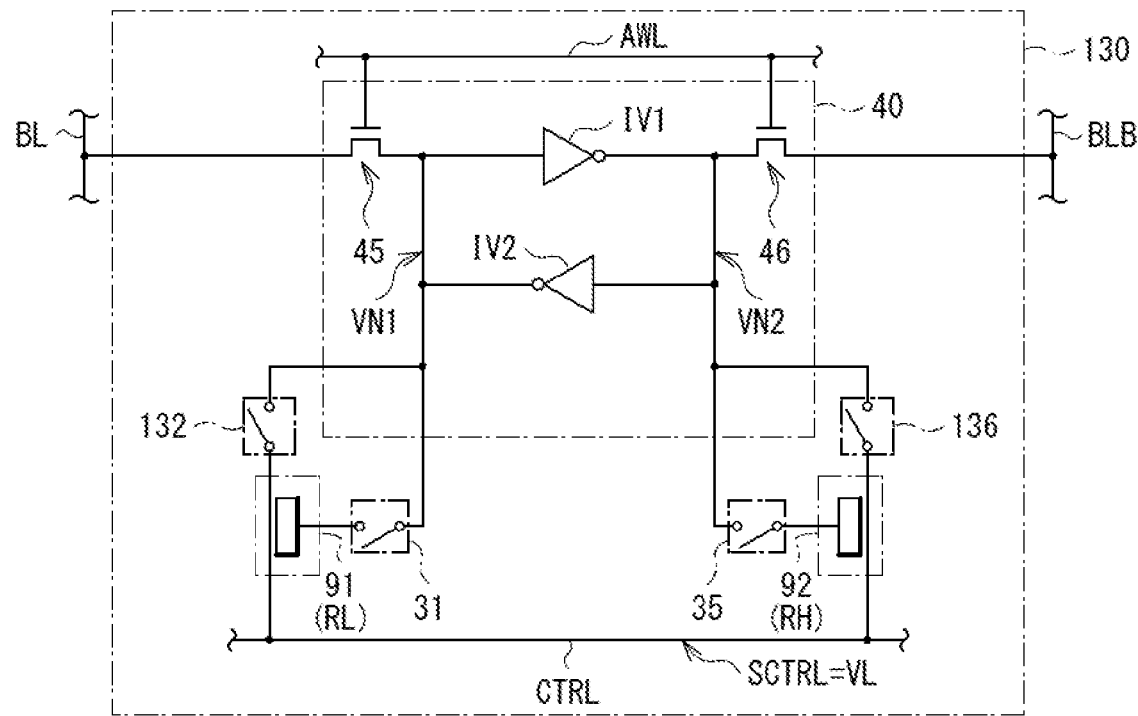

[FIG. 27B]
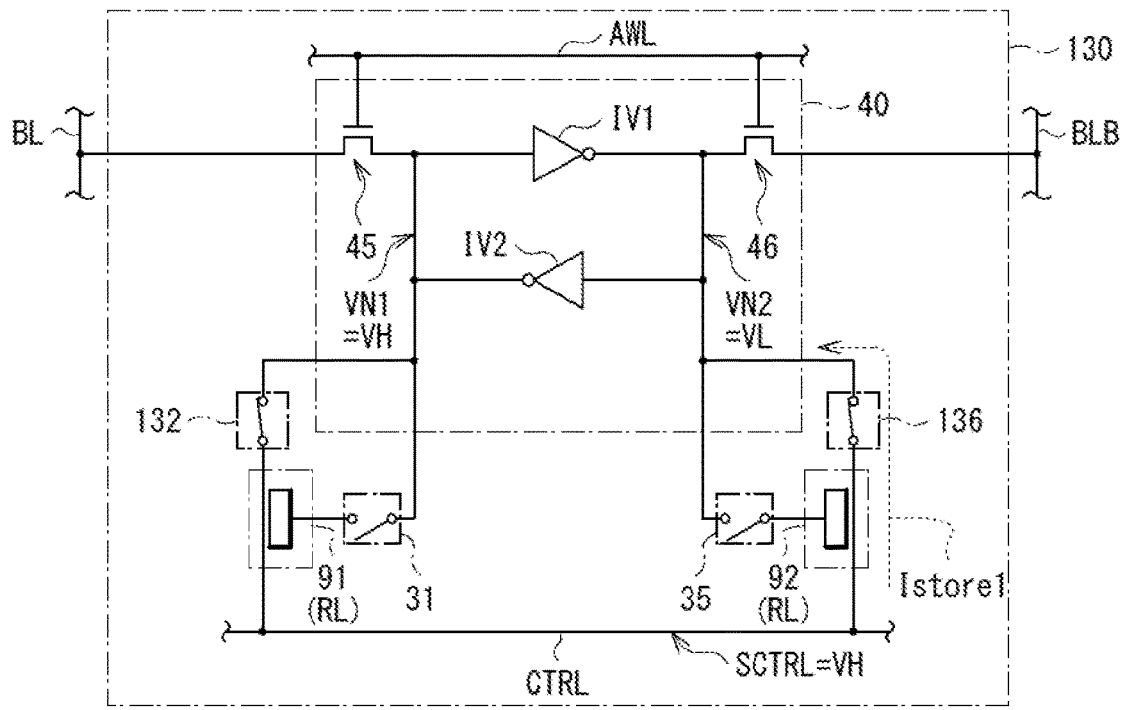
[FIG. 27C]
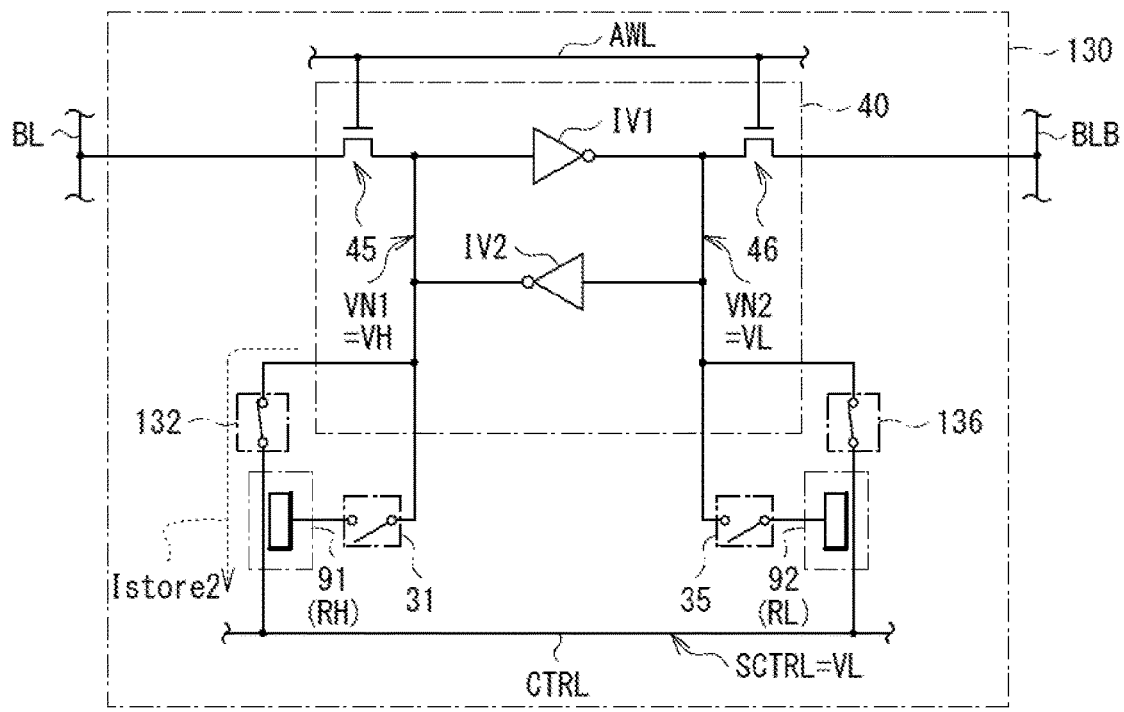

[FIG. 27D]
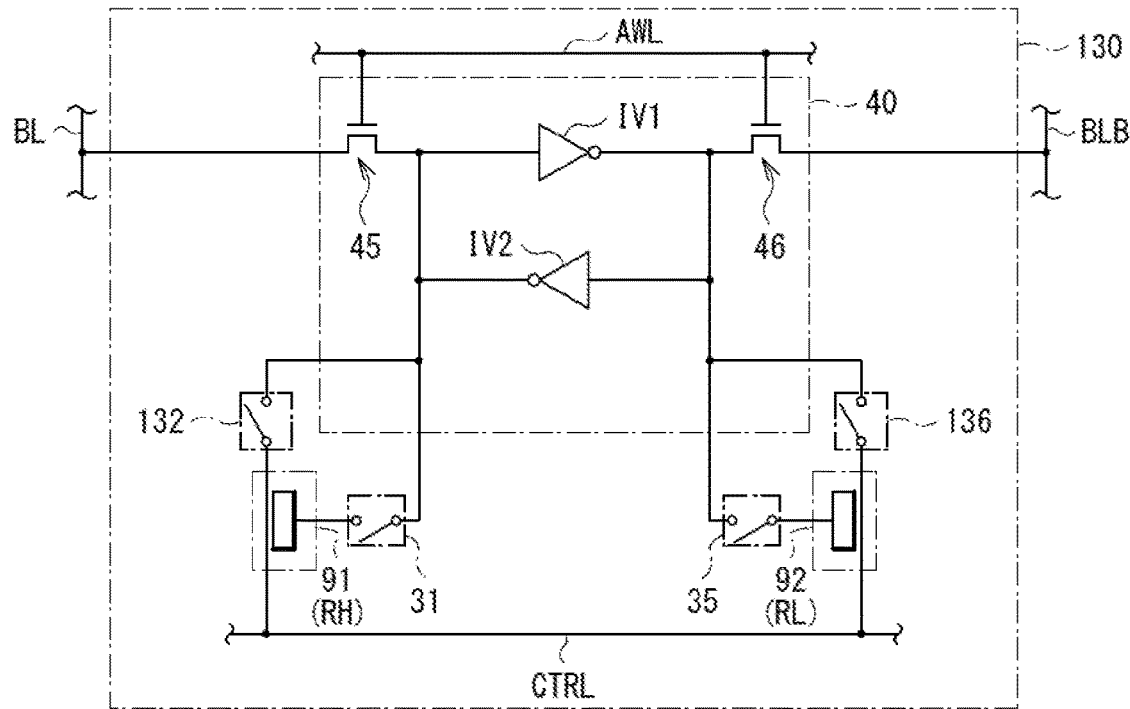
[FIG. 27E]
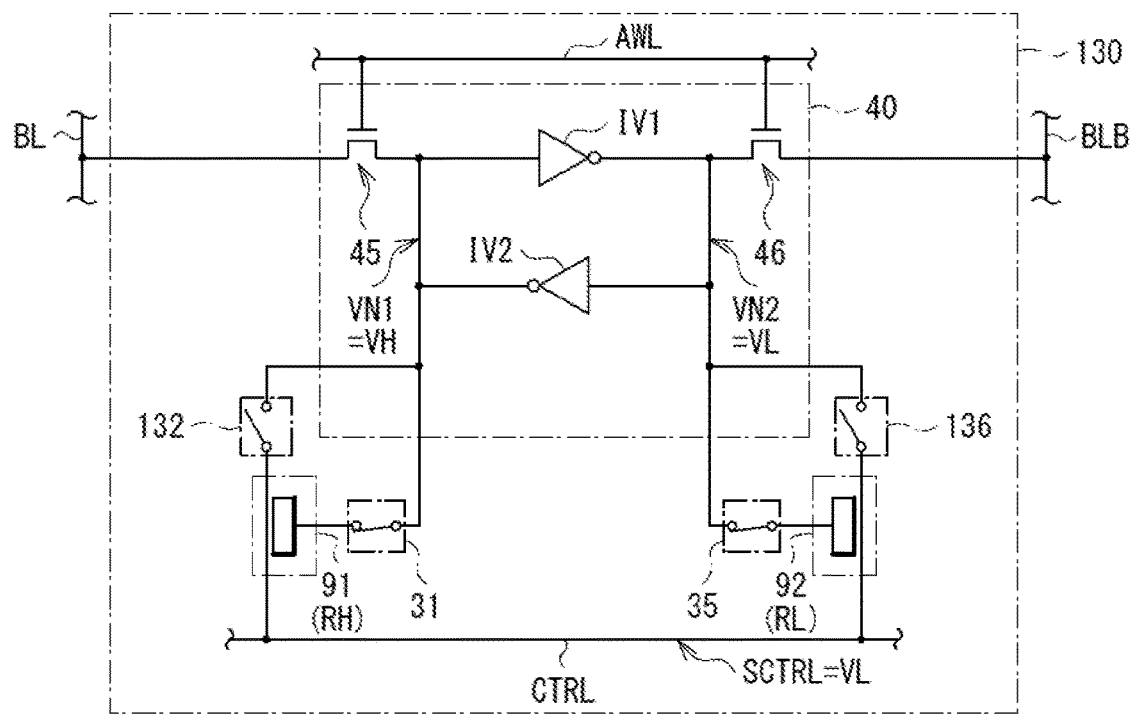

[FIG. 28]
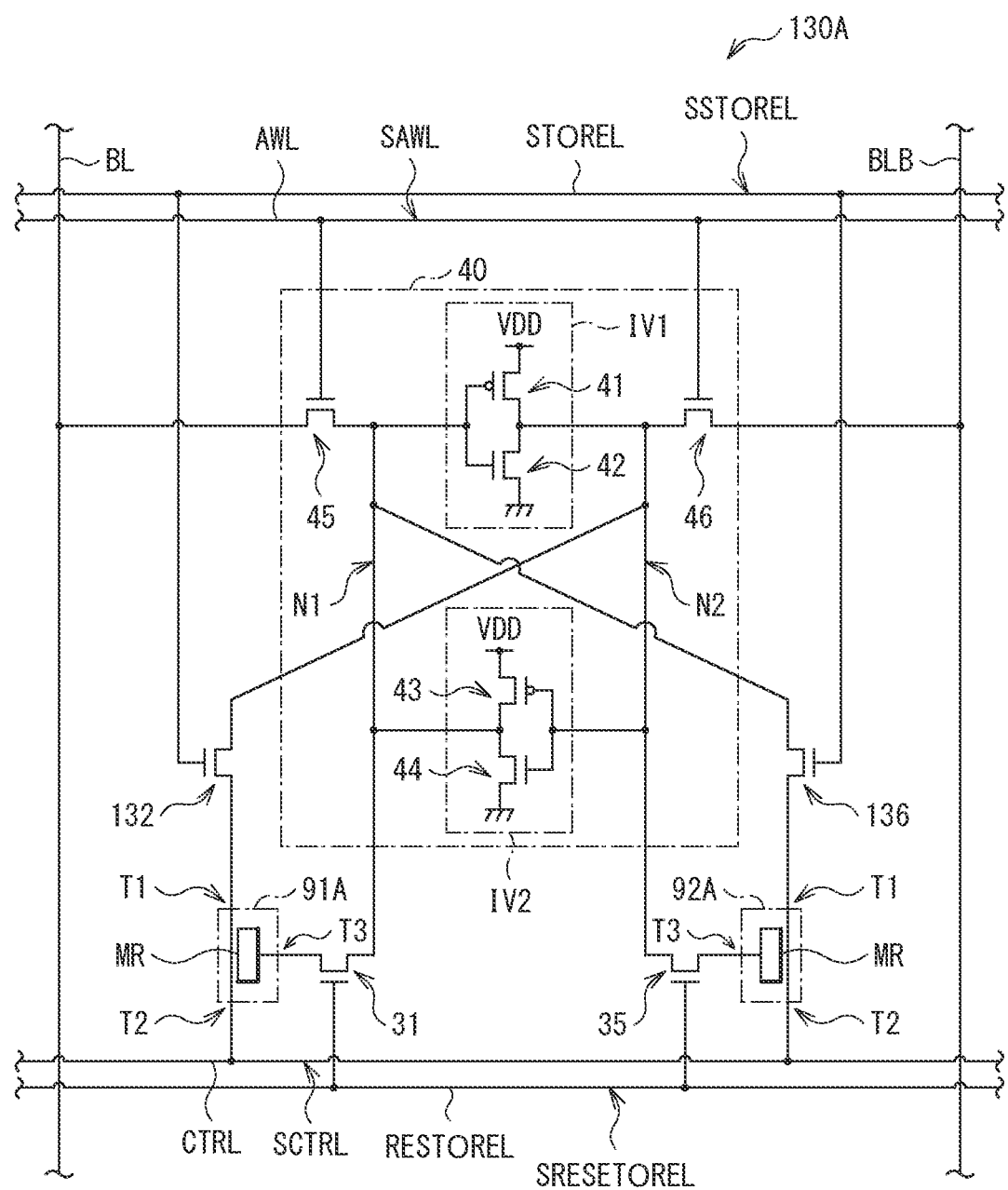

[FIG. 29A]
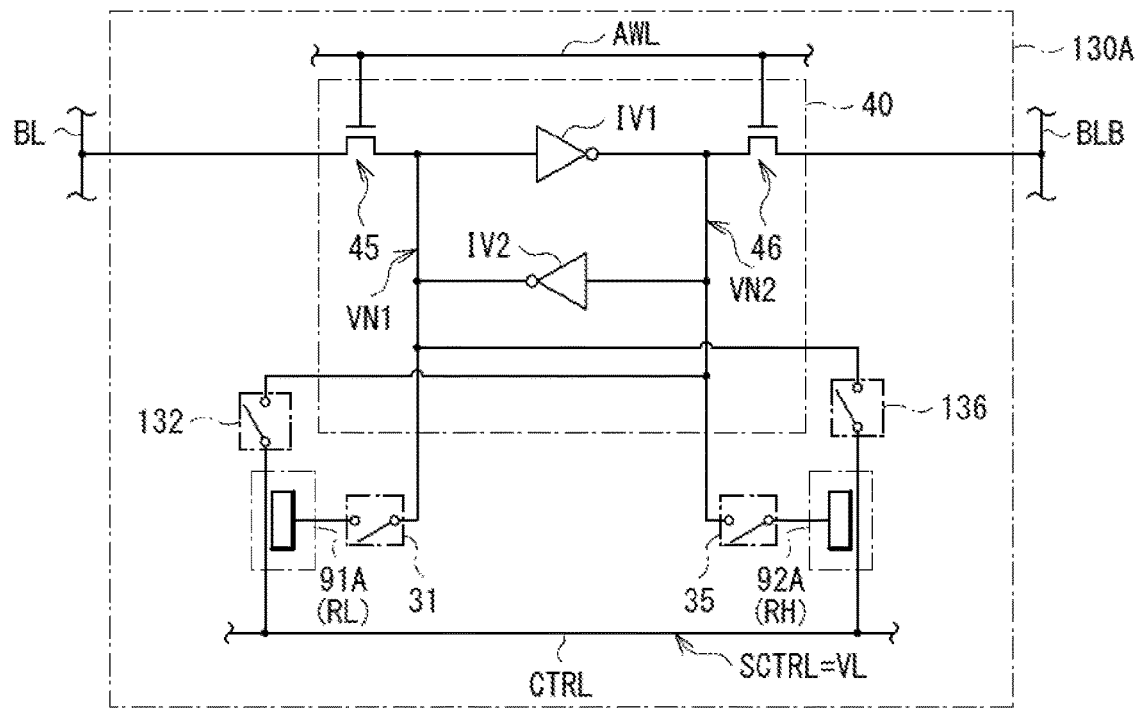
[FIG. 29B]
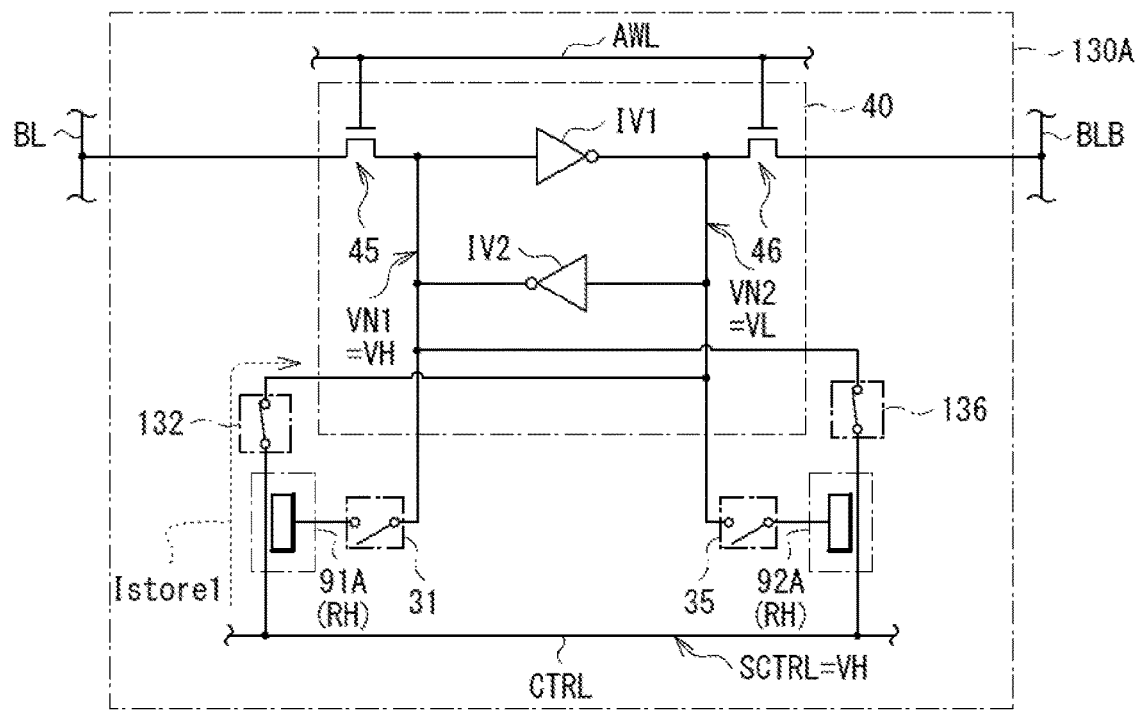

[FIG. 29C]
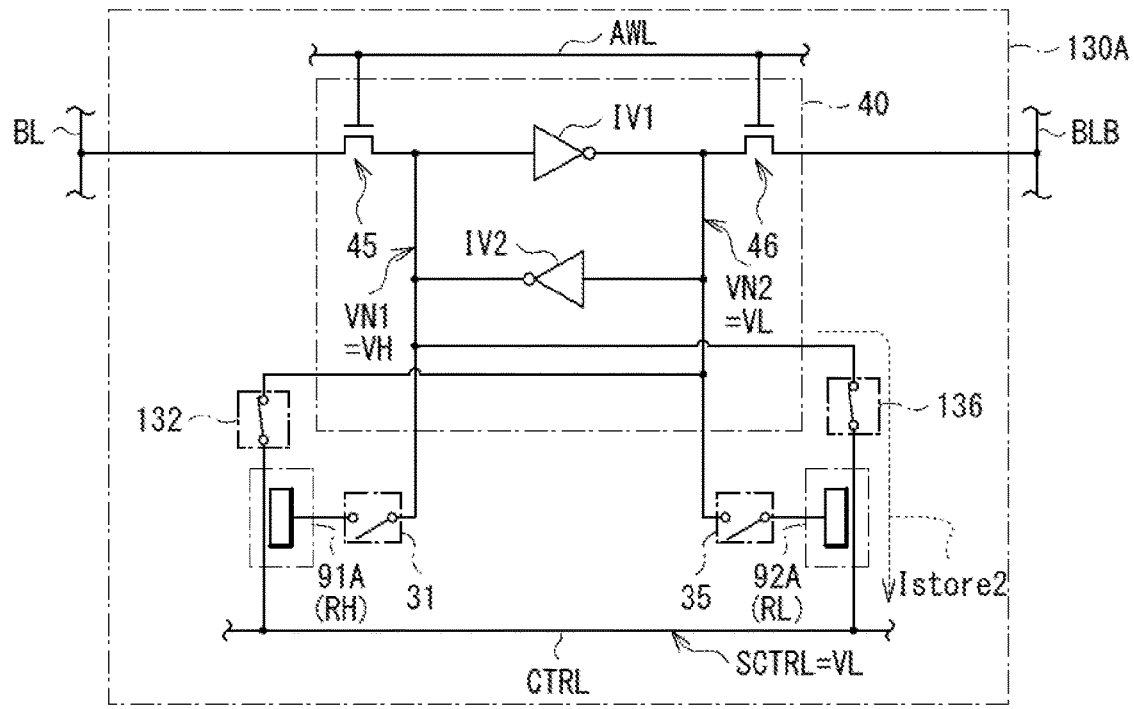
[FIG. 29D]
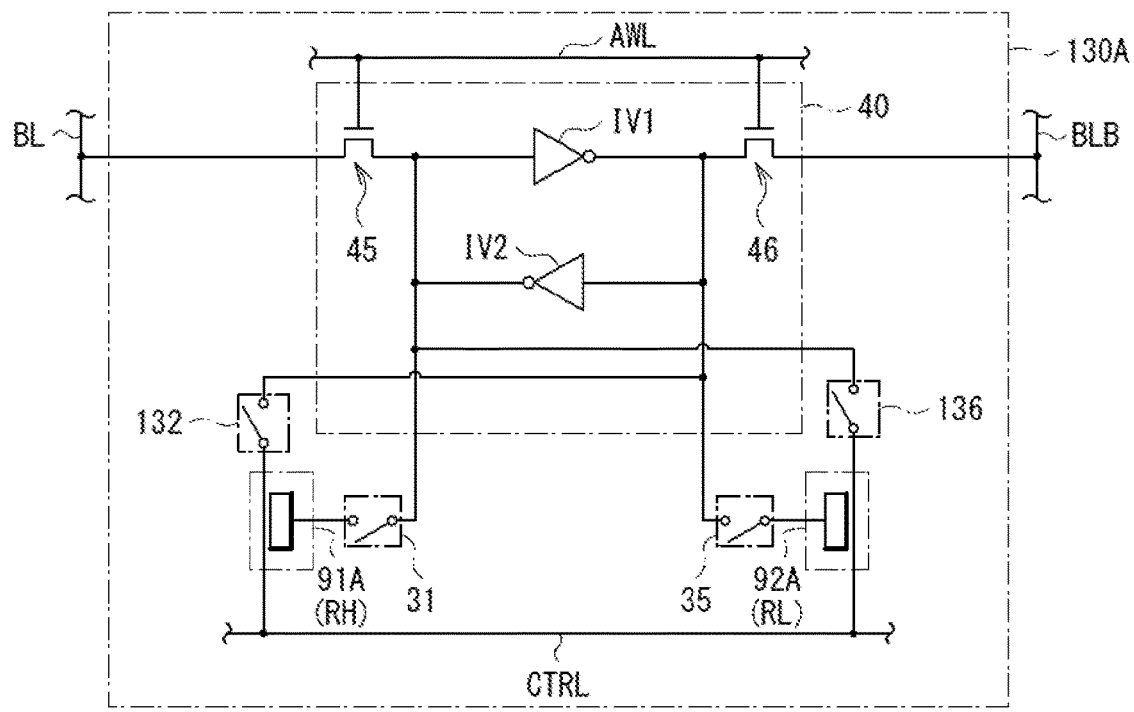

[FIG. 29E]
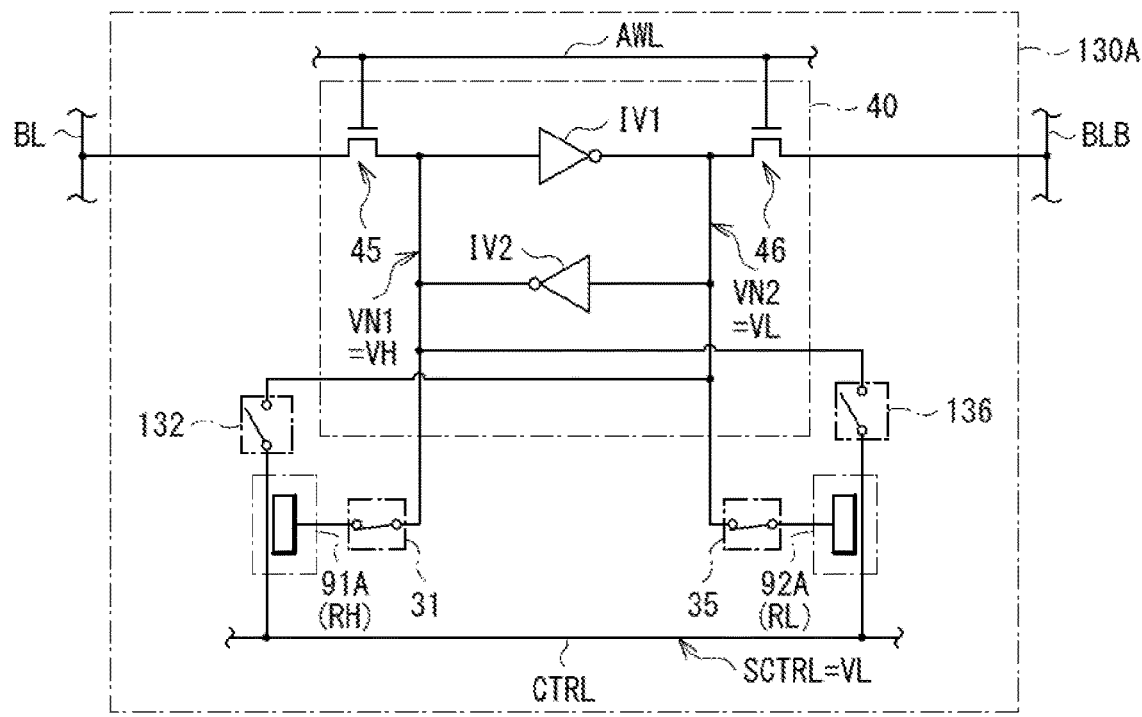

[FIG. 30A]
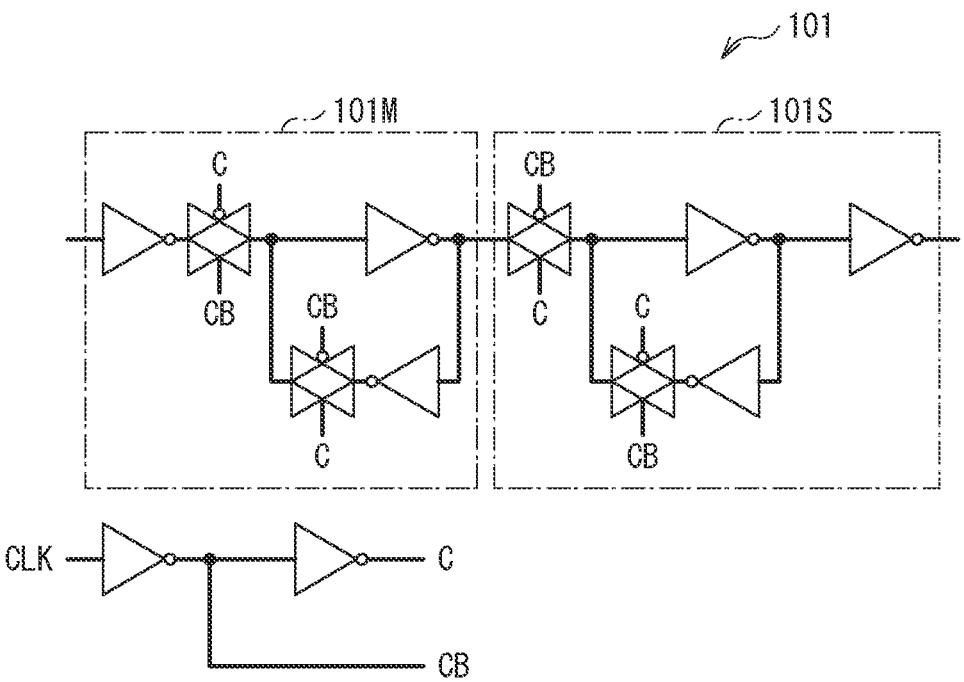
[FIG. 30B]
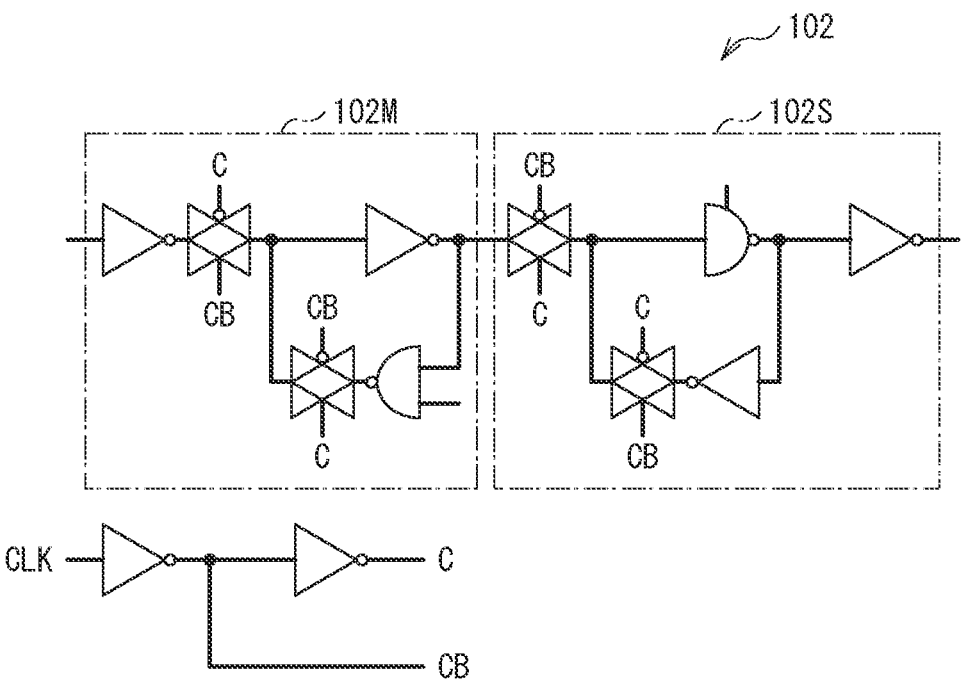

[FIG. 30C]
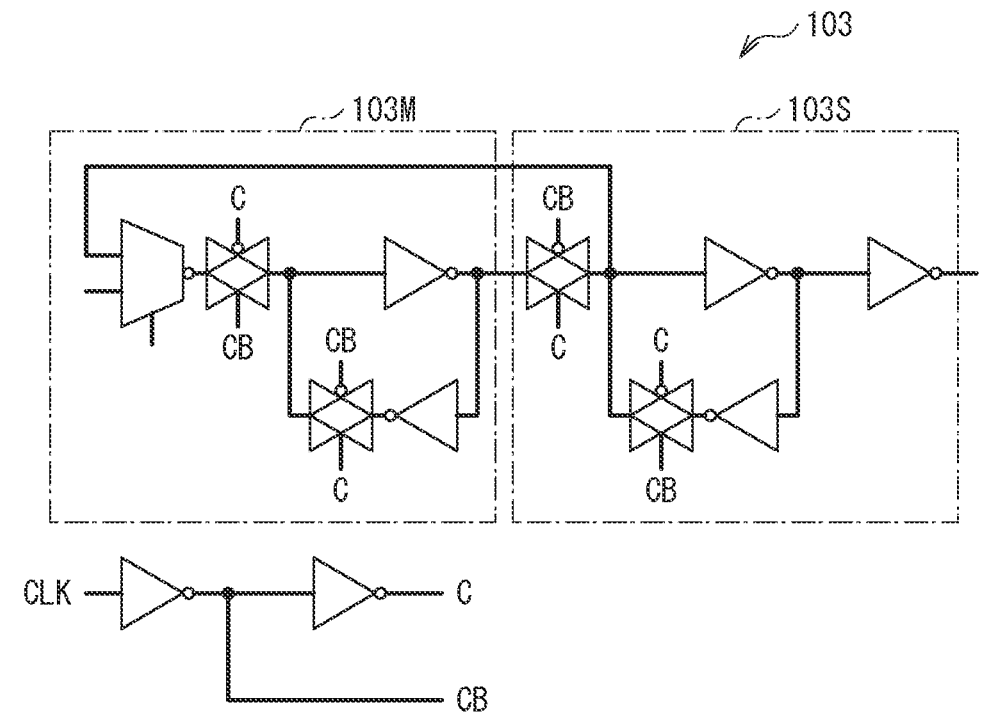
[FIG. 30D]
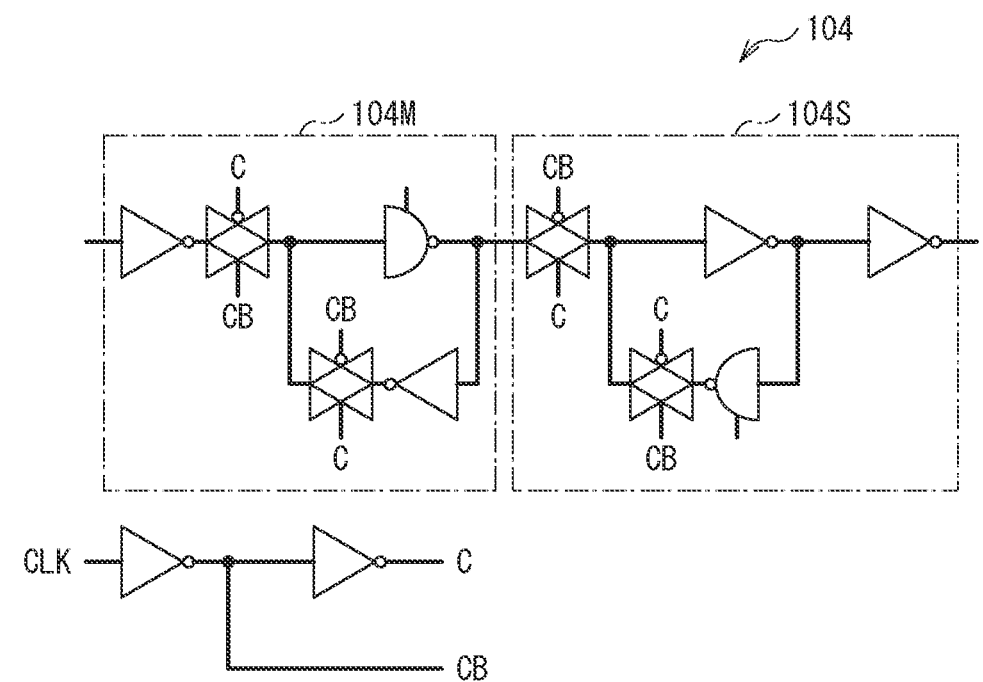

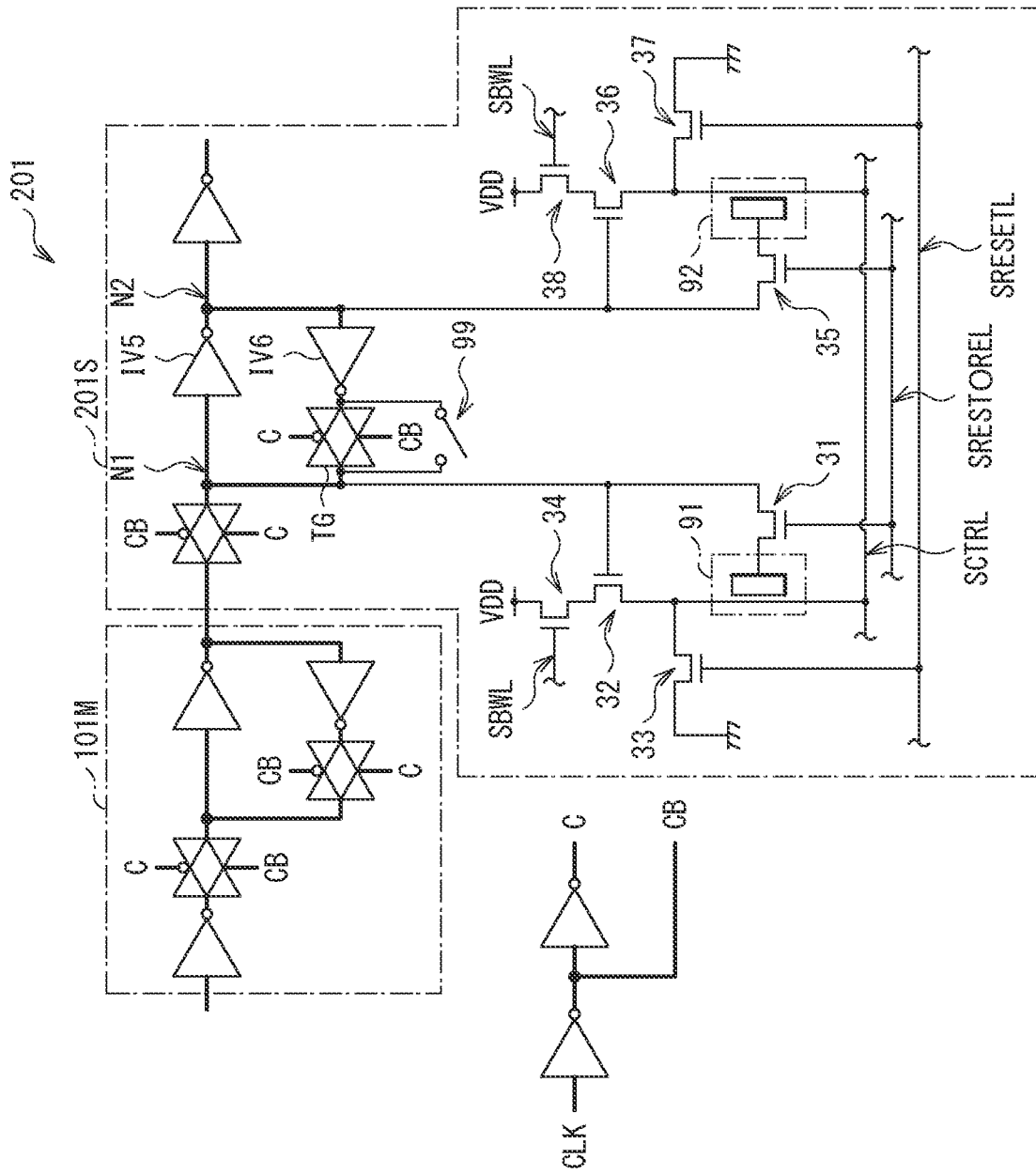
[FIG. 31]

[FIG. 32]
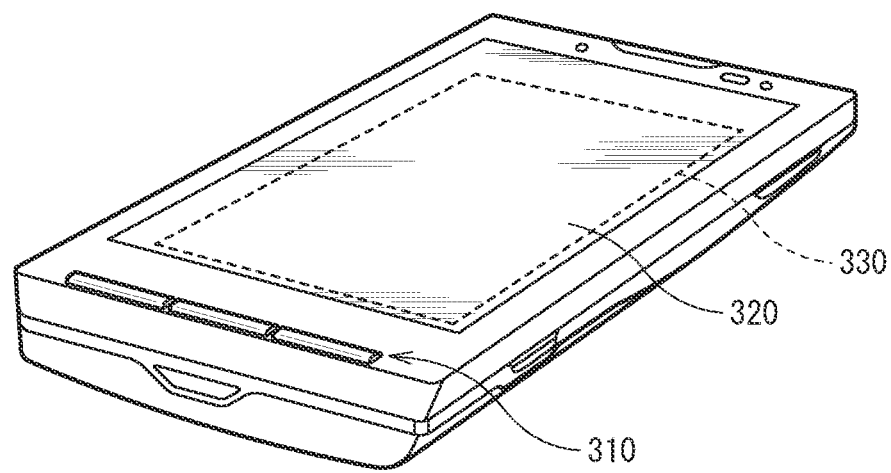

US 11,450,369 B2

SEMICONDUCTOR CIRCUIT AND ELECTRONIC DEVICE FOR STORING INFORMATION

CROSS REFERENCE TO RELATED APPLICATIONS

This application is a U.S. National Phase of International Patent Application No. PCT/JP2019/031403 filed on Aug. 8, 2019, which claims priority benefit of Japanese Patent Application No. JP 2018-158366 filed in the Japan Patent Office on Aug. 27, 2018. Each of the above-referenced applications is hereby incorporated herein by reference in its entirety.

TECHNICAL FIELD

The present disclosure relates to a semiconductor circuit that is able to store information and an electronic device including such a semiconductor circuit.

BACKGROUND ART

Electronic devices are desired to have low power consumption from the viewpoint of ecology. For semiconductor circuits, for example, a so-called power gating technique is often used in which power consumption is reduced by selectively stopping power supply to some of circuits. A circuit the power supply to which is stopped in such a manner is desired to return to an operation state in which the power supply has not yet been stopped, immediately after the power supply is restarted. One method of achieving such a short-time return operation is to incorporate a nonvolatile memory element in the circuit. For example, PTL 1 discloses a circuit in which a SRAM (Static Random Access Memory), which is a volatile memory, and a spin-injection magnetization-reversal type memory element are combined.

CITATION LIST

Patent Literature

PTL 1: International Publication No. WO 2009/028298

SUMMARY OF THE INVENTION

Incidentally, in such a circuit including a memory element, high endurance (reliability) is desired, and further improvement in endurance is expected.

It is desirable to provide a semiconductor circuit and an electronic device that make it possible to enhance endurance.

A semiconductor circuit according to an embodiment of the present disclosure includes: a first circuit, a second circuit, a first memory element, a first transistor, and a second transistor. The first circuit is configured to be able to generate an inverted voltage of a voltage at a first node and apply the inverted voltage to a second node. The second circuit is configured to be able to generate an inverted voltage of a voltage at the second node and apply the inverted voltage to the first node. The first memory element has a first terminal, a second terminal, and a third terminal, and is configured to be able to store information by setting a resistance state between the second terminal and the third terminal to a first resistance state or a second resistance state in accordance with a direction of a first current flowing between the first terminal and the second terminal. The first transistor is configured to be able to couple the first node to the third terminal of the first memory element by being turned on. The second transistor is coupled to a first coupling node that is one of the first node and the second node, and is configured to allow the first current to flow to the second terminal of the first memory element on the basis of a voltage at the first coupling node.

An electronic circuit according to an embodiment of the present disclosure includes: the above-described semiconductor circuit; and a battery that supplies the semiconductor circuit with a power supply voltage.

In the semiconductor circuit and the electronic device according to the embodiments of the present disclosure, the first circuit and the second circuit cause voltages inverted from each other to appear at the first node and the second node. The first node is coupled to the third terminal of the first memory element by turning on the first transistor. The first terminal of the first memory element is supplied with the first current by the second transistor on the basis of the voltage at the first coupling node that is one of the first node and the second node. In the first memory element, the resistance state between the second terminal and the third terminal is set to the first resistance state or the second resistance state in accordance with the direction of the first current flowing between the first terminal and the second terminal.

BRIEF DESCRIPTION OF DRAWINGS

FIG. 1 is a block diagram illustrating a configuration example of a semiconductor circuit according to an embodiment of the present disclosure.

FIG. 2 is a circuit diagram illustrating a configuration example of a memory cell according to a first embodiment.

FIG. 3 is a circuit diagram illustrating a configuration example of a memory cell array including the memory cell illustrated in FIG. 2.

FIG. 4 is an explanatory diagram illustrating an operation example of a memory element illustrated in FIG. 2.

FIG. 5 is a table illustrating an operation example of the memory cell illustrated in FIG. 2.

FIG. 6A is a circuit diagram illustrating an operation example of the memory cell illustrated in FIG. 2.

FIG. 6B is another circuit diagram illustrating an operation example of the memory cell illustrated in FIG. 2.

FIG. 6C is another circuit diagram illustrating an operation example of the memory cell illustrated in FIG. 2.

FIG. 6D is another circuit diagram illustrating an operation example of the memory cell illustrated in FIG. 2.

FIG. 6E is another circuit diagram illustrating an operation example of the memory cell illustrated in FIG. 2.

FIG. 7 is a circuit diagram illustrating a configuration example of a memory cell according to a modification example of the first embodiment.

FIG. 8 is an explanatory diagram illustrating an operation example of a memory element illustrated in FIG. 7.

FIG. 9A is a circuit diagram illustrating an operation example of the memory cell illustrated in FIG. 7.

FIG. 9B is another circuit diagram illustrating an operation example of the memory cell illustrated in FIG. 7.

FIG. 9C is another circuit diagram illustrating an operation example of the memory cell illustrated in FIG. 7.

FIG. 9D is another circuit diagram illustrating an operation example of the memory cell illustrated in FIG. 7.

FIG. 9E is another circuit diagram illustrating an operation example of the memory cell illustrated in FIG. 7.

FIG. 10 is a block diagram illustrating a configuration example of a semiconductor circuit according to a modification example.

FIG. 11 is a block diagram illustrating a configuration example of a semiconductor circuit according to another modification example.

FIG. 12 is a circuit diagram illustrating a configuration example of a memory cell according to another modification example of the first embodiment.

FIG. 13 is a table illustrating an operation example of the memory cell illustrated in FIG. 12.

FIG. 14A is a circuit diagram illustrating an operation example of the memory cell illustrated in FIG. 7.

FIG. 14B is another circuit diagram illustrating an operation example of the memory cell illustrated in FIG. 7.

FIG. 14C is another circuit diagram illustrating an operation example of the memory cell illustrated in FIG. 7.

FIG. 14D is another circuit diagram illustrating an operation example of the memory cell illustrated in FIG. 7.

FIG. 14E is another circuit diagram illustrating an operation example of the memory cell illustrated in FIG. 7.

FIG. 15 is a circuit diagram illustrating a configuration example of a memory cell according to a second embodiment.

FIG. 16 is a circuit diagram illustrating a configuration example of a memory cell array including the memory cell illustrated in FIG. 15.

FIG. 17A is a circuit diagram illustrating an operation example of the memory cell illustrated in FIG. 15.

FIG. 17B is another circuit diagram illustrating an operation example of the memory cell illustrated in FIG. 15.

FIG. 18A is another circuit diagram illustrating an operation example of the memory cell illustrated in FIG. 15.

FIG. 18B is another circuit diagram illustrating an operation example of the memory cell illustrated in FIG. 15.

FIG. 18C is another circuit diagram illustrating an operation example of the memory cell illustrated in FIG. 15.

FIG. 19A is another circuit diagram illustrating an operation example of the memory cell illustrated in FIG. 15.

FIG. 19B is another circuit diagram illustrating an operation example of the memory cell illustrated in FIG. 15.

FIG. 19C is another circuit diagram illustrating an operation example of the memory cell illustrated in FIG. 15.

FIG. 20 is a circuit diagram illustrating a configuration example of a memory cell according to a modification example of the second embodiment.

FIG. 21A is a circuit diagram illustrating an operation example of the memory cell illustrated in FIG. 20.

FIG. 21B is another circuit diagram illustrating an operation example of the memory cell illustrated in FIG. 20.

FIG. 22A is another circuit diagram illustrating an operation example of the memory cell illustrated in FIG. 20.

FIG. 22B is another circuit diagram illustrating an operation example of the memory cell illustrated in FIG. 20.

FIG. 22C is another circuit diagram illustrating an operation example of the memory cell illustrated in FIG. 20.

FIG. 23A is another circuit diagram illustrating an operation example of the memory cell illustrated in FIG. 20.

FIG. 23B is another circuit diagram illustrating an operation example of the memory cell illustrated in FIG. 20.

FIG. 23C is another circuit diagram illustrating an operation example of the memory cell illustrated in FIG. 20.

FIG. 24 is a circuit diagram illustrating a configuration example of a memory cell according to a third embodiment.

FIG. 25 is a circuit diagram illustrating a configuration example of a memory cell array including the memory cell illustrated in FIG. 24.

FIG. 26 is a table illustrating an operation example of the memory cell illustrated in FIG. 24.

FIG. 27A is a circuit diagram illustrating an operation example of the memory cell illustrated in FIG. 24.

FIG. 27B is another circuit diagram illustrating an operation example of the memory cell illustrated in FIG. 24.

FIG. 27C is another circuit diagram illustrating an operation example of the memory cell illustrated in FIG. 24.

FIG. 27D is another circuit diagram illustrating an operation example of the memory cell illustrated in FIG. 24.

FIG. 27E is another circuit diagram illustrating an operation example of the memory cell illustrated in FIG. 24.

FIG. 28 is a circuit diagram illustrating a configuration example of a memory cell according to a modification example of the third embodiment.

FIG. 29A is a circuit diagram illustrating an operation example of the memory cell illustrated in FIG. 28.

FIG. 29B is another circuit diagram illustrating an operation example of the memory cell illustrated in FIG. 28.

FIG. 29C is another circuit diagram illustrating an operation example of the memory cell illustrated in FIG. 28.

FIG. 29D is another circuit diagram illustrating an operation example of the memory cell illustrated in FIG. 28.

FIG. 29E is another circuit diagram illustrating an operation example of the memory cell illustrated in FIG. 28.

FIG. 30A is a circuit diagram illustrating a configuration example of a flip-flop circuit.

FIG. 30B is a circuit diagram illustrating another configuration example of the flip-flop circuit.

FIG. 30C is a circuit diagram illustrating another configuration example of the flip-flop circuit.

FIG. 30D is a circuit diagram illustrating another configuration example of the flip-flop circuit.

FIG. 31 is a circuit diagram illustrating a configuration example of a flip-flop circuit according to an applied embodiment.

FIG. 32 is a perspective view of a configuration of an appearance of a smartphone to which the embodiment is applied.

MODES FOR CARRYING OUT THE INVENTION

Hereinafter, some embodiments of the present disclosure are described in detail with reference to the drawings. It is to be noted that description is given in the following order.
1. First Embodiment
2. Second Embodiment
3. Third Embodiment
4. Applied Example and Example of Application 1. First Embodiment Configuration Example FIG. 1 illustrates a configuration example of a semiconductor circuit (a semiconductor circuit 1) according to an embodiment. The semiconductor circuit 1 is configured to be able to store information. The semiconductor circuit 1 includes a controller 11, a power supply transistor 12, and a memory circuit 20.

The controller 11 is configured to control an operation of the memory circuit 20. Specifically, the controller 11 writes information to the memory circuit 20 on the basis of a write command and write data supplied from the outside, and reads information from the memory circuit 20 on the basis of a read command supplied from the outside. In addition, the controller 11 also has a function of controlling power supply to the memory circuit 20 by supplying the power supply transistor 12 with a power supply control signal SPG to turn on and off the power supply transistor 12.

The power supply transistor 12 is a P-type MOS (Metal Oxide Semiconductor) transistor, and has a gate supplied with the power supply control signal SPG, a source supplied with a power supply voltage VDD1, and a drain coupled to the memory circuit 20.

With this configuration, in the semiconductor circuit 1, the power supply transistor 12 is turned on, and the memory circuit 20 is supplied with the power supply voltage VDD1 as a power supply voltage VDD in a case where the memory circuit 20 is used. In addition, in the semiconductor circuit 1, the power supply transistor 12 is turned off in a case where the memory circuit 20 is not used. In the semiconductor circuit 1, it is possible to reduce power consumption by such so-called power gating.

The memory circuit 20 is configured to store data. The memory circuit 20 includes a memory cell array 21 and drivers 22 and 23.

The memory cell array 21 includes a plurality of memory cells 30 arranged in a matrix.

FIG. 2 illustrates a configuration example of the memory cell 30 in the memory cell array 21. FIG. 3 illustrates a configuration example of the memory cell array 21. FIG. 3 also illustrates the drivers 22 and 23 in addition to the memory cell array 21. The memory cell array 21 includes a plurality of word lines AWL, a plurality of control lines BWL, a plurality of bit lines BL, a plurality of bit lines BLB, a plurality of control lines CTRL, a plurality of restore control lines RESTOREL, and a plurality of reset control lines RESETL. The word lines AWL extend in a horizontal direction in FIGS. 2 and 3. One end of each of the word lines WL is coupled to the driver 22. A signal SAWL is applied to this word line WL by the driver 22. The control lines BWL extend in the horizontal direction in FIGS. 2 and 3. One end of each of the control lines BWL is coupled to the driver 22. A signal SBWL is applied to this control line BWL by the driver 22. The bit lines BL extend in a vertical direction in FIGS. 2 and 3. One end of each of the bit lines BL is coupled to the driver 23. The bit lines BLB extend in the vertical direction in FIGS. 2 and 3. One end of each of the bit lines BLB is coupled to the driver 23. The control lines CTRL extend in the horizontal direction in FIGS. 2 and 3. One end of each of the control lines CTRL is coupled to the driver 22. A signal SCTRL is applied to this control line CTRL by the driver 22. The restore control lines RESTOREL extend in the horizontal direction in FIGS. 2 and 3. One end of each of the restore control lines RESTOREL is coupled to the driver 22. A signal SRESTOREL is applied to this restore control line RESTOREL by the driver 22. The reset control lines RESETL extend in the horizontal direction in FIGS. 2 and 3. One end of each of the reset control lines RESETL is coupled to the driver 22. A signal SRESETL is applied to this reset control line RESETL by the driver 22.

The memory cell 30 includes an SRAM (Static Random Access Memory) circuit 40, transistors 31 to 38, and memory elements 91 and 92.

The SRAM circuit 40 is configured to store one-bit information by positive feedback. The SRAM circuit 40 includes transistors 41 to 46. The transistors 41 and 43 are P-type MOS transistors, and the transistors 42, 44, 45, and 46 are N-type MOS transistors.

The transistor 41 has a gate coupled to a node N1, a source supplied with the power supply voltage VDD, and a drain coupled to a node N2. The transistor 42 has a gate coupled to the node N1, a source grounded, and a drain coupled to the node N2. The transistors 41 and 42 are included in an inverter IV1. The inverter IV1 is configured to invert a voltage VN1 at the node N1 and output a result of the inversion to the node N2. The transistor 43 has a gate coupled to the node N2, a source supplied with the power supply voltage VDD, and a drain coupled to the node N1. The transistor 44 has a gate coupled to the node N2, a source grounded, and a drain coupled to the node N1. The transistors 43 and 44 are included in an inverter IV2. The inverter IV2 is configured to invert a voltage VN2 at the node N2 and output a result of the inversion to the node N1. The transistor 45 has a gate coupled to the word line AWL, a source coupled to the bit line BL, and a drain coupled to the node N1. The transistor 46 has a gate coupled to the word line AWL, a source coupled to the bit line BLB, and a drain coupled to the node N2.

With this configuration, an input terminal of the inverter IV1 and an output terminal of the inverter IV2 are coupled to each other via the node N1, and an input terminal of the inverter IV2 and an output terminal of the inverter IV1 are coupled to each other via the node N2. This causes the SRAM circuit 40 to store one-bit information by positive feedback. Turning on the transistors 45 and 46 then causes information to be written to the SRAM circuit 40 via the bit lines BL and BLB, or causes information to be read from the SRAM circuit 40.

The transistors 31 to 38 are N-type MOS transistors. The transistor 31 has a gate coupled to the restore control line RESTOREL, a drain coupled to the node N1, and a source coupled to a terminal T3 of the memory element 91. The transistor 32 has a gate coupled to the node N1, a drain coupled to a source of the transistor 34, and a source coupled to a terminal T1 of the memory element 91 and a drain of the transistor 33. The transistor 33 has a gate coupled to the reset control line RESETL, the drain coupled to the terminal T1 of the memory element 91 and the source of the transistor 32, and a source grounded. The transistor 34 has a gate coupled to the control line BWL, a drain supplied with the power supply voltage VDD, and the source coupled to the drain of the transistor 32.

The transistor 35 has a gate coupled to the restore control line RESTOREL, a drain coupled to the node N2, and a source coupled to a terminal T3 of the memory element 92. The transistor 36 has a gate coupled to the node N2, a drain coupled to a source of the transistor 38, and a source coupled to a terminal T1 of the memory element 92 and a drain of the transistor 37. The transistor 37 has a gate coupled to the reset control line RESETL, the drain coupled to the terminal T1 of the memory element 92 and the source of the transistor 36, and a source grounded. The transistor 38 has a gate coupled to the control line BWL, a drain supplied with the power supply voltage VDD, and the source coupled to the drain of the transistor 36.

The memory elements 91 and 92 are nonvolatile memory elements, and are, in this example, SOT type memory elements that are able to store information by changing a resistance state with use of spin orbit torque (SOT: Spin Orbit Torque).

The memory element 91 has the terminal T1, a terminal T2, the terminal T3, and a magnetoresistive element MR including a plurality of magnetic layers. The memory element 91 has the terminal T1 coupled to the source of the transistor 32 and the drain of the transistor 33, the terminal T2 coupled to the control line CTRL, and the terminal T3 coupled to the source of the transistor 31. A wiring line between the terminal T1 and the terminal T2 is disposed adjacent to the magnetoresistive element MR. The memory element 91 is configured to store information by setting a state (a resistance state) of a resistance value between the terminal T2 and the terminal T3 to a high resistance state RH or a low resistance state RL in accordance with a direction of a current flowing between the terminal T1 and the terminal T2. The high resistance state RH is a state in which the resistance value between the terminal T2 and the terminal T3 is high, and the low resistance state RL is a state in which the resistance value between the terminal T2 and the terminal T3 is low. In the memory element 91, a current is not directly passed through the magnetoresistive element MR, but is passed through the wiring line adjacent to the magnetoresistive element MR, which makes it possible to set a state of a resistance value in the magnetoresistive element MR.

FIG. 4 schematically illustrates an operation example of the memory element 91. In the memory element 91, the resistance state between the terminal T2 and the terminal T3 is set to the low resistance state RL by a predetermined current flowing from the terminal T2 to the terminal T1. In addition, in the memory element 91, the resistance state between the terminal T2 and the terminal T3 is set to the high resistance state RH by a predetermined current flowing from the terminal T1 to the terminal T2.

The memory element 92 has the terminal T1, a terminal T2, the terminal T3, and a magnetoresistive element MR including a plurality of magnetic layers, similarly to the memory element 91. The memory element 92 has the terminal T1 coupled to the source of the transistor 36 and the drain of the transistor 37, the terminal T2 coupled to the control line CTRL, and the terminal T3 coupled to the source of the transistor 35. The memory element 92 is configured to store information by setting a state (a resistance state) of a resistance value between the terminal T2 and the terminal T3 to the high resistance state RH or the low resistance state RL in accordance with a direction of a current flowing between the terminal T1 and the terminal T2, similarly to the memory element 91 (FIG. 4). Specifically, in the memory element 92, similarly to the memory element 91, the resistance state between the terminal T2 and the terminal T3 is set to the low resistance state RL by a predetermined current flowing from the terminal T2 to the terminal T1, and the resistance state between the terminal T2 and the terminal T3 is set to the high resistance state RH by a predetermined current flowing from the terminal T1 to the terminal T2.

In such a manner, the memory cell 30 includes the transistors 31 to 38 and the memory elements 91 and 92 in addition to the SRAM circuit 40. Accordingly, for example, in a case where the power supply transistor 12 is turned off to perform the standby operation, performing a store operation immediately before a standby operation makes it possible to cause the memory elements 91 and 92, which are nonvolatile memories, to store the information stored in the SRAM circuit 40, which is a volatile memory. The semiconductor circuit 1 then performs a restore operation immediately after the standby operation, which makes it possible to cause the SRAM circuit 40 to store the information stored in the memory elements 91 and 92. This allows the semiconductor circuit 1 to return, in a short time, a state of each memory cell 30 to a state in which the power supply has not yet been stopped, after the power supply is restarted.

The driver 22 (FIGS. 1 and 3) is configured to apply the signal SAWL to the word lines AWL, apply the signal SBWL to the control lines BWL, apply the signal SCTRL to the control lines CTRL, apply a signal SRESTORL to the restore control lines RESTOREL, and apply the signal SRESETL to the reset control lines RESETL on the basis of control signals supplied from the controller 11.

The driver 23 is configured to write information to the memory cell array 21 or read information from the memory cell array 21 via the bit lines BL and BLB. Specifically, the driver 23 writes information to the memory cell array 21 via the bit lines BL and BLB on the basis of a control signal and data supplied from the controller 11. In addition, the driver 23 reads information from the memory cell array 21 via the bit lines BL and BLB and supplies the read information to the controller 11 on the basis of a control signal supplied from the controller 11.

Here, the inverter IV1 corresponds to a specific example of a "first circuit" in the present disclosure. The inverter IV2 corresponds to a specific example of a "second circuit" in the present disclosure. The memory element 91 corresponds to a specific example of a "first memory element" in the present disclosure. The memory element 92 corresponds to a specific example of a "second memory element" in the present disclosure. The transistor 31 corresponds to a specific example of a "first transistor" in the present disclosure. The transistor 32 corresponds to a specific example of a "second transistor" in the present disclosure. The transistor 33 corresponds to a specific example of a "third transistor" in the present disclosure. The transistor 34 corresponds to a specific example of a "fourth transistor" in the present disclosure. The transistor 35 corresponds to a specific example of a "ninth transistor" in the present disclosure. The transistor 36 corresponds to a specific example of a "tenth transistor" in the present disclosure. The transistor 37 corresponds to a specific example of an "eleventh transistor" in the present disclosure. The transistor 38 corresponds to a specific example of a "twelfth transistor" in the present disclosure. The controller 11 and the driver 22 correspond to specific examples of a "controller" in the present disclosure.

[Operation and Workings]

Next, description is given of an operation and workings of the semiconductor circuit 1 according to the present embodiment.

(Overview of Overall Operation)

First, description is given of an overview of an overall operation of the semiconductor circuit 1. The controller controls the operation of the memory circuit 20. Specifically, the controller 11 writes information to the memory circuit 20 on the basis of a write command and write data supplied from the outside, and reads information from the memory circuit 20 on the basis of a read command supplied from the outside. In addition, the controller 11 controls power supply to the memory circuit 20 by supplying the power supply transistor 12 with the power supply control signal SPG to turn on and off the power supply transistor 12. The power supply transistor 12 performs an on/off operation on the basis of a control signal supplied from the controller 11. Turning on the power supply transistor 12 then causes the memory circuit 20 to be supplied with the power supply voltage VDD1 as the power supply voltage VDD. The driver 22 of the memory circuit 20 applies the signal SAWL to the word lines AWL, applies the signal SBWL to the control lines BWL, applies the signal SCTRL to the control lines CTRL, applies the signal SRESTORL to the restore control lines RESTOREL, and applies the signal SRESETL to the reset control lines RESETL on the basis of control signals supplied from the controller 11. The driver 23 writes information to the memory cell array 21 via the bit lines BL and BLB on the basis of a control signal and data supplied from the controller 11. In addition, the driver 23 reads information from the memory cell array 21 via the bit lines BL and BLB and supplies the read information to the controller 11 on the basis of a control signal supplied from the controller 11.

(Details of Operation)

The semiconductor circuit 1 performs an initialization operation OP1 to reset the resistance states of the memory elements 91 and 92 to a predetermined resistance state (the low resistance state RL in this example). In a normal operation OP2, the SRAM circuit 40, which is a volatile memory, is then caused to store information. For example, in a case where the power supply transistor 12 is turned off to perform a standby operation OP4, the semiconductor circuit 1 performs a store operation OP3 immediately before the standby operation OP4, thereby causing the memory elements 91 and 92, which are nonvolatile memories, to store the information stored in the SRAM circuit 40, which is a volatile memory. The semiconductor circuit 1 then performs a restore operation OP5 immediately after the standby operation OP4 to cause the SRAM circuit 40 to store the information stored in the memory elements 91 and 92. This operation is described in detail below.

FIG. 5 illustrates an operation example of a certain memory cell 30 of interest in the semiconductor circuit 1. FIGS. 6A, 6B, 6C, 6D, and 6E each illustrate an operation state of the memory cell 30. FIG. 6A illustrates a state in the initialization operation OP1. FIG. 6B illustrates a state in the normal operation OP2. FIG. 6C illustrates a state in the store operation OP3. FIG. 6D illustrates a state in the standby operation OP4. FIG. 6E illustrates a state in the restore operation OP5. FIGS. 6A, 6B, 6C, 6D, and 6E illustrate the inverters IV1 and IV2 by using symbols, and the transistors 31, 33, 34, 35, 37, and 38 by using switches corresponding to operation states of the transistors.

(Initialization Operation OP1)

The semiconductor circuit 1 first performs the initialization operation OP1 to reset the resistance states of the memory elements 91 and 92 to a predetermined resistance state (the low resistance state RL in this example). Specifically, the semiconductor circuit 1 is able to perform the initialization operation OP1, for example, when the power of a system including the semiconductor circuit 1 is turned on.

In the initialization operation OP1, the controller 11 first sets a voltage of the power supply control signal SPG to a low level as illustrated in FIG. 5. This turns on the power supply transistor 12 (FIG. 1), and the memory cell 30 is supplied with the power supply voltage VDD. In addition, the driver 22 sets a voltage of the signal SBWL to the low level, and sets a voltage of the signal SRESTOREL to the low level. This turns off the transistors 31, 34, 35, and 38 as illustrated in FIG. 6A. As a result, the SRAM circuit 40 is electrically separated from the memory elements 91 and 92. In addition, the driver 22 sets a voltage of the signal SRESETL to a high level in a predetermined period as illustrated in FIG. 5. This turns on the transistors 33 and 37 as illustrated in FIG. 6A. In addition, the driver 22 sets a voltage of the signal SCTRL to a high-level voltage VH (a power supply voltage level) in a predetermined period as illustrated in FIG. 5. This causes an initialization current Iinit1 to flow through the control line CTRL, the memory element 91, and the transistor 33 in this order, and causes an initialization current Iinit2 to flow through the control line CTRL, the memory element 92, and the transistor 37 in this order, as illustrated in FIG. 6A. As a result, the resistance states of the memory elements 91 and 92 are set to the low resistance state RL.

The resistance states of the memory elements 91 and 92 are reset, and are set to the low resistance state RL by the initialization operation OP1 in such a manner.

(Normal Operation OP2)

The semiconductor circuit 1 performs the normal operation OP2 after performing the initialization operation OP1 to write information to the SRAM circuit 40, which is a volatile memory, or read information from the SRAM circuit 40.

In the normal operation OP2, the driver 22 sets a voltage of the signal SRESETL to the low level as illustrated in FIG. 5. This turns off the transistors 33 and 37 as illustrated in FIG. 6B. In addition, the driver 22 sets the voltage of the signal SCTRL to a low-level voltage VL (a ground level) as illustrated in FIG. 5. It is to be noted that this is not limitative, and the driver 22 may set the control line CTRL in a floating state.

In this normal operation OP2, the semiconductor circuit 1 writes information to the SRAM circuit 40 of the memory cell 30, or reads information from the SRAM circuit 40. Specifically, in a case where information is written to the SRAM circuit 40, the driver 23 first applies, to the bit lines BL and BLB, signals having mutually inverted voltage levels corresponding to the information to be written. The driver 22 then sets the voltage of the signal SAWL to the high level, thereby turning on the transistors 35 and 46 of the SRAM circuit 40. This causes information corresponding to voltages of the bit lines BL and BLB to be written to the SRAM circuit 40. In addition, in a case where information is read from the SRAM circuit 40, the driver 23 pre-charges each of the bit lines BL and BLB, for example, with a high-level voltage, and thereafter the driver 22 sets the voltage of the signal SAWL to the high level, thereby turning on the transistors 45 and 46. This causes the voltage of one of the bit lines BL and BLB to change in accordance with the information stored in the SRAM circuit 40. The driver 23 then detects a difference between the voltages of the bit lines BL and BLB, thereby reading the information stored in the SRAM circuit 40.

At this time, the transistors 31, 33, 34, 35, 37, and 38 are turned off as illustrated in FIG. 6B. Accordingly, a current does not flow through the memory elements 91 and 92, which causes each of the resistance states of the memory elements 91 and 92 to be maintained in a predetermined resistance state (the low resistance state RL in this example).

(Store Operation OP3)

Next, the store operation OP3 is described. The semiconductor circuit 1 performs the store operation OP3 before performing the standby operation OP4, thereby causing the memory elements 91 and 92 to store the information stored in the SRAM circuit 40.

In the store operation OP3, the driver 22 sets the voltage of the signal SAWL to the low level as illustrated in FIG. 5. This turns off the transistors 45 and 46. In addition, the driver 22 sets the voltage of the signal SBWL to the high level in a predetermined period as illustrated in FIG. 5. This turns on each of the transistors 34 and 38 as illustrated in FIG. 6C, and the drains of the transistors 32 and 36 are supplied with the power supply voltage VDD. This causes a store current Istore to flow through one of the memory elements 91 and 92.

In this example, the voltage VN1 at the node N1 is the high-level voltage VH, and the voltage VN2 at the node N2 is the low-level voltage VL. Accordingly, in the memory cell 30, as illustrated in FIG. 6C, the gate of the transistor 32 is supplied with the high-level voltage VH, which causes the store current Istore to flow through the transistor 34, the transistor 32, and the memory element 91 in this order. As a result, the resistance state of the memory element 91 is set to the high resistance state RH. In the memory cell 30, each of the resistance states of the memory elements 91 and 92 is set in accordance with the information stored in the SRAM circuit 40 in such a manner.

The store operation OP3 is performed on a row-by-row basis, for example. It is possible to set a row to be subjected to the store operation OP3 and a row not to be subjected to the store operation OP3 with use of the signal SBWL, for example. Specifically, the driver 22 may set the voltage of the signal SBWL to the high level for the row to be subjected to the store operation OP3 and maintain the voltage of the signal SBWL at the low level for the row not to be subjected to the store operation OP3 in a predetermined period.

(Standby Operation OP4)

The semiconductor circuit 1 then turns off the power supply transistor 12 after the store operation OP3, thereby performing the standby operation OP4.

In the standby operation OP4, the controller 11 sets the voltage of the power supply control signal SPG to the high level as illustrated in FIG. 5. This turns off the power supply transistor 12 (FIG. 1), and the power supply to the memory cell 30 is stopped. At this time, the resistance states of the memory elements 91 and 92 are maintained as illustrated in FIG. 6D.

(Restore Operation OP5)

Next, the restore operation OP5 is described. In a case where the normal operation OP2 is performed after the standby operation OP4, the semiconductor circuit 1 performs the restore operation OP5 before performing the normal operation OP2, thereby causing the SRAM circuit 40 to store the information stored in the memory elements 91 and 92.

In the restore operation OP5, the controller 11 sets the voltage of the power supply control signal SPG to the low level as illustrated in FIG. 5. This turns on the power supply transistor 12 (FIG. 1), and the memory cell 30 is supplied with the power supply voltage VDD. The driver 22 then sets the voltage of the signal SRESTOREL to the high level only for a predetermined length of period immediately after the power supply transistor 12 is turned on. This turns on each of the transistors 31 and 35 in this period as illustrated in FIG. 6E. That is, the SRAM circuit 40 is electrically coupled to the memory elements 91 and 92 in this period. In addition, the driver 22 sets the voltage of the signal SCTRL to the low-level voltage VL (the ground level) as illustrated in FIG. 5. This causes the node N1 to be grounded via the memory element 91, and causes the node N2 to be grounded via the memory element 92. At this time, the resistance states of the memory elements 91 and 92 are different from each other; therefore, the voltage state in the SRAM circuit 40 is determined in accordance with the resistance states of the memory elements 91 and 92.

In this example, as illustrated in FIG. 6E, the resistance state of the memory element 91 is set to the high resistance state RH, and the resistance state of the memory element 92 is set to the low resistance state RL. This causes the node N1 to be pulled down with a high resistance value, and causes the node N2 to be pulled down with a low resistance value. Accordingly, the voltage VN1 at the node N1 is set to the high-level voltage VH, and the voltage VN2 at the node N2 is set to the low-level voltage VL. Thus, in the memory cell 30, the SRAM circuit 40 stores information in accordance with the information stored in the memory elements 91 and 92.

It is to be noted that, in this example, the voltage of the signal SRESTOREL is set to the high level only for a predetermined length of period immediately after the power supply transistor 12 is turned on, but this is not limitative. Instead, for example, the voltage of the signal SRESTOREL may be set to the high level in advance even before the power supply transistor 12 is turned on.

For example, all the memory cells 30 in the memory cell array 21 concurrently perform the restore operation OP5. It is to be noted that this is not limitative, and some of the memory cells 30 in the memory cell array 21 may perform the restore operation OP5, and other memory cells 30 may not perform the restore operation OP5. For example, in a case where the restore operation OP5 is performed on a row-by-row basis, the driver 22 may set the signal SRESTOREL to the high level only in a predetermined period for a row to be subjected to the restore operation OP5 and may maintain the signal SRESTOREL at the low level for a row not to be subjected to the restore operation OP5.

Thereafter, the semiconductor circuit 1 performs, for example, the initialization operation OP1, and thereafter performs the normal operation OP2 (FIG. 6A). In such a manner, the semiconductor circuit 1 repeats the initialization operation OP1, the normal operation OP2, the store operation OP3, the standby operation OP4, and the restore operation OP5 in this order. It is to be noted that, in this example, the initialization operation OP1 is performed before performing the normal operation OP2, but this is not limitative. The initialization operation OP1 may be performed any time before performing the store operation OP3.

In such a manner, the semiconductor circuit 1 performs the store operation OP3 immediately before the standby operation OP4, thereby causing the memory elements 91 and 92, which are nonvolatile memories, to store the information stored in the SRAM circuit 40, which is a volatile memory. The semiconductor circuit 1 then performs the restore operation OP5 immediately after the standby operation OP4, thereby causing the SRAM circuit 40 to store the information stored in the memory elements 91 and 92. This allows the semiconductor circuit 1 to return, in a short time, the state of each memory cell 30 to the state in which the power supply has not yet been stopped, after the power supply is restarted.

In addition, in the semiconductor circuit 1, the memory cell 30 is configured using the SOT type memory elements 91 and 92. The memory elements 91 and 92 are then configured to store information by setting the resistance state between the terminal T2 and the terminal T3 in accordance with the direction of the current flowing between the terminal T1 and the terminal T2. This prevents the current from flowing through the magnetoresistive elements MR in the memory elements 91 and 92 in a case where information is stored in the memory elements 91 and 92, which makes it possible to enhance endurance (reliability).

That is, for example, in a case where a spin transfer torque (STT; Spin Transfer Torque) magnetic tunnel junction (MJT; Magnetic Tunnel Junction) element is used as a memory element similarly to a storage circuit described in PTL 1, in storing information in the memory element, a current is caused to penetrate through a free layer, a tunnel insulating layer, and a pinned layer of this memory element. Accordingly, passing the current through the memory element in such a manner may result in deterioration in characteristics of the memory element over time and a decline in endurance. Meanwhile, in the semiconductor circuit 1 according to the present embodiment, the memory cell 30 is configured using the SOT type memory elements 91 and 92. Further, the memory elements 91 and 92 are configured to store information by setting the resistance state between the terminal T2 and the terminal T3 in accordance with the direction of the current flowing between the terminal T1 and the terminal T2. In such a manner, in the memory elements 91 and 92, a current is not directly passed through the magnetoresistive element MR, but is passed through a wiring line adjacent to the magnetoresistive element MR, which makes it possible to set the state of the resistance value in the magnetoresistive element MR. Accordingly, in the semiconductor circuit 1, in storing information in the memory elements 91 and 92, a current is not passed through the magnetoresistive element MR itself, which makes it possible to reduce a possibility of deterioration in the characteristics of the memory elements 91 and 92 over time. This consequently makes it possible to enhance endurance in the semiconductor circuit 1.

In addition, in the semiconductor circuit 1, the gate of the transistor 32 is coupled to the node N1, and the gate of the transistor 36 is coupled to the node N2. This makes it possible to pass the store current Istore through the memory element 91 via the transistor 32 in an example in FIG. 6C. That is, it is possible to prevent the store current Istore from flowing into the SRAM circuit 40 in the semiconductor circuit 1. This prevents the information stored in the SRAM circuit in the semiconductor circuit 1 from being lost due to the store current flowing into the SRAM circuit like the storage circuit described in PTL 1, which makes it possible to reduce a possibility of occurrence of so-called disturbance.

Effects

As described above, in the present embodiment, the memory cell is configured using the SOT type memory elements, which makes it possible to enhance endurance (reliability).

In the present embodiment, the gate of the transistor 32 is coupled to the node N1, and the gate of the transistor 36 is coupled to the node N2, which makes it possible to reduce a possibility of occurrence of disturbance.

Modification Example 1-1

In the above-described embodiment, as illustrated in FIG. 4, for example, a current is passed from the terminal T2 to the terminal T1 of the memory element 91, thereby setting the resistance state between the terminal T2 and the terminal T3 to the low resistance state RL, but this is not limitative. A semiconductor circuit 1A according to the present modification example is described in detail below. The semiconductor circuit 1A includes a memory circuit 20A. The memory circuit 20A includes a memory cell array 21A. The memory cell array 21A includes a plurality of memory cells 30A.

FIG. 7 illustrates a configuration example of the memory cell 30A. The memory cell 30A includes the SRAM circuit 40, the transistors 31 to 38, and memory elements 91A and 92A. In this memory cell 30A, the gate of the transistor 32 is coupled to the node N2, and the gate of the transistor 36 is coupled to the node N1.

FIG. 8 schematically illustrates an operation example of the memory element 91A. In this memory element 91A, the resistance state between the terminal T2 and the terminal T3 is set to the high resistance state RH by a predetermined current flowing from the terminal T2 to the terminal T1. In addition, in the memory element 91A, the resistance state between the terminal T2 and the terminal T3 is set to the low resistance state RL by a predetermined current flowing from the terminal T1 to the terminal T2. The same applies to the memory element 92A.

FIGS. 9A, 9B, 9C, 9D, and 9E each illustrate an operation state of the memory cell 30A. FIG. 9A illustrates a state in the initialization operation OP1. FIG. 9B illustrates a state in the normal operation OP2. FIG. 9C illustrates a state in the store operation OP3. FIG. 9D illustrates a state in the standby operation OP4. FIG. 9E illustrates a state in the restore operation OP5.

In the initialization operation OP1, the controller 11 first sets the voltage of the power supply control signal SPG to the low level as illustrated in FIG. 5. This turns on the power supply transistor 12 (FIG. 1), and the memory cell 30A is supplied with the power supply voltage VDD. In addition, the driver 22 sets the voltage of the signal SBWL to the low level, and sets the voltage of the signal SRESTOREL to the low level. This turns off the transistors 31, 34, 35, and 38 as illustrated in FIG. 9A. In addition, the driver 22 sets the voltage of the signal SRESETL to the high level in a predetermined period as illustrated in FIG. 5. This turns on the transistors 33 and 37 as illustrated in FIG. 9A. In addition, the driver 22 sets the voltage of the signal SCTRL to the high-level voltage VH (the power supply voltage level) in a predetermined period as illustrated in FIG. 5. This causes the initialization current Iinit1 to flow through the control line CTRL, the memory element 91A, and the transistor 33 in this order, and causes the initialization current Iinit2 to flow through the control line CTRL, the memory element 92A, and the transistor 37 in this order, as illustrated in FIG. 9A. This sets the resistance states of the memory elements 91A and 92A to the high resistance state RH.

The operation in the normal operation OP2 is similar to that in the above-described embodiment (FIG. 6B). At this time, as illustrated in FIG. 9B, the transistors 31, 33, 34, 35, 37, and 38 are turned off. Accordingly, a current does not flow through the memory elements 91A and 92A, which causes each of the resistance states of the memory elements 91A and 92A to be maintained in a predetermined resistance state (the high resistance state RH in this example).

In the store operation OP3, the driver 22 sets the voltage of the signal SBWL to the high level in a predetermined period as illustrated in FIG. 5. This turns on each of the transistors 34 and 38 as illustrated in FIG. 9C, and the drains of the transistors 32 and 36 are supplied with the power supply voltage VDD. This causes the store current Istore to flow through one of the memory elements 91A and 92A. In this example, the voltage VN1 of the node N1 is the high-level voltage VH, and the voltage VN2 of the node N2 is the low-level voltage VL. Accordingly, in the memory cell 30A, as illustrated in FIG. 9C, the gate of the transistor 36 is supplied with the high-level voltage VH, which causes the store current Istore to flow through the transistor 38, the transistor 36, and the memory element 92A in this order. As a result, the resistance state of the memory element 92A is set to the low resistance state RL.

The standby operation OP4 is similar to that in the above-described embodiment (FIG. 6D). At this time, as illustrated in FIG. 9D, the resistance states of the memory elements 91A and 92A are maintained.

In the restore operation OP5, the controller 11 sets the voltage of the power supply control signal SPG to the low level as illustrated in FIG. 5. This turns on the power supply transistor 12 (FIG. 1), and the memory cell 30A is supplied with the power supply voltage VDD. The driver 22 then sets the voltage of the signal SRESTOREL to the high level only for a predetermined length of period immediately after the power supply transistor 12 is turned on. This turns on each of the transistors 31 and 35 in this period as illustrated in FIG. 9E. In addition, the driver 22 sets the voltage of the signal SCTRL to the low-level voltage VL (the ground level) as illustrated in FIG. 5. This causes the node N1 to be grounded via the memory element 91A, and causes the node N2 to be grounded via the memory element 92A. At this time, the resistance states of the memory elements 91A and 92A are different from each other; therefore, the voltage state in the SRAM circuit 40 is determined in accordance with the resistance states of the memory elements 91A and 92A. In this example, as illustrated in FIG. 9E, the resistance state of the memory element 91A is set to the high resistance state RH, and the resistance state of the memory element 92A is set to the low resistance state RL. This causes the node N1 to be pulled down with a high resistance value, and causes the node N2 to be pulled down with a low resistance value. Accordingly, the voltage VN1 at the node N1 is set to the high-level voltage VH, and the voltage VN2 at the node N2 is set to the low-level voltage VL.

Modification Example 1-2

In the above-described embodiment, one power supply transistor 12 is provided, but this is not limitative. Instead, for example, like a semiconductor circuit 1B illustrated in FIG. 10, a plurality of power supply transistors may be provided. The semiconductor circuit 1B includes a controller 11B, a plurality of power supply transistors 12A, 12B, . . . , and a memory circuit 20B. The controller 11B respectively supplies the plurality of power supply transistors 12A, 12B, . . . with power supply control signals SPGA, SPGB, . . . to turn on and off the plurality of power supply transistors 12A, 12A, . . . , thereby controlling the power supply to the memory circuit 20B. Each of the plurality of power supply transistors 12A, 12B, . . . is provided, for example, in association with a corresponding one of a plurality of banks in the memory circuit 20B. This makes it possible to control the power supply in units of banks of the memory circuit 20B in the semiconductor circuit 1B.

Modification Example 1-3

In the above-described embodiment, for example, the power supply transistor 12 is configured using a P-type MOS transistor, but this is not limitative. Instead, for example, like a semiconductor circuit 1C illustrated in FIG. 11, the power supply transistor may be configured using an N-type MOS transistor. The semiconductor circuit 1C includes a controller 11C, a power supply transistor 12C, and a memory circuit 20C. The controller 11C supplies the power supply transistor 12C with the power supply control signal SPG to turn on and off the power supply transistor 12C. The power supply transistor 12C is an N-type MOS transistor in this example, and has a gate supplied with the power supply control signal SPG, a drain coupled to the memory circuit 20C, and a source supplied with a ground voltage VSS1. With this configuration, in the semiconductor circuit 1C, in a case where the memory circuit 20C is used, the power supply transistor 12C is turned on, and the memory circuit 20C is supplied with the ground voltage VSS1 as a ground voltage VSS. In addition, in the semiconductor circuit 1C, in a case where the memory circuit 20C is not used, the power supply transistor 12C is turned off.

The memory circuit 20C includes a memory cell array 21C and drivers 22C and 23. The memory cell array 21C includes a plurality of memory cells 30C.

FIG. 12 illustrates a configuration example of the memory cell 30C. The memory cell 30C includes the SRAM circuit 40, transistors 31C, 32 to 34, 35C, and 36 to 38, and the memory elements 91 and 92. The transistors 31C and 35C are P-type MOS transistors. The transistor 31C has a gate coupled to the control line RESTOREL, a source coupled to the node N1, and a drain coupled to the terminal T3 of the memory element 91. The transistor 35C has a gate coupled to the control line RESTOREL, a source coupled to the node N2, and a drain coupled to the terminal T3 of the memory element 92. The gate of the transistor 32 is coupled to the node N2, and the gate of the transistor 36 is coupled to the node N1. As illustrated in FIG. 4, in the memory elements 91 and 92, the resistance state between the terminal T2 and the terminal T3 is set to the low resistance state RL by a predetermined current flowing from the terminal T2 to the terminal T1, and the resistance state between the terminal T2 and the terminal T3 is set to the high resistance state RH by a predetermined current flowing from the terminal T1 to the terminal T2.

The driver 22C is configured to apply the signal SAWL to the word lines AWL, apply the signal SBWL to the control lines BWL, apply the signal SCTRL to the control lines CTRL, apply the signal SRESTORL to the restore control lines RESTOREL, and apply the signal SRESETL to the reset control lines RESETL on the basis of control signals supplied from the controller 11C.

FIG. 13 illustrates an operation example of a certain memory cell 30C of interest in the semiconductor circuit 1C. FIGS. 14A, 14B, 14C, 14D, and 14E each illustrate an operation state of the memory cell 30C. FIG. 14A illustrates a state in the initialization operation OP1. FIG. 14B illustrates a state in the normal operation OP2. FIG. 14C illustrates a state in the store operation OP3. FIG. 14D illustrates a state in the standby operation OP4. FIG. 14E illustrates a state in the restore operation OP5.

In the initialization operation OP1, the controller 11C first sets the voltage of the power supply control signal SPG to the high level as illustrated in FIG. 13. This turns on the power supply transistor 12C (FIG. 11), and the memory cell 30C is supplied with the ground voltage VSS. In addition, the driver 22C sets the voltage of the signal SBWL to the low level, and sets the voltage of the signal SRESTOREL to the high level. This turns off the transistors 31C, 34, 35C, and 38 as illustrated in FIG. 14A. In addition, the driver 22C sets the voltage of the signal SRESETL to the high level in a predetermined period as illustrated in FIG. 13. This turns on the transistors 33 and 37 as illustrated in FIG. 14A. In addition, the driver 22C sets the voltage of the signal SCTRL to the high-level voltage VH (the power supply voltage level) in a predetermined period as illustrated in FIG. 13. This causes the initialization current Iinit1 to flow through the control line CTRL, the memory element 91, and the transistor 33 in this order, and causes the initialization current Iinit2 to flow through the control line CTRL, the memory element 92, and the transistor 37 in this order, as illustrated in FIG. 14A. This sets the resistance states of the memory elements 91 and 92 to the low resistance state RL.

The operation in the normal operation OP2 is similar to that in the above-described embodiment (FIG. 6B). At this time, as illustrated in FIG. 14B, the transistors 31C, 33, 34, 35C, 37, and 38 are turned off. Accordingly, a current does not flow through the memory elements 91 and 92, which causes each of the resistance states of the memory elements 91 and 92 to be maintained in a predetermined resistance state (the low resistance state RL in this example).

In the store operation OP3, the driver 22C sets the voltage of the signal SBWL to the high level in a predetermined period as illustrated in FIG. 13. This turns on each of the transistors 34 and 38 as illustrated in FIG. 14C, and the drains of the transistors 32 and 36 are supplied with the power supply voltage VDD. This causes the store current Istore to flow through one of the memory elements 91 and 92. In this example, the voltage VN1 of the node N1 is the high-level voltage VH, and the voltage VN2 of the node N2 is the low-level voltage VL. Accordingly, in the memory cell 30C, as illustrated in FIG. 14C, the gate of the transistor 36 is supplied with the high-level voltage VH, which causes the store current Istore to flow through the transistor 38, the transistor 36, and the memory element 92 in this order. As a result, the resistance state of the memory element 92A is set to the high resistance state RH.

In the standby operation OP4, the controller 11C sets the voltage of the power supply control signal SPG to the low level as illustrated in FIG. 13. This turns off the power supply transistor 12C (FIG. 11), and the supply of the ground voltage VSS to the memory cell 30C is stopped. At this time, the resistance states of the memory elements 91 and 92 are maintained as illustrated in FIG. 14D.

In the restore operation OP5, the controller 11C sets the voltage of the power supply control signal SPG to the high level as illustrated in FIG. 13. This turns on the power supply transistor 12C (FIG. 1), and the memory cell 30C is supplied with the ground voltage VSS. The driver 22C then sets the voltage of the signal SRESTOREL to the low level only for a predetermined length of period immediately after the power supply transistor 12C is turned on. This turns on each of the transistors 31C and 35C in this period as illustrated in FIG. 14E. In addition, the driver 22C sets the voltage of the signal SCTRL to the high-level voltage VH (the power supply voltage level) only for a predetermined length of period as illustrated in FIG. 13. This causes the node N1 to be coupled to a power supply via the memory element 91, and causes the node N2 to be coupled to the power supply via the memory element 92. At this time, the resistance states of the memory elements 91 and 92 are different from each other; therefore, the voltage state in the SRAM circuit 40 is determined in accordance with the resistance states of the memory elements 91 and 92. In this example, as illustrated in FIG. 14E, the resistance state of the memory element 91 is set to the low resistance state RL, and the resistance state of the memory element 92 is set to the high resistance state RH. This causes the node N1 to be pulled up with a low resistance value, and causes the node N2 to be pulled up with a high resistance value. Accordingly, the voltage VN1 at the node N1 is set to the high-level voltage VH, and the voltage VN2 at the node N2 is set to the low-level voltage VL.

2. Second Embodiment

Next, description is given of a semiconductor circuit 2 according to a second embodiment. In the present embodiment, a memory cell is configured using one memory element. That is, in the above-described first embodiment, each memory cell includes two memory elements, whereas in the present embodiment, each memory cell includes one memory element. It is to be noted that the components substantially the same as those of the semiconductor circuit 1 according to the above-described first embodiment are denoted by the same reference numerals, and description thereof is omitted as appropriate.

As illustrated in FIG. 1, the semiconductor circuit 2 includes a memory circuit 50. The memory circuit 50 includes a memory cell array 51 and the drivers 22 and 23. The memory cell array 51 includes a plurality of memory cells 60.

FIG. 15 illustrates a configuration example of the memory cell 60 in the memory cell array 51. FIG. 16 illustrates a configuration example of the memory cell array 51. The memory cell array 51 includes the plurality of word lines AWL, the plurality of control lines BWL, the plurality of bit lines BL, the plurality of bit lines BLB, the plurality of control lines CTRL, the plurality of restore control lines RESTOREL, and the plurality of reset control lines RESETL.

The memory cell 60 includes a SRAM circuit 70, the transistors 31 to 34, and the memory element 91.

The SRAM circuit 70 includes transistors 71 to 74, 45, and 46. The transistors 71 to 74 respectively correspond to the transistors 41 to 44 (FIG. 2) according to the above-described first embodiment. The transistors 71 and 72 are included in an inverter IV3, and the transistors 73 and 74 are included in an inverter IV4. The SRAM circuit 70 is configured to facilitate the voltage at the node N1 to be set to the high level immediately after power is turned on.

Specifically, in this example, a gate length L73 of the transistor 73 is equal to a gate length L71 of the transistor 71, and a gate width W73 of the transistor 73 is greater than a gate width W71 of the transistor 71 (W73>W71). In addition, a gate length L72 of the transistor 72 is equal to a gate length L74 of the transistor 74, and a gate width W72 of the transistor 72 is greater than a gate width W74 of the transistor 74 (W72>W74). This facilitates the inverter IV4 to output the high level and facilitates the inverter IV3 to output the low level immediately after power is turned on.

In addition, in the SRAM circuit 70, as described later, in the restore operation OP5, a current flowing from the transistor 73 of the inverter IV4 to the node N1 is larger than a current flowing from the node N1 to the control line CTRL via the transistor 31 and the memory element 91 in a case where the resistance state of the memory element 91 is the high resistance state RH, and is smaller than a current flowing from the node N1 to the control line CTRL via the transistor 31 and the memory element 91 in a case where the resistance state of the memory element 91 is the low resistance state RL.

The transistor 31 has the gate coupled to the restore control line RESTOREL, the drain coupled to the node N1, and the source coupled to the terminal T3 of the memory element 91. The transistor 32 has the gate coupled to the node N1, the drain coupled to the source of the transistor 34, and the source coupled to the terminal T1 of the memory element 91 and the drain of the transistor 33. The transistor 33 has the gate coupled to the reset control line RESETL, the drain coupled to the terminal T1 of the memory element 91 and the source of the transistor 32, and the source grounded. The transistor 34 has the gate coupled to the control line BWL, the drain supplied with the power supply voltage VDD, and the source coupled to the drain of the transistor 32.

The memory element 91 has the terminal T1 coupled to the source of the transistor 32 and the drain of the transistor 33, the terminal T2 coupled to the control line CTRL, and the terminal T3 coupled to the source of the transistor 31. In this memory element 91, as illustrated in FIG. 4, the resistance state between the terminal T2 and the terminal T3 is set to the low resistance state RL by a predetermined current flowing from the terminal T2 to the terminal T1, and the resistance state between the terminal T2 and the terminal T3 is set to the high resistance state RH by a predetermined current flowing from the terminal T1 to the terminal T2.

Here, the inverter IV3 corresponds to a specific example of a "first circuit" in the present disclosure. The inverter IV4 corresponds to a specific example of a "second circuit" in the present disclosure. The transistor 71 corresponds to a specific example of a "fifth transistor" in the present disclosure. The transistor 73 corresponds to a specific example of a "sixth transistor" in the present disclosure. The transistor 74 corresponds to a specific example of a "seventh transistor" in the present disclosure. The transistor 72 corresponds to a specific example of an "eighth transistor" in the present disclosure.

FIGS. 17A, 17B 18A, 18B, 18C, 19A, 19B, and 19C each illustrate an operation state of the memory cell 60. FIG. 17A illustrates a state in the initialization operation OP1. FIG. 17B illustrates a state in the normal operation OP2. FIGS. 18A, 18B, and 18C each illustrate a state in a case where the voltage VN1 at the node N1 is the high-level voltage VH (VN1=VH). FIG. 18A illustrates a state in the store operation OP3. FIG. 18B illustrates a state in the standby operation OP4. FIG. 18C illustrates a state in the restore operation OP5. FIGS. 19A, 19B, and 19C each illustrate a state in a case where the voltage VN1 at the node N1 is the low-level voltage VL (VN1=VL). FIG. 19A illustrates a state in the store operation OP3. FIG. 19B illustrates a state in the standby operation OP4. FIG. 19C illustrates a state in the restore operation OP5.

(Initialization Operation OP1)

In the initialization operation OP1, the controller 11 first sets the voltage of the power supply control signal SPG to the low level as illustrated in FIG. 5. This turns on the power supply transistor 12 (FIG. 1), and the memory cell 60 is supplied with the power supply voltage VDD. In addition, the driver 22 sets the voltage of the signal SBWL to the low level, and sets the voltage of the signal SRESTOREL to the low level. This turns off the transistors 31 and 34 as illustrated in FIG. 17A. As a result, the SRAM circuit 70 is electrically separated from the memory element 91. In addition, the driver 22 sets the voltage of the signal SRESETL to the high level in a predetermined period as illustrated in FIG. 5. This turns on the transistor 33 as illustrated in FIG. 17A. In addition, the driver 22 sets the voltage of the signal SCTRL to the high-level voltage VH (the power supply voltage level) in a predetermined period as illustrated in FIG. 5. This causes an initialization current Iinit to flow through the control line CTRL, the memory element 91, and the transistor 33 in this order as illustrated in FIG. 17A. As a result, the resistance state of the memory element 91 is set to the low resistance state RL.

(Normal Operation OP2)

In the normal operation OP2, the driver 22 sets the voltage of the signal SRESETL to the low level as illustrated in FIG. 5. This turns off the transistor 33 as illustrated in FIG. 17B. In addition, the driver 22 sets the voltage of the signal SCTRL to the low-level voltage (the ground level) as illustrated in FIG. 5. It is to be noted that this is not limitative, and the driver 22 may set the control line CTRL in a floating state.

In this normal operation OP2, the semiconductor circuit 2 writes information to the SRAM circuit 70 of the memory cell 60, or reads information from the SRAM circuit 70. At this time, as illustrated in FIG. 17B, the transistors 31, 33, and 34 are turned off. Accordingly, a current does not flow through the memory element 91, which causes the resistance state of the memory element 91 to be maintained in a predetermined resistance state (the low resistance state RL in this example).

(Store Operation OP3)

In the store operation OP3, the driver 22 sets the voltage of the signal SAWL to the low level as illustrated in FIG. 5. This turns off the transistors 45 and 46. In addition, the driver 22 sets the voltage of the signal SBWL to the high level in a predetermined period as illustrated in FIG. 5. This turns on the transistor 34, and the drain of the transistor 32 is supplied with the power supply voltage VDD, as illustrated in FIGS. 18A and 19A. Accordingly, the resistance state of the memory element 91 is set in accordance with information stored in the SRAM circuit 70.

Specifically, for example, as illustrated in FIG. 18A, in a case where the voltage VN1 at the node N1 is the high-level voltage VH (VN1=VH), the gate of the transistor 32 is supplied with the high-level voltage VH, which causes the store current Istore to flow through the transistor 34, the transistor 32, and the memory element 91 in this order. As a result, the resistance state of the memory element 91 is set to the high resistance state RH.

In addition, for example, as illustrated in FIG. 19A, in a case where the voltage VN1 at the node N1 is the low-voltage level VL (VN1=VL), the gate of the transistor 32 is supplied with the low-level voltage VL; therefore, a current does not flow through the memory element 91. As a result, the resistance state of the memory element 91 is maintained in the low resistance state RL.

(Standby Operation OP4)

In the standby operation OP4, the controller 11 sets the voltage of the power supply control signal SPG to the high level as illustrated in FIG. 5. This turns off the power supply transistor 12 (FIG. 1), and the power supply to the memory cell 60 is stopped. At this time, the resistance state of the memory element 91 is maintained as illustrated in FIGS. 18B and 19B.

(Restore Operation OP5)

In the restore operation OP5, as illustrated in FIG. 5, the controller 11 sets the voltage of the power supply control signal SPG to the low level. This turns on the power supply transistor 12 (FIG. 1), and the memory cell 60 is supplied with the power supply voltage VDD. The driver 22 then sets the voltage of the signal SRESTOREL to the high level only for a predetermined length of period immediately after the power supply transistor 12 is turned on. This turns on the transistor 31 in this period as illustrated in FIGS. 18C and 19C. In addition, the driver 22 sets the voltage of the signal SCTRL to the low-level voltage VL (the ground level) as illustrated in FIG. 5. This causes the node N1 to be grounded via the memory element 91. At this time, the voltage state in the SRAM circuit 70 is determined in accordance with the resistance state of the memory element 91.

Specifically, for example, as illustrated in FIG. 18C, in a case where the resistance state of the memory element 91 is the high resistance state RH, the node N1 is pulled down with a high resistance value. At this time, a current flowing from the transistor 73 of the inverter IV4 to the node N1 is larger than a current flowing from the node N1 to the control line CTRL via the transistor 31 and the memory element 91. Accordingly, the voltage VN1 at the node N1 is set to the high-level voltage VH, and the voltage VN2 at the node N2 is set to the low-level voltage VL.

In addition, for example, as illustrated in FIG. 19C, in a case where the resistance state of the memory element 91 is the low resistance state RL, the node N1 is pulled down with a low resistance value. At this time, a current flowing from the transistor 73 of the inverter IV4 to the node N1 is smaller than a current flowing from the node N1 to the control line CTRL via the transistor 31 and the memory element 91. Accordingly, the voltage VN1 at the node N1 is set to the low-level voltage VL, and the voltage VN2 at the node N2 is set to the high-level voltage VH.

In such a manner, in the semiconductor circuit 2, each memory cells 60 includes one memory element 91. This makes it possible to reduce the number of elements in the semiconductor circuit 2, as compared with the semiconductor circuit 1 according to the first embodiment, which makes it possible to reduce the area of the memory cell 60. This consequently makes it possible to reduce the area of the semiconductor circuit 2.

In addition, in the semiconductor circuit 2, the SRAM circuit 70 is configured to facilitate the voltage VN1 at the node N1 to be set to the high-level voltage VH immediately after power is turned on. Specifically, in the SRAM circuit 70, the gate width W73 of the transistor 73 in the inverter IV4 is greater than the gate width W71 of the transistor 71 in the inverter IV3 (W73>W71), and the gate width W72 of the transistor 72 in the inverter IV3 is greater than the gate width W74 of the transistor 74 in the inverter IV4 (W72>W74). Further, in the SRAM circuit 70, a current flowing from the transistor 73 of the inverter IV4 to the node N1 is larger than a current flowing from the node N1 to the control line CTRL via the transistor 31 and the memory element 91 in a case where the resistance state of the memory element 91 is the high resistance state RH (FIG. 18C), and is smaller than a current flowing from the node N1 to the control line CTRL via the transistor 31 and the memory element 91 in a case where the resistance state of the memory element 91 is the low resistance state RL (FIG. 19C). This makes it possible to achieve the restore operation OP5 with the one memory element 91 in the semiconductor circuit 3.

That is, in the semiconductor circuit 1 according to the first embodiment, for example, in a case where the resistance state of the memory element 91 is the high resistance state RH and the resistance state of the memory element 92 is the low resistance state RL, in the restore operation OP5, the node N2 is pulled down with a low resistance value as illustrated in FIG. 6E. This causes the voltage VN2 at the node N2 to be set to the low-level voltage VL, which consequently makes it possible to set the voltage VN1 at the node N1 to the high-level voltage VH. However, in a configuration in which the transistors 35 to 38 and the memory element 92 are simply removed from the memory cell 30 in the semiconductor circuit 1, it is difficult to set the voltage VN1 at the node N1 to the high-level voltage VH even if the restore operation OP5 is intended to be performed.

Meanwhile, in the semiconductor circuit 2, the SRAM circuit 70 is configured to facilitate the voltage VN1 at the node N1 to be set to the high-level voltage VH immediately after power is turned on. This causes the voltage VN1 to be pulled down with a low resistance value in a case where the resistance state of the memory element 91 is the low resistance state RL, for example, as illustrated in FIG. 19C, which causes the voltage VN1 to be set to the low-level voltage VL. In addition, as illustrated in FIG. 18C, in a case where the resistance state of the memory element 91 is the high resistance state RH, the node N1 is pulled down with a high resistance value, which causes the voltage VN1 to be set to the high-level voltage VH. That is, even if the node N1 is pulled down with the high resistance value, the voltage VN1 is not significantly influenced, and is set to the high-level voltage VH. This makes it possible to achieve the restore operation OP5 with the one memory element 91 in the semiconductor circuit 2.

As described above, in the present embodiment, each memory cell includes one memory element. This makes it possible to reduce the area of the semiconductor circuit.

In the present embodiment, the SRAM circuit is configured to facilitate the voltage at the node N1 to be set to a high-level voltage immediately after power is turned on. This makes it possible to achieve the restore operation with one memory element.

The other effects are similar to those of the above-described first embodiment.

Modification Example 2-1

In the above-described embodiment, gate widths W of the transistors 71 to 74 in the inverters IV3 and IV4 are each set, but this is not limitative. Instead, for example, lengths L of the transistors 71 to 74 in the inverters IV3 and IV4 may be each set. Specifically, for example, the gate length L73 of the transistor 73 in the inverter IV4 may be less than the gate length L71 of the transistor 71 in the inverter IV3 (L73<L71), and the gate length L72 of the transistor 72 in the inverter IV3 may be less than the gate length L74 of the transistor 74 in the inverter IV3 (L72<L74). Even in this case, it is possible to facilitate the voltage VN1 at the node N1 to be set to the high-level voltage VH immediately after power is turned on.

Modification Example 2-2

In the above-described embodiment, the gate width W73 of the transistor 73 in the inverter IV4 is greater than the gate width W71 of the transistor 71 in the inverter IV3 (W73>W71), and the gate width W72 of the transistor 72 in the inverter IV3 is greater than the gate width W74 of the transistor 74 in the inverter IV4 (W72>W74), but this is not limitative. Instead, the gate widths W72 and W74 of the transistors 72 and 74 may be equal to each other, and the gate width W73 of the transistor 73 in the inverter IV4 may be greater than the gate width W71 of the transistor 71 in the inverter IV3 (W73>W71). In addition, for example, the gate widths W71 and W73 of the transistors 71 and 73 may be equal to each other, and the gate width W72 of the transistor 72 in the inverter IV3 may be greater than the gate width W74 of the transistor 74 in the inverter IV4 (W72>W74). Even in this case, it is possible to facilitate the voltage VN1 at the node N1 to be set to the high-level voltage VH immediately after power is turned on.

Modification Example 2-3

In the above-described embodiment, as illustrated in FIG. 4, a current is passed from the terminal T2 to the terminal T1 of the memory element 91, thereby setting the resistance state between the terminal T2 and the terminal T3 to the low resistance state RL, but this is not limitative. A semiconductor circuit 2A according to the present modification example is described in detail below. The semiconductor circuit 2A includes a memory circuit 50A. The memory circuit 50A includes a memory cell array 51A. The memory cell array 51A includes a plurality of memory cells 60A.

FIG. 20 illustrates a configuration example of the memory cell 60A. The memory cell 60A includes the SRAM circuit 70, the transistors 31 to 34, and the memory element 91A. In this memory cell 60A, the gate of the transistor 32 is coupled to the node N2, and the gate of the transistor 36 is coupled to the node N1. As illustrated in FIG. 8, in the memory element 91A, the resistance state between the terminal T2 and the terminal T3 is set to the high resistance state RH by a predetermined current flowing from the terminal T2 to the terminal T1, and the resistance state between the terminal T2 and the terminal T3 is set to the low resistance state RL by a predetermined current flowing from the terminal T1 to the terminal T2.

FIGS. 21A, 21B, 22A, 22B, 22C, and FIGS. 23A, 23B, and 23C each illustrate an operation state of the memory cell 60A. FIG. 21A illustrates a state in the initialization operation OP1. FIG. 21B illustrates a state in the normal operation OP2. FIGS. 22A, 22B, and 22C each illustrate a state in a case where the voltage VN1 at the node N1 is the high-level voltage VH (VN1=VH). FIG. 22A illustrates a state in the store operation OP3. FIG. 22B illustrates a state in the standby operation OP4. FIG. 22C illustrates a state in the restore operation OP5. FIGS. 23A, 23B, and 23C each illustrate a state in a case where the voltage VN1 at the node N1 is the low-level voltage VL (VN1=VL). FIG. 23A illustrates a state in the store operation OP3. FIG. 23B illustrates a state in the standby operation OP4. FIG. 23C illustrates a state in the restore operation OP5.

In the initialization operation OP1, the controller 11 first sets the voltage of the power supply control signal SPG to the low level as illustrated in FIG. 5. This turns on the power supply transistor 12 (FIG. 1), and the memory cell 60A is supplied with the power supply voltage VDD. In addition, the driver 22 sets the voltage of the signal SBWL to the low level, and sets the voltage of the signal SRESTOREL to the low level. This turns off the transistors 31 and 34 as illustrated in FIG. 21A. As a result, the SRAM circuit 70 is electrically separated from the memory element 91A. In addition, the driver 22 sets the voltage of the signal SRE-SETL to the high level in a predetermined period as illustrated in FIG. 5. This turns on the transistor 33 as illustrated in FIG. 21A. In addition, the driver 22 sets the voltage of the signal SCTRL to the high-level voltage VH (the power supply voltage level) in a predetermined period as illustrated in FIG. 5. This causes the initialization current Iinit to flow through the control line CTRL, the memory element 91A, and the transistor 33 in this order as illustrated in FIG. 21A. As a result, the resistance state of the memory element 91A is set to the high resistance state RH.

The operation in the normal operation OP2 is similar to that in the above-described second embodiment (FIG. 17B). At this time, the transistors 31, 33, and 34 are turned off as illustrated in FIG. 21B. Accordingly, a current does not flow through the memory element 91A, which causes the resistance state of the memory element 91A to be each maintained in a predetermined resistance state (the high resistance state in this example).

In the store operation OP3, the driver 22 sets the voltage of the signal SBWL to the high level in a predetermined period as illustrated in FIG. 5. This turns on the transistor 34 as illustrated in FIGS. 22A and 23B, and the drain of the transistor 32 is supplied with the power supply voltage VDD. Accordingly, the resistance state of the memory element 91 is set in accordance with information stored in the SRAM circuit 70.

Specifically, for example, as illustrated in FIG. 22A, in a case where the voltage VN1 at the node N1 is the high-level voltage VH (VN1=VH), the gate of the transistor 32 is supplied with the high-level voltage VL; therefore, a current does not flow through the memory element 91A. As a result, the resistance state of the memory element 91A is maintained in the high resistance state RH.

In addition, for example, as illustrated in FIG. 23A, in a case where the voltage VN1 at the node N1 is the low-level voltage VL (VN1=VL), the gate of the transistor 32 is supplied with the high-level voltage VH, which causes the store current Istore to flow through the transistor 34, the transistor 32, and the memory element 91A in this order. As a result, the resistance state of the memory element 91A is set to the low resistance state RL.

The standby operation OP4 is similar to that in the above-described second embodiment (FIGS. 18B and 19B). At this time, the resistance states of the memory elements 91A and 92A are maintained as illustrated in FIGS. 22B and 23B.

In the restore operation OP5, the controller 11 sets the voltage of the power supply control signal SPG to the low level as illustrated in FIG. 5. This turns on the power supply transistor 12 (FIG. 1), and the memory cell 60A is supplied with the power supply voltage VDD. The driver 22 then sets the voltage of the signal SRESTOREL to the high level only for a predetermined length of period immediately after the power supply transistor 12 is turned on. This turns on the transistor 31 in this period as illustrated in FIGS. 22C and 23C. In addition, the driver 22 sets the voltage of the signal SCTRL to the low-level voltage VL (the ground level) as illustrated in FIG. 5. This causes the node N1 to be grounded via the memory element 91A. At this time, the voltage state in the SRAM circuit 70 is determined in accordance with the resistance state of the memory element 91A.

Specifically, for example, as illustrated in FIG. 22C, in a case where the resistance state of the memory element 91A is the high resistance state RH, the node N1 is pulled down with a high resistance value. At this time, a current flowing from the transistor 73 of the inverter IV4 to the node N1 is larger than a current flowing from the node N1 to the control line CTRL via the transistor 31 and the memory element 91A. Accordingly, the voltage VN1 at the node N1 is set to the high-level voltage VH, and the voltage VN2 at the node N2 is set to the low-level voltage VL.

In addition, for example, as illustrated in FIG. 23C, in a case where the resistance state of the memory element 91A is the low resistance state RL, the node N1 is pulled down with a low resistance value. At this time, in this example, a current flowing from the transistor 73 of the inverter IV4 to the node N1 is smaller than a current flowing from the node N1 to the control line CTRL via the transistor 31 and the memory element 91A. Accordingly, the voltage VN1 at the node N1 is set to the low-level voltage VL, and the voltage VN2 at the node N2 is set to the high-level voltage VH.

Modification Example 2-4

Each of the modification examples of the above-described first embodiment may be applied to the semiconductor circuit 2 according to the above-described embodiment.

3. Third Embodiment

Next, description is given of a semiconductor circuit 3 according to a third embodiment. In the present embodiment, a current path in the store operation OP3 is configured to be different from that in the semiconductor circuit 1 according to the first embodiment. It is to be noted that the components substantially the same as those of the semiconductor circuit 1 according to the above-described first embodiment are denoted by the same reference numerals, and description thereof is omitted as appropriate.

As illustrated in FIG. 1, the semiconductor circuit 3 includes a memory circuit 120. The memory circuit 120 includes a memory cell array 121 and drivers 122 and 23. The memory cell array 121 includes a plurality of memory cells 130.

FIG. 24 illustrates a configuration example of the memory cell 130 in the memory cell array 121. FIG. 25 illustrates a configuration example of the memory cell array 121. The memory cell array 121 includes the plurality of word lines AWL, a plurality of store control lines STOREL, the plurality of bit lines BL, the plurality of bit lines BLB, the plurality of control lines CTRL, and the plurality of restore control lines RESTOREL. The store control lines STOREL extend in a horizontal direction in FIGS. 24 and 25. One end of each of the store control lines STOREL is coupled to the driver 122. A signal SSTOREL is applied to this store control line STOREL by the driver 122.

The memory cell 130 includes the SRAM circuit 40, transistors 31, 35, 132, and 136, and the memory elements 91 and 92.

The transistors 132 and 136 are N-type MOS transistors. The transistor 132 has a gate coupled to the store control line STOREL, a drain coupled to the node N1, and a source coupled to the terminal T1 of the memory element 91. The transistor 136 has a gate coupled to the store control line STOREL, a drain coupled to the node N2, and a source coupled to the terminal T1 of the memory element 92.

The terminal T1 of the memory element 91 is coupled to the source of the transistor 132, and the terminal T1 of the memory element 92 is coupled to the source of the transistor 136. In the memory elements 91 and 92, as illustrated in FIG. 4, the resistance state between the terminal T2 and the terminal T3 is set to the low resistance state RL by a predetermined current flowing from the terminal T2 to the terminal T1, and the resistance state between the terminal T2 and the terminal T3 is set to the high resistance state RH by a predetermined current flowing from the terminal T1 to the terminal T2.

The driver 122 (FIGS. 1 and 25) is configured to apply the signal SAWL to the word lines AWL, apply the signal SSTOREL to the store control lines STOREL, apply the signal SCTRL to the control lines CTRL, and apply the signal SRESTORL to the restore control lines RESTOREL on the basis of control signals supplied from the controller 11

Here, the transistor 31 corresponds to a specific example of a "first transistor" in the present disclosure. The transistor 132 corresponds to a specific example of a "second transistor" in the present disclosure. The transistor 35 corresponds to a specific example of a "ninth transistor" in the present disclosure. The transistor 136 corresponds to a specific example of a "tenth transistor" in the present disclosure.

FIG. 26 illustrates an operation example of a certain memory cell 130 of interest in the semiconductor circuit 3. FIGS. 27A, 27B, 27C, 27D, and 27E each illustrate an operation state of the memory cell 130. FIG. 27A illustrates a state in the normal operation OP2. FIGS. 27B and 27C each illustrate a state in the store operation OP3. FIG. 27D illustrates a state in the standby operation OP4. FIG. 27E illustrates a state in the restore operation OP5.

(Normal Operation OP2)

In the normal operation OP2, the driver 122 sets the voltage of the signal SSTOREL to the low level and sets the voltage of the signal SRESTOREL to the low level, as illustrated in FIG. 26. This turns off the transistors 31, 35, 132, and 136 as illustrated in FIG. 27A. in addition, the driver 122 sets the voltage of the signal SCTRL to the low-level voltage VL (the ground level) as illustrated in FIG. 26.

In this normal operation OP2, the semiconductor circuit 3 writes information to the SRAM circuit 40 of the memory cell 130, or reads information from the SRAM circuit 40. At this time, as illustrated in FIG. 27A, the transistors 31, 35, 132, and 136 are turned off. In this example, the resistance state of the memory element 91 is maintained in the low resistance state RL, and the resistance state of the memory element 92 is maintained in the high resistance state RH.

(Store Operation OP3)

In the store operation OP3, the driver 122 sets the voltage of the signal SAWL to the low level as illustrated in FIG. 26. This turns off the transistors 45 and 46. In addition, the driver 122 sets the voltage of the signal SSTOREL to the high level in a predetermined period as illustrated in FIG. 26. This turns on each of the transistors 132 and 136 as illustrated in FIGS. 27B and 27C. In the semiconductor circuit 3, the store operation OP3 is performed dividedly in two operations OP31 and OP32.

First, in the operation OP31, the driver 122 sets the voltage of the signal SCTRL to the high-level voltage VH (the power supply voltage level) as illustrated in FIG. 26. This causes a store current Istore1 to flow through one of the memory elements 91 and 92. In this example, the voltage VN1 at the node N1 is the high-level voltage VH, and the voltage VN2 at the node N2 is the low-level voltage VL. This causes the store current Istore1 to flow through the memory element 92, the transistor 136, and the transistor 42 of the inverter IV1 in this order in the memory cell 130, as illustrated in FIG. 27B. As a result, the resistance state of the memory element 92 is set to the low resistance state RL.

Next, in the operation OP32, the driver 122 sets the voltage of the signal SCTRL to the low-level voltage VL (the ground voltage level) as illustrated in FIG. 26. This causes a store current Istore2 to flow through the other of the memory elements 91 and 92. In this example, as illustrated in FIG. 27C, the store current Istore2 flows through the transistor 43 of the inverter IV2, the transistor 132, and the memory element 91 in this order. As a result, the resistance state of the memory element 91 is set to the high resistance state RH.

In such a manner, in the memory cell 130, each of the resistance states of the memory elements 91 and 92 is set in accordance with information stored in the SRAM circuit 40. It is to be noted that, in this example, the driver 122 sets the voltage of the signal SCTRL to the high-level voltage VH in the first operation OP31 and sets the voltage of the signal SCTRL to the low-level voltage VL in the next operation OP32, but this is not limitative. Instead, for example, in the first operation OP31, the voltage of the signal SCTRL may be set to the low-level voltage VL, and in the next operation OP32, the voltage of the signal SCTRL may be set to the high-level voltage VH.

(Standby Operation OP4)

In the standby operation OP4, the controller 11 sets the voltage of the power supply control signal SPG to the high level as illustrated in FIG. 26. This turns off the power supply transistor 12 (FIG. 1), and the power supply to the memory cell 130 is stopped. At this time, the resistance states of the memory elements 91 and 92 are maintained as illustrated in FIG. 27D.

(Restore Operation OP5)

In the restore operation OP5, the controller 11 sets the voltage of the power supply control signal SPG to the low level as illustrated in FIG. 26. This turns on the power supply transistor 12 (FIG. 1), and the memory cell 130 is supplied with the power supply voltage VDD. The driver 122 then sets the voltage of the signal SRESTOREL to the high level only for a predetermined length of period immediately after the power supply transistor 12 is turned on. This turns on each of the transistors 31 and 35 in this period as illustrated in FIG. 27E. In addition, the driver 122 sets the voltage of the signal SCTRL to the low-level voltage VL (the ground level) as illustrated in FIG. 26. This causes the node N1 to be grounded via the memory element 91, and causes the node N2 to be grounded via the memory element 92. At this time, the resistance states of the memory elements 91 and 92 are different from each other; therefore, the voltage in the SRAM circuit 40 is determined in accordance with the resistance states of the memory elements 91 and 92.

In this example, as illustrated in FIG. 27E, the resistance state of the memory element 91 is the high resistance state RH, and the resistance state of the memory element 92 is the low resistance state RL. This causes the node N1 to be pulled down with a high resistance value, and causes the node N2 to be pulled down with a low resistance value. Accordingly, the voltage VN1 at the node N1 is set to the high-level voltage VH, and the voltage VN2 at the node N2 is set to the low-level voltage VL.

In such a manner, in the semiconductor circuit 3, the memory cell 130 is configured using the SRAM circuit 40, the memory elements 91 and 92, and the transistors 31, 35, 132, and 136, which makes it possible to reduce the number of elements, as compared with the semiconductor circuit 1 according to the first embodiment. This makes it possible to reduce the area of the memory cell 130, and consequently makes it possible to reduce the area of the semiconductor circuit 3.

In addition, in the semiconductor circuit 3, the drain of the transistor 132 is coupled to the node N1, and the drain of the transistor 136 is coupled to the node N2. In the semiconductor circuit 3, the store operation OP3 is then performed dividedly in two operations OP31 and OP32. This makes it possible to set each of the resistance states of two memory elements 91 and 92 in this store operation OP3. This consequently makes it possible to omit the initialization operation OP1 in the semiconductor circuit 3, which makes it possible to simplify the operation.

As described above, in the present embodiment, the memory cell is configured using the SRAM circuit, the memory elements 91 and 92, and the transistors 31, 35, 132, and 136, which makes it possible to reduce the area of the semiconductor circuit.

In the present embodiment, the drain of the transistor 132 is coupled to the node N1, and the drain of the transistor 136 is coupled to the N2, which makes it possible to simplify the operation.

The other effects are similar to those of the above-described first embodiment.

Modification Example 3-1

In the above-described embodiment, as illustrated in FIG. 4, for example, a current is passed from the terminal T2 to the terminal T1 of the memory element 91, thereby setting the resistance state between the terminal T2 and the terminal T3 to the low resistance state RL, but this is not limitative. A semiconductor circuit 3A according to the present modification example is described in detail below. The semiconductor circuit 3A includes a memory circuit 120A. The memory circuit 120A includes a memory cell array 121A. The memory cell array 121A includes a plurality of memory cells 130A.

FIG. 28 illustrates a configuration example of the memory cell 130A. The memory cell 130A includes the SRAM circuit 40, transistors 31, 35, 132, and 136, and the memory elements 91A and 92A. In this memory cell 130A, the drain of the transistor 132 is coupled to the node N2, and the gate of the transistor 136 is coupled to the node N1. As illustrated in FIG. 8, in the memory element 91A, the resistance state between the terminal T2 and the terminal T3 is set to the high resistance state RH by a predetermined current flowing from the terminal T2 to the terminal T1, and the resistance state between the terminal T2 and the terminal T3 is set to the low resistance state RL by a predetermined current flowing from the terminal T1 to the terminal T2. The same applies to the memory element 92A.

FIGS. 29A, 29B, 29C, 29D, and 29E each illustrate an operation state of the memory cell 130A. FIG. 29A illustrates a state in the normal operation OP2. FIGS. 29B and 29C each illustrate a state in the store operation OP3. FIG. 29D illustrates a state in the standby operation OP4. FIG. 29E illustrates a state in the restore operation OP5.

The operation in the normal operation OP2 is similar to that in the above-described third embodiment (FIG. 27A). At this time, the transistors 31, 35, 132, and 136 are turned off as illustrated in FIG. 29A. In this example, the resistance state of the memory element 91A is maintained in the low resistance state RL, and the resistance state of the memory element 92A is maintained in the high resistance state RH.

In the store operation OP3, the driver 122 sets the voltage of the signal SSTOREL to the high level in a predetermined period as illustrated in FIG. 26. This turns on each of the transistors 132 and 136 as illustrated in FIGS. 29B and 29C. In the semiconductor circuit 3A, the store operation OP3 is performed dividedly in two operations OP31 and OP32.

First, in the operation OP31, the driver 122 sets the voltage of the signal SCTRL to the high-level voltage VH (the power supply voltage level) as illustrated in FIG. 26. This causes the store current Istore1 to flow through one of the memory elements 91A and 92A. In this example, the voltage VN1 at the node N1 is the high-level voltage VH, and the voltage VN2 at the node N2 is the low-level voltage VL. This causes the store current Istore1 to flow through the memory element 91A, the transistor 132, and the transistor 42 of the inverter IV1 in this order in the memory cell 130A, as illustrated in FIG. 29B. As a result, the resistance state of the memory element 91A is set to the high resistance state RH.

Next, in the operation OP32, the driver 122 sets the voltage of the signal SCTRL to the low-level voltage VL (the ground voltage level) as illustrated in FIG. 26. This causes the store current Istore2 to flow through the other of the memory elements 91A and 92A. In this example, as illustrated in FIG. 29C, the store current Istore2 flows through the transistor 43 of the inverter IV2, the transistor 136, and the memory element 92A in this order. As a result, the resistance state of the memory element 92A is set to the low resistance state RL.

The standby operation OP4 is similar to that in the above-described third embodiment (FIG. 27D). At this time, the resistance states of the memory elements 91A and 92A are maintained as illustrated in FIG. 29D.

In the restore operation OP5, the controller 11 sets the voltage of the power supply control signal SPG to the low level as illustrated in FIG. 26. This turns on the power supply transistor 12 (FIG. 1), and the memory cell 130A is supplied with the power supply voltage VDD. The driver 122 then sets the voltage of the signal SRESTOREL to the high level only for a predetermined length of period immediately after the power supply transistor 12 is turned on. This turns on each of the transistors 31 and 35 in this period as illustrated in FIG. 29E. In addition, the driver 122 sets the voltage of the signal SCTRL to the low-level voltage VL (the ground level) as illustrated in FIG. 26. This causes the node N1 to be grounded via the memory element 91A, and causes the node N2 to be grounded via the memory element 92A. At this time, the resistance states of the memory elements 91A and 92A are different from each other; therefore, the voltage in the SRAM circuit 40 is determined in accordance with the resistance states of the memory elements 91A and 92A.

In this example, as illustrated in FIG. 29E, the resistance state of the memory element 91A is the high resistance state RH, and the resistance state of the memory element 92A is the low resistance state RL. This causes the node N1 to be pulled down with a high resistance value, and causes the node N2 to be pulled down with a low resistance value. Accordingly, the voltage VN1 at the node N1 is set to the high-level voltage VH, and the voltage VN2 at the node N2 is set to the low-level voltage VL.

Modification Example 3-2

Each of the modification examples of the above-described first embodiment may be applied to the semiconductor circuit 3 according to the above-described embodiment.

4. Applied Example and Example of Application

Next, description is given of an applied example of the technology described in the embodiments and modification examples described above, and an example of application of the technology described in the embodiments and modification described above to an electronic device.

Applied Example

In the above-described embodiments, the present technology is applied to an SRAM circuit, but this is not limitative. For example, the present technology may be applied to flip-flop circuits 101 to 104 illustrated in FIGS. 30A, 30B, 30C, and 30D. The flip-flop circuit 101 is a so-called master-slave D-type flip-flop circuit including a master latch circuit 101M and a slave latch circuit 101S. The same applies to the flip-flop circuits 102 to 104.

FIG. 31 illustrates a configuration example of a flip-flop circuit 201 according to the present applied example. The flip-flop circuit 201 is the flip-flop circuit 101 illustrated in FIG. 26A to which the technology according to the above-described embodiments is applied. The flip-flop circuit 201 includes the master latch circuit 101M and a slave latch circuit 201S. The technology according to the above-described first embodiment is applied to this slave latch circuit 201S. The slave latch circuit 201S includes inverters IV5 and IV6, a transmission gate TG, a switch 99, transistors 31 to 38, and the memory elements 91 and 92. The inverter IV5 has an input terminal coupled to the node N1, and an output terminal coupled to the node N2. The inverter IV6 has an input terminal coupled to the node N2, and an output terminal coupled to one end of the transmission gate TG and one end of the switch 99. The transmission gate TG has the one end coupled to the output terminal of the inverter IV6 and the one end of the switch 99, and another end coupled to the node N1. The switch 99 has the one end coupled to the output terminal of the inverter IV6 and the one end of the transmission gate TG, and another end coupled to the node N1. The switch 99 is turned off in a case where the normal operation OP2 is performed, and is turned on in a case where the initialization operation OP1, the store operation OP3, and the restore operation OP5 are performed.

It is to be noted that, in this example, the technology according to the above-described embodiments is applied to the slave latch circuit, but this is not limitative. Instead, for example, the technology according to the above-described embodiments may be applied to the master latch circuit.

(Example of Application to Electronic Device)

FIG. 32 illustrates an appearance of a smartphone to which the semiconductor circuit according to any of the embodiments and the like described above is applied. This smartphone includes, for example, a main body 310, a display section 320, and a battery 330.

The semiconductor circuit according to any of the embodiments and the like described above is applicable to electronic devices in various fields such as digital cameras, notebook personal computers, portable game consoles, and video cameras in addition to such a smartphone. The present technology is effective especially in a case where the technology is applied to a portable electronic device including a battery. This makes it possible to reduce power consumption in the electronic device.

Although the present technology has been described above with reference to some embodiments and modification examples, and the specific applied example thereof and the example of application to the electronic device, the present technology is not limited to these embodiments and the like, and may be modified in a variety of ways.

For example, in the applied example described above, the present technology is applied to a D-type flip-flop circuit, but is not limited thereto. For example, the present technology may be applied to another flip-flop circuit, or may be applied to a latch circuit.

It is to be noted that the effects described in this specification are merely illustrative and non-limiting, and other effects may be provided.

It is to be noted that the present technology may have the following configurations. According to the present technology of the following configurations, it is possible to enhance endurance.

(1)

A semiconductor circuit including:

a first circuit that is configured to generate an inverted voltage of a voltage at a first node, and apply the inverted voltage to a second node;

a second circuit that is configured to generate an inverted voltage of a voltage at the second node, and apply the inverted voltage to the first node;

a first memory element that has a first terminal, a second terminal, and a third terminal, and is configured to store information by setting a resistance state between the second terminal and the third terminal to a first resistance state or a second resistance state in accordance with a direction of a first current flowing between the first terminal and the second terminal;

a first transistor that is configured to couple the first node to the third terminal of the first memory element by being turned on; and a second transistor that is coupled to a first coupling node, and is configured to cause the first current to flow to the second terminal of the first memory element on the basis of a voltage at the first coupling node, the first coupling node being one of the first node and the second node.

(2)

The semiconductor circuit according to (1), further including a third transistor that is configured to supply the first terminal of the first memory element with a first voltage by being turned on, in which the second transistor has a drain, a gate coupled to the first coupling node, and a source coupled to the first terminal of the first memory element.

(3)

The semiconductor circuit according to (2), further including a fourth transistor that is configured to supply the drain of the second transistor with a second voltage different from the first voltage by being turned on.

(4)

The semiconductor circuit according to (3), further including a controller that is configured to control operations of the first transistor, the third transistor, and the fourth transistor, in which the controller is configured to turn on the fourth transistor and turn off the first transistor and the third transistor in a first period, thereby setting a resistance state of the first memory element to a resistance state corresponding to a voltage at the first coupling node.

(5)

The semiconductor circuit according to (4), in which the controller is configured to turn on the first transistor and turn off the third transistor and the fourth transistor in a second period after the first period, thereby setting the voltage at the first node to a voltage corresponding to the resistance state of the first memory element.

(6)

The semiconductor circuit according to (5), further including a power supply transistor that performs power supply to the first circuit and the second circuit by being turned on, in which the controller is configured to turn off the power supply transistor in a third period between the first period and the second period.

(7)

The semiconductor circuit according to any one of (4) to (6), in which the controller is configured to turn on the third transistor and turn off the first transistor and the fourth transistor in a fourth period before the first period, thereby setting the resistance state of the first memory element to the first resistance state.

(8)

The semiconductor circuit according to any one of (1) to (7), in which the first circuit and the second circuit are configured to facilitate the voltage at the first node to be set to a predetermined initial voltage after power is turned on.

(9)

The semiconductor circuit according to (8), in which the first circuit includes a fifth transistor that couples a first power supply and the second node to each other by being turned on, the first power supply corresponding to the initial voltage, and the second circuit includes a sixth transistor that couples the first power supply and the first node to each other by being turned on, the sixth transistor having a gate width greater than a gate width of the fifth transistor.

(10)

The semiconductor circuit according to (8) or (9), in which the second circuit includes a seventh transistor that couples a second power supply and the first node to each other by being turned on, the second power supply corresponding to a voltage different from the initial voltage, and the first circuit includes an eighth transistor that couples the second power supply and the second node to each other by being turned on, the eighth transistor having a gate width greater than a gate width of the seventh transistor.

(11)

The semiconductor circuit according to any one of (8) to (10), in which the first circuit includes a fifth transistor that couples a first power supply and the second node to each other by being turned on, the first power supply corresponding to the initial voltage, and the second circuit includes a sixth transistor that couples the first power supply and the first node to each other by being turned on, the sixth transistor having a gate length less than a gate length of the fifth transistor.

(12)

The semiconductor circuit according to any one of (8) to (11), in which the second circuit includes a seventh transistor that couples a second power supply and the first node to each other by being turned on, the second power supply corresponding to a voltage different from the initial voltage, and the first circuit includes an eighth transistor that couples the second power supply and the second node to each other by being turned on, the eighth transistor having a gate length less than a gate length of the seventh transistor.

(13)

The semiconductor circuit according to any one of (8) to (12), in which the second circuit includes a sixth transistor that couples a first power supply and the first node to each other by being turned on, the first power supply corresponding to the initial voltage, and a current value of a current flowing from the first power supply to the first node in a case where the sixth transistor is turned on is a current value between a first current value and a second current value, the first current value being for a current flowing from the first node to the first memory element via the first transistor in a case where the first resistor is turned on and the resistance state of the first memory element is the first resistance state, the second current value being for a current flowing from the first node to the first memory element via the first transistor in a case where the first transistor is turned on and the resistance state of the first memory element is the second resistance state.

(14)

The semiconductor circuit according to (2), further including:

a second memory element that has a first terminal, a second terminal, and a third terminal, and is configured to store information by setting a resistance state between the second terminal and the third terminal to the first resistance state or the second resistance state in accordance with a direction of a second current flowing between the first terminal and the second terminal;

a ninth transistor that is configured to couple the second node to the third terminal of the second memory element by being turned on;

a tenth transistor that is coupled to a second coupling node, and is configured to cause the second current to flow to the second terminal of the second memory element on the basis of a voltage at the second coupling node, the second coupling node being one of the first node and the second node and different from the first coupling node; and an eleventh transistor that is configured to supply the first terminal of the second memory element with the first voltage by being turned on, in which the tenth transistor has a drain, a gate coupled to the second coupling node, and a source coupled to the first terminal of the second memory element.

(15)

The semiconductor circuit according to (14), further including:

a fourth transistor that is configured to supply the drain of the second transistor with a second voltage different from the first voltage by being turned on; and a twelfth transistor that is configured to supply the drain of the tenth transistor with the second voltage by being turned on.

(16)

The semiconductor circuit according to (1), further including:

a second memory element that has a first terminal, a second terminal, and a third terminal, and is configured to store information by setting a resistance state between the second terminal and the third terminal to the first resistance state or the second resistance state in accordance with a direction of a second current flowing between the first terminal and the second terminal;

a ninth transistor that is configured to couple the second node to the third terminal of the second memory element by being turned on; and a tenth transistor that is coupled to a second coupling node, and is configured to cause the second current to flow to the second terminal of the second memory element on the basis of a voltage at the second coupling node, the second coupling node being one of the first node and the second node and different from the first coupling node, in which the second transistor has a drain coupled to the first coupling node, a gate, and a source coupled to the first terminal of the first memory element, and the tenth transistor has a drain coupled to the second coupling node, a gate, and a source coupled to the first terminal of the second memory element.

(17)

The semiconductor circuit according to (16), further including a controller that is configured to control operations of the first transistor, the second transistor, the ninth transistor, and the tenth transistor, and is configured to apply a control voltage to the second terminal of the first memory element and the second terminal of the second memory element, in which the controller is configured to turn on the second transistor and the tenth transistor and turn off the first transistor and the ninth transistor in a first period and set the control voltage to a third voltage and a fourth voltage in a time division manner, thereby setting the resistance state of the first memory element to a resistance state corresponding to the voltage at the first coupling node and setting the resistance state of the second memory element to a resistance state corresponding to the voltage at the second coupling node.

(18)

The semiconductor circuit according to (17), in which the controller is configured to turn on the first transistor and the ninth transistor and turn off the second transistor and the tenth transistor in a second period after the first period, thereby setting the voltage at the first node to a voltage corresponding to the resistance state of the first memory element and setting the voltage at the second node to a voltage corresponding to the resistance state of the second memory element.

(19)

The semiconductor circuit according to claim 1, in which the first memory element is configured to store information by changing a resistance state with use of spin orbit torque.

(20)

The semiconductor circuit according to any one of (1) to (19), in which the first circuit and the second circuit are included in a SRAM circuit.

(21)

The semiconductor circuit according to any one of (1) to (19), in which the first circuit and the second circuit are included in a latch circuit.

(22)

The semiconductor circuit according to (21), in which the latch circuit includes a slave latch circuit in a flip-flop circuit including a master latch circuit and the slave latch circuit.

(23)

An electronic device including:

a semiconductor circuit; and a battery that supplies the semiconductor circuit with a power supply voltage, the semiconductor circuit including a first circuit that is configured to generate an inverted voltage of a voltage at a first node, and apply the inverted voltage to a second node, a second circuit that is configured to generate an inverted voltage of a voltage at the second node, and apply the inverted voltage to the first node, a first memory element that has a first terminal, a second terminal, and a third terminal, and is configured to store information by setting a resistance state between the second terminal and the third terminal to a first resistance state or a second resistance state in accordance with a direction of a first current flowing between the first terminal and the second terminal, a first transistor that is configured to couple the first node to the third terminal of the first memory element by being turned on, and a second transistor that is coupled to a first coupling node, and is configured to cause the first current to flow to the second terminal of the first memory element on the basis of a voltage at the first coupling node, the first coupling node being one of the first node and the second node.

This application claims the benefit of Japanese Priority Patent Application JP2018-158366 filed with the Japan Patent Office on Aug. 27, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor circuit, comprising:
a first circuit configured to:
generate a first inverted voltage of a voltage at a first node, and
apply the first inverted voltage to a second node;
a second circuit configured to:
generate a second inverted voltage of a voltage at the second node, and
apply the second inverted voltage to the first node;
a first memory element including a first terminal, a second terminal, and a third terminal, wherein the first memory element is configured to store information by setting a resistance state between the second terminal and the third terminal to a first resistance state or a second resistance state based on a direction of a first current flowing between the first terminal and the second terminal;

a first transistor configured to couple, by being turned on, the first node to the third terminal of the first memory element;

a second transistor coupled to a first coupling node, wherein
the second transistor is configured to control flow of the first current to the second terminal of the first memory element based on a voltage at the first coupling node,
the first coupling node is one of the first node or the second node;

a third transistor configured to supply, by being turned on, the first terminal of the first memory element with a first voltage, wherein
the second transistor has a first drain, a first gate, and a first source,
the first gate is coupled to the first coupling node, and
the first source is coupled to the first terminal of the first memory element;

a fourth transistor configured to supply, by being turned on, the first drain of the second transistor with a second voltage different from the first voltage; and a controller configured to control operations of the first transistor, the third transistor, and the fourth transistor.

2. The semiconductor circuit according to claim 1, wherein the controller is further configured to turn on the fourth transistor and turn off the first transistor and the third transistor in a first period, thereby setting a resistance state of the first memory element to a resistance state corresponding to a voltage at the first coupling node.

3. The semiconductor circuit according to claim 2, wherein the controller is further configured to turn on the first transistor and turn off the third transistor and the fourth transistor in a second period after the first period, thereby setting the voltage at the first node to a voltage corresponding to the resistance state of the first memory element.

4. The semiconductor circuit according to claim 3, further comprising a power supply transistor configured to execute, by being turned on, power supply to the first circuit and the second circuit, wherein the controller is further configured to turn off the power supply transistor in a third period between the first period and the second period.

5. The semiconductor circuit according to claim 2, wherein the controller is further configured to turn on the third transistor and turn off the first transistor and the fourth transistor in a fourth period before the first period, thereby setting the resistance state of the first memory element to the first resistance state.

6. The semiconductor circuit according to claim 1, wherein the first circuit and the second circuit are configured to facilitate the voltage at the first node to be set to a specific initial voltage after power is turned on.

7. The semiconductor circuit according to claim 6, wherein
the first circuit includes a fifth transistor configured to couple, by being turned on, a first power supply to the second node, the first power supply corresponding to the specific initial voltage, and
the second circuit includes a sixth transistor configured to couple, by being turned on, the first power supply to the first node, the sixth transistor having a gate width greater than a gate width of the fifth transistor.

8. The semiconductor circuit according to claim 6, wherein
the second circuit includes a seventh transistor configured to couple, by being turned on, a second power supply to the first node, the second power supply corresponding to a voltage different from the specific initial voltage, and
the first circuit includes an eighth transistor configured to couple, by being turned on, the second power supply to the second node, the eighth transistor having a gate width greater than a gate width of the seventh transistor.

9. The semiconductor circuit according to claim 6, wherein
the first circuit includes a fifth transistor configured to couple, by being turned on, a first power supply to the second node, the first power supply corresponding to the specific initial voltage, and
the second circuit includes a sixth transistor configured to couple, by being turned on, the first power supply to the first node, the sixth transistor having a gate length less than a gate length of the fifth transistor.

10. The semiconductor circuit according to claim 6, wherein
the second circuit includes a seventh transistor configured to couple, by being turned on, a second power supply to the first node, the second power supply corresponding to a voltage different from the specific initial voltage, and
the first circuit includes an eighth transistor configured to couple, by being turned on, the second power supply to the second node, the eighth transistor having a gate length less than a gate length of the seventh transistor.

11. The semiconductor circuit according to claim 6, wherein
the second circuit includes a sixth transistor configured to couple, by being turned on, a first power supply to the first node, the first power supply corresponding to the specific initial voltage, and
a current value of a current flowing from the first power supply to the first node, when the sixth transistor is turned on, is a current value between a first current value and a second current value, wherein
the first current value is for a current flowing from the first node to the first memory element via the first transistor when the first transistor is turned on and the resistance state of the first memory element is the first resistance state, and
the second current value is for a current flowing from the first node to the first memory element via the first transistor when the first transistor is turned on and the resistance state of the first memory element is the second resistance state.

12. The semiconductor circuit according to claim 1, further comprising:
a second memory element that has a first terminal, a second terminal, and a third terminal, wherein the second memory element is configured to store information by setting a resistance state between the second terminal of the second memory element and the third terminal of the second memory element to the first resistance state or the second resistance state based on a direction of a second current flowing between the first terminal of the second memory element and the second terminal of the second memory element;
a ninth transistor configured to couple, by being turned on, the second node to the third terminal of the second memory element;
a tenth transistor coupled to a second coupling node, wherein the tenth transistor is configured to cause the second current to flow to the second terminal of the second memory element based on a voltage at the second coupling node, the second coupling node being one of the first node or the second node and different from the first coupling node; and an eleventh transistor configured to supply, by being turned on, the first terminal of the second memory element with the first voltage, wherein
the tenth transistor has a second drain, a second gate, and a second source,
the second gate is coupled to the second coupling node, and
the second source is coupled to the first terminal of the second memory element.

13. The semiconductor circuit according to claim 12, further comprising:
a fourth transistor configured to supply, by being turned on, the second drain of the second transistor with a second voltage different from the first voltage; and
a twelfth transistor configured to supply, by being turned on, the second drain of the tenth transistor with the second voltage.

14. The semiconductor circuit according to claim 1, further comprising:
a second memory element that has a first terminal, a second terminal, and a third terminal, wherein
the second memory element is configured to store information by setting a resistance state between the second terminal of the second memory element and the third terminal of the second memory element to the first resistance state or the second resistance state based on a direction of a second current flowing between the first terminal of the second memory element and the second terminal of the second memory element;
a ninth transistor configured to couple, by being turned on, the second node to the third terminal of the second memory element; and
a tenth transistor coupled to a second coupling node, wherein
the tenth transistor is configured to cause the second current to flow to the second terminal of the second memory element based on a voltage at the second coupling node,
the second coupling node is one of the first node or the second node and different from the first coupling node,
the second transistor has a second drain, a second gate, and a second source,
the second drain is coupled to the first coupling node,
the second source is coupled to the first terminal of the first memory element,
the tenth transistor has a third drain, a third gate, and a third source,
the third drain is coupled to the second coupling node, and
the third source is coupled to the first terminal of the second memory element.

15. The semiconductor circuit according to claim 14, wherein the controller is further configured to:
control operations of the second transistor, the ninth transistor, and the tenth transistor,
apply a control voltage to the second terminal of the first memory element and the second terminal of the second memory element, turn on the second transistor and the tenth transistor and turn off the first transistor and the ninth transistor in a first period, and
set the control voltage to a third voltage and a fourth voltage in a time division manner, thereby setting the resistance state of the first memory element to a resistance state corresponding to the voltage at the first coupling node and setting the resistance state of the second memory element to a resistance state corresponding to the voltage at the second coupling node.

16. The semiconductor circuit according to claim 15, wherein the controller is further configured to turn on the first transistor and the ninth transistor and turn off the second transistor and the tenth transistor in a second period after the first period, thereby setting the voltage at the first node to a voltage corresponding to the resistance state of the first memory element and setting the voltage at the second node to a voltage corresponding to the resistance state of the second memory element.

17. The semiconductor circuit according to claim 1, wherein the first memory element is configured to store information by changing a resistance state with use of spin orbit torque.

18. The semiconductor circuit according to claim 1, wherein the first circuit and the second circuit are included in a SRAM circuit.

19. The semiconductor circuit according to claim 1, wherein the first circuit and the second circuit are included in a latch circuit.

20. The semiconductor circuit according to claim 19, wherein the latch circuit includes a slave latch circuit in a flip-flop circuit, and the flip-flop circuit including a master latch circuit and the slave latch circuit.

21. An electronic device, comprising:
a semiconductor circuit; and
a battery configured to supply the semiconductor circuit with a power supply voltage, the semiconductor circuit including:
a first circuit configured to:
generate a first inverted voltage of a voltage at a first node, and
apply the first inverted voltage to a second node,
a second circuit configured to:
generate a second inverted voltage of a voltage at the second node, and
apply the second inverted voltage to the first node,
a first memory element including a first terminal, a second terminal, and a third terminal, wherein the first memory element is configured to store information by setting a resistance state between the second terminal and the third terminal to a first resistance state or a second resistance state based on a direction of a first current flowing between the first terminal and the second terminal,
a first transistor configured to couple, by being turned on, the first node to the third terminal of the first memory element,
a second transistor coupled to a first coupling node, wherein
the second transistor is configured to control flow of the first current to the second terminal of the first memory element based on a voltage at the first coupling node, and
the first coupling node is one of the first node or the second node, a third transistor configured to supply, by being turned on, the first terminal of the first memory element with a first voltage, wherein
the second transistor has a drain, a gate, and a source, the gate is coupled to the first coupling node, and a source is coupled to the first terminal of the first memory element;
a fourth transistor configured to supply, by being turned on, the drain of the second transistor with a second voltage different from the first voltage, and
a controller configured to control operations of the first transistor, the third transistor, and the fourth transistor.

* * * * *